US011882706B2

(12) United States Patent
Wan et al.

(10) Patent No.: US 11,882,706 B2
(45) Date of Patent: Jan. 23, 2024

(54) ONE SELECTOR ONE RESISTOR MRAM CROSSPOINT MEMORY ARRAY FABRICATION METHODS

(71) Applicant: SanDisk Technologies LLC, Addison, TX (US)

(72) Inventors: Lei Wan, San Jose, CA (US); Tsai-Wei Wu, San Jose, CA (US); Jordan A. Katine, Mountain View, CA (US)

(73) Assignee: SANDISK TECHNOLOGIES LLC, Addison, TX (US)

( * ) Notice: Subject to any disclaimer, the term of this patent is extended or adjusted under 35 U.S.C. 154(b) by 284 days.

(21) Appl. No.: 17/354,541

(22) Filed: Jun. 22, 2021

(65) Prior Publication Data

US 2021/0313392 A1 Oct. 7, 2021

Related U.S. Application Data

(62) Division of application No. 16/460,820, filed on Jul. 2, 2019, now Pat. No. 11,056,534.

(60) Provisional application No. 62/867,590, filed on Jun. 27, 2019.

(51) Int. Cl.

| | |
|---|---|
| ***H10B 61/00*** | (2023.01) |
| ***H10B 63/00*** | (2023.01) |
| ***H10N 50/01*** | (2023.01) |
| ***H10N 52/85*** | (2023.01) |
| ***H10N 52/01*** | (2023.01) |
| *H10N 50/85* | (2023.01) |

(52) U.S. Cl.

CPC ............. *H10B 61/10* (2023.02); *H10B 61/00* (2023.02); *H10B 63/20* (2023.02); *H10B 63/24* (2023.02); *H10N 50/01* (2023.02); *H10N 52/01* (2023.02); *H10N 52/85* (2023.02); *H10N 50/85* (2023.02)

(58) Field of Classification Search

CPC ......... H01L 27/10; H10B 61/00; H10B 61/10; H10B 63/20; H10B 63/24; H10B 63/30; H10B 63/34; H10B 63/80; H10B 63/84; H10B 99/10; H10B 99/16; H10N 50/01; H10N 50/85; H10N 52/01; H10N 52/85

See application file for complete search history.

(56) References Cited

U.S. PATENT DOCUMENTS

| | | | |
|---|---|---|---|
| 2015/0357376 | A1 | 12/2015 | Seo et al. |
| 2018/0350880 | A1 | 12/2018 | Majhi et al. |
| 2019/0172871 | A1 | 6/2019 | Yang et al. |

FOREIGN PATENT DOCUMENTS

| | | | |
|---|---|---|---|
| JP | 5585212 | B2 | 9/2014 |
| KR | 20130129046 | A | 11/2013 |

OTHER PUBLICATIONS

Requirement for Restriction/Election dated Aug. 27, 2020 in U.S. Appl. No. 16/460,820.

(Continued)

*Primary Examiner* — Cheung Lee

(74) *Attorney, Agent, or Firm* — THE MARBURY LAW GROUP PLLC

(57) ABSTRACT

A memory array is provided that includes a plurality of word lines and a plurality of bit lines, and a plurality of memory cells each including a corresponding magnetic memory element coupled in series with a corresponding selector element. Each memory cell is coupled between one of the word lines and one of the bit lines. Each memory cell has a half-pitch F, and comprises an area between $2F^2$ and $4F^2$.

20 Claims, 52 Drawing Sheets

(56) References Cited

OTHER PUBLICATIONS

Response to Restriction Requirement dated Oct. 8, 2020 in U.S. Appl. No. 16/460,820.
Office Action dated Jun. 1, 2021 in U.S. Appl. No. 16/460,820.
Response to Office Action filed Apr. 4, 2021 in U.S. Appl. No. 16/460,820.
Notice of Allowance and Fee(s) Due dated Apr. 19, 2021 in U.S. Appl. No. 16/460,820.
Amendment Under 37 C.F.R. 1.312 filed May 25, 2021 in U.S. Appl. No. 16/460,820.

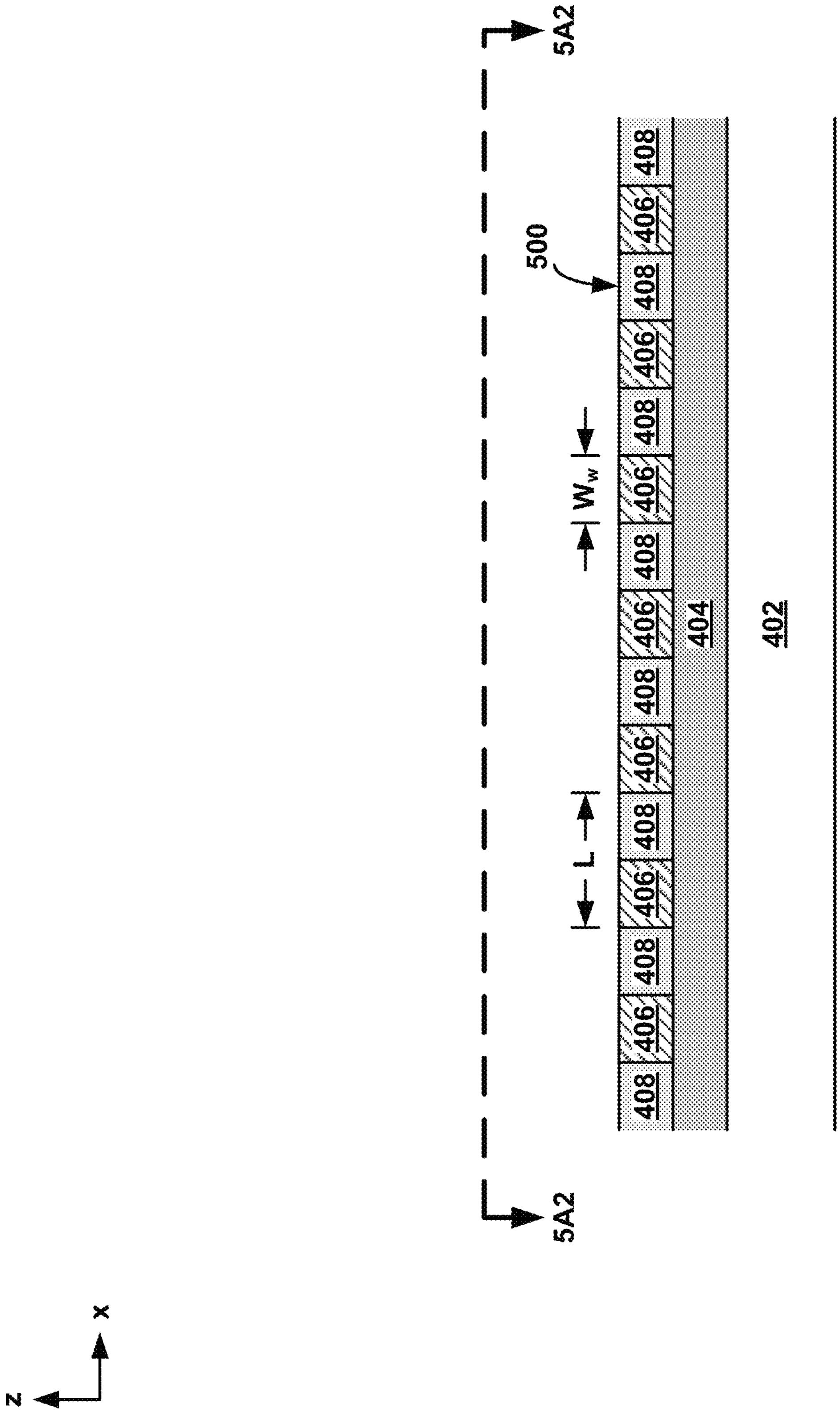
FIG. 5A1

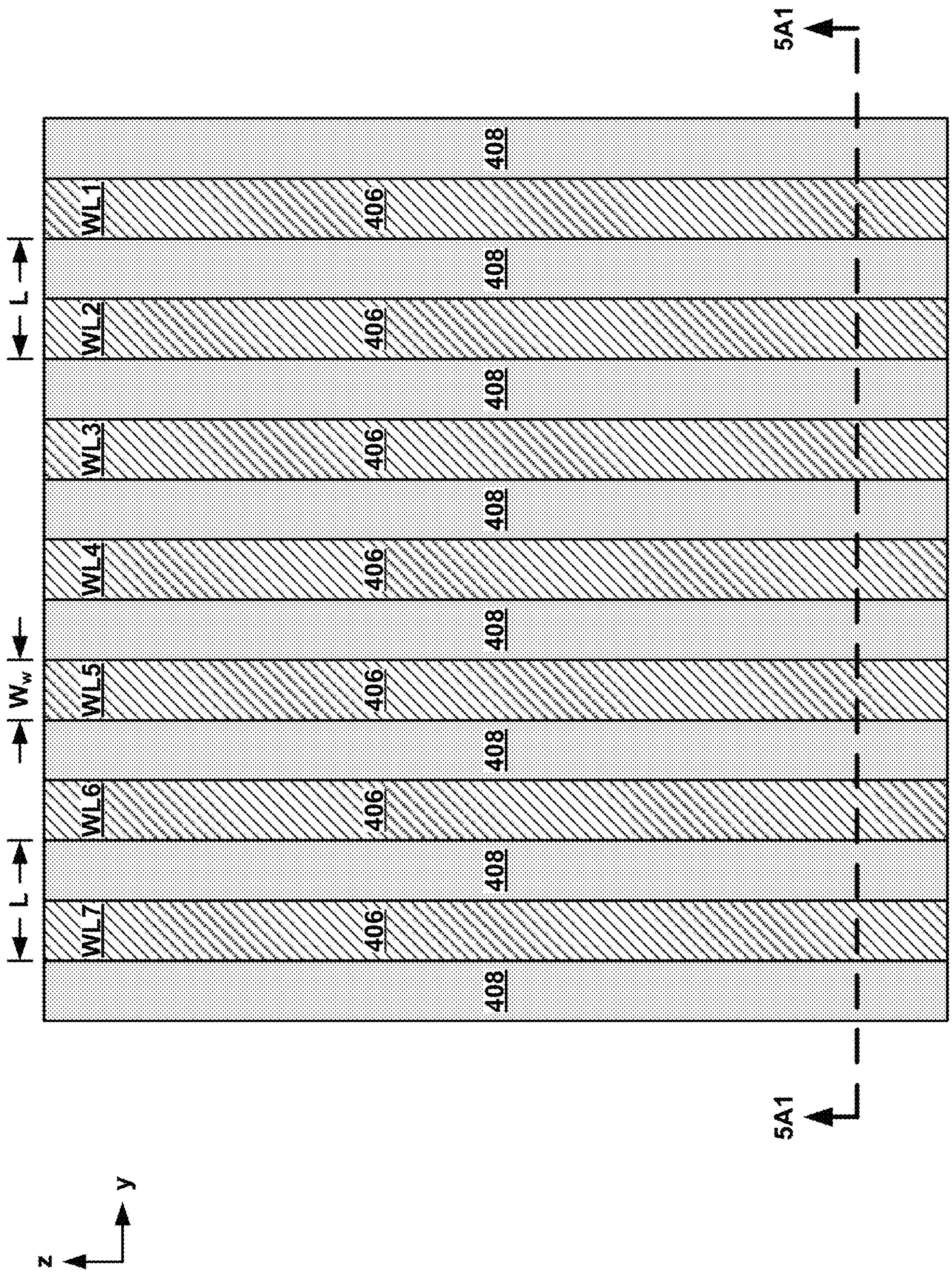
FIG. 5A2

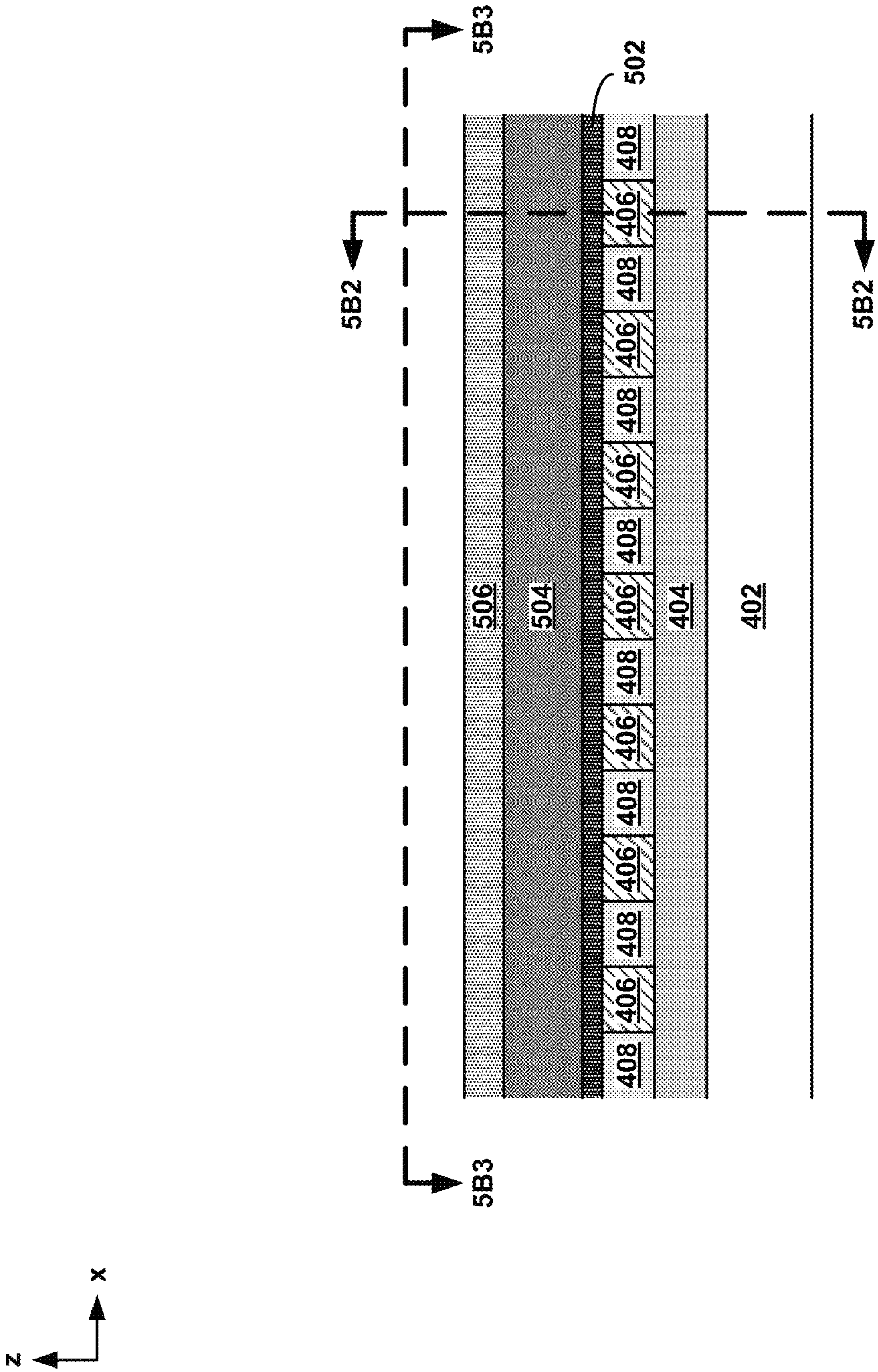
FIG. 5B1

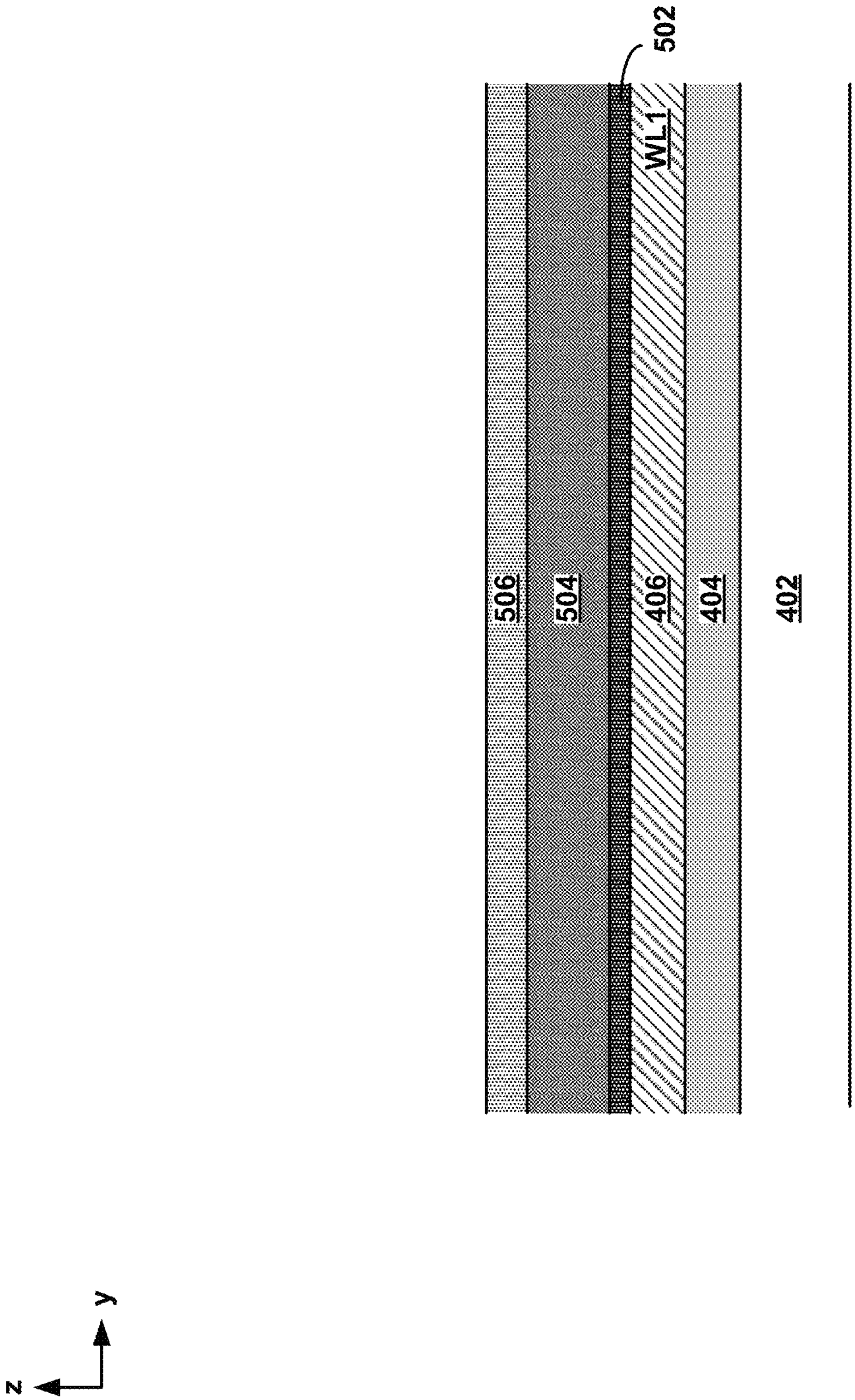
FIG. 5B2

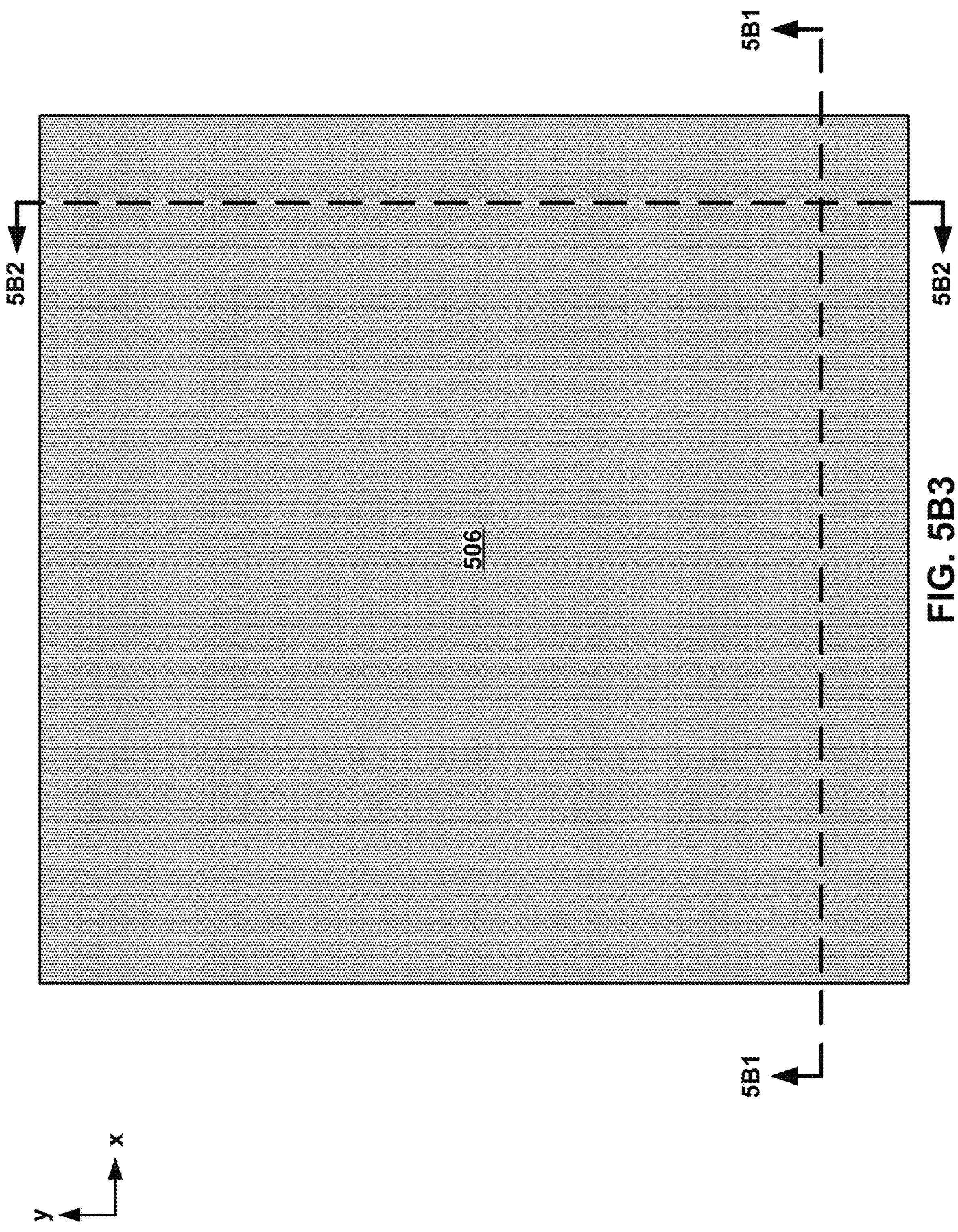
FIG. 5B3

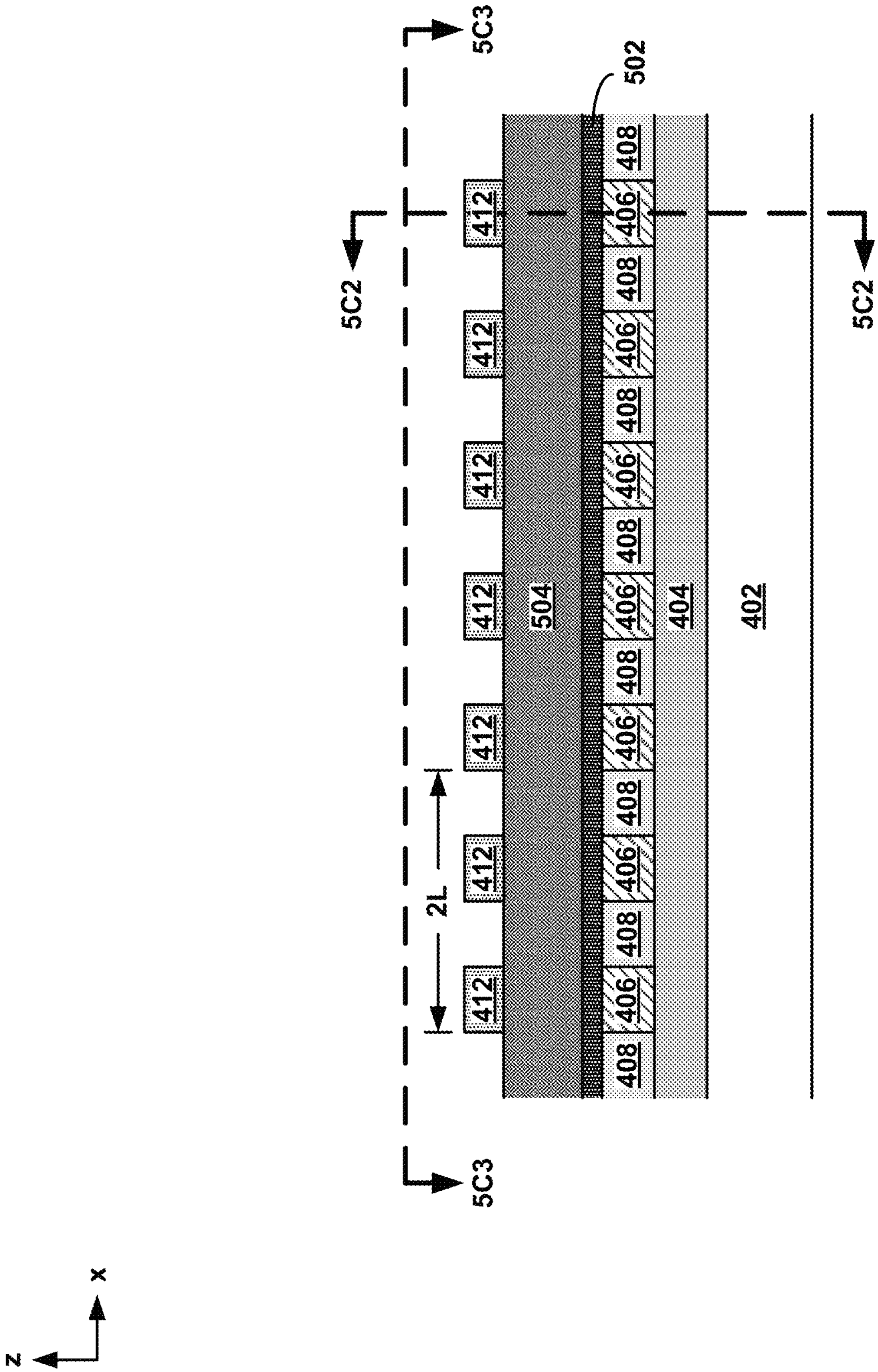
FIG. 5C1

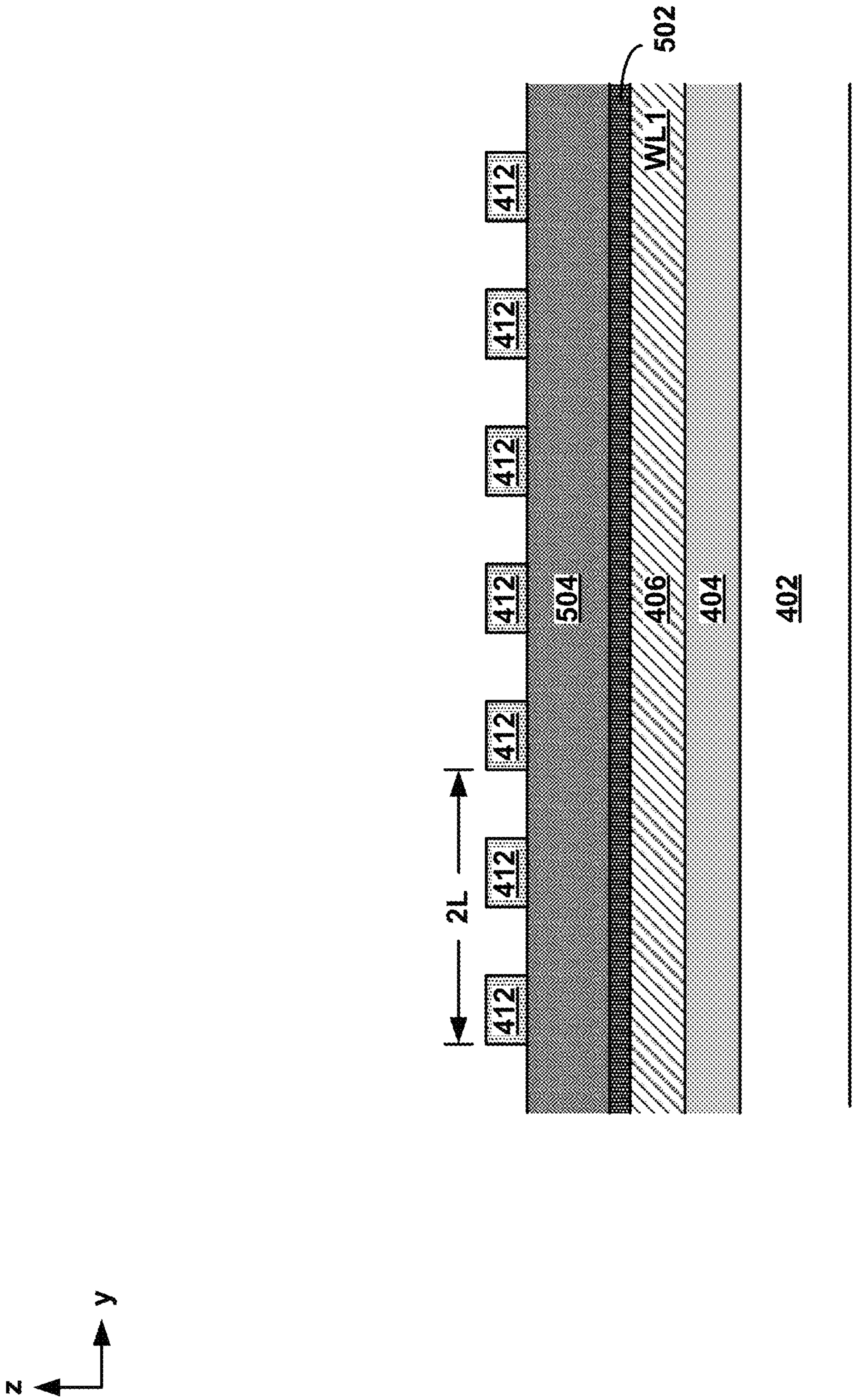
FIG. 5C2

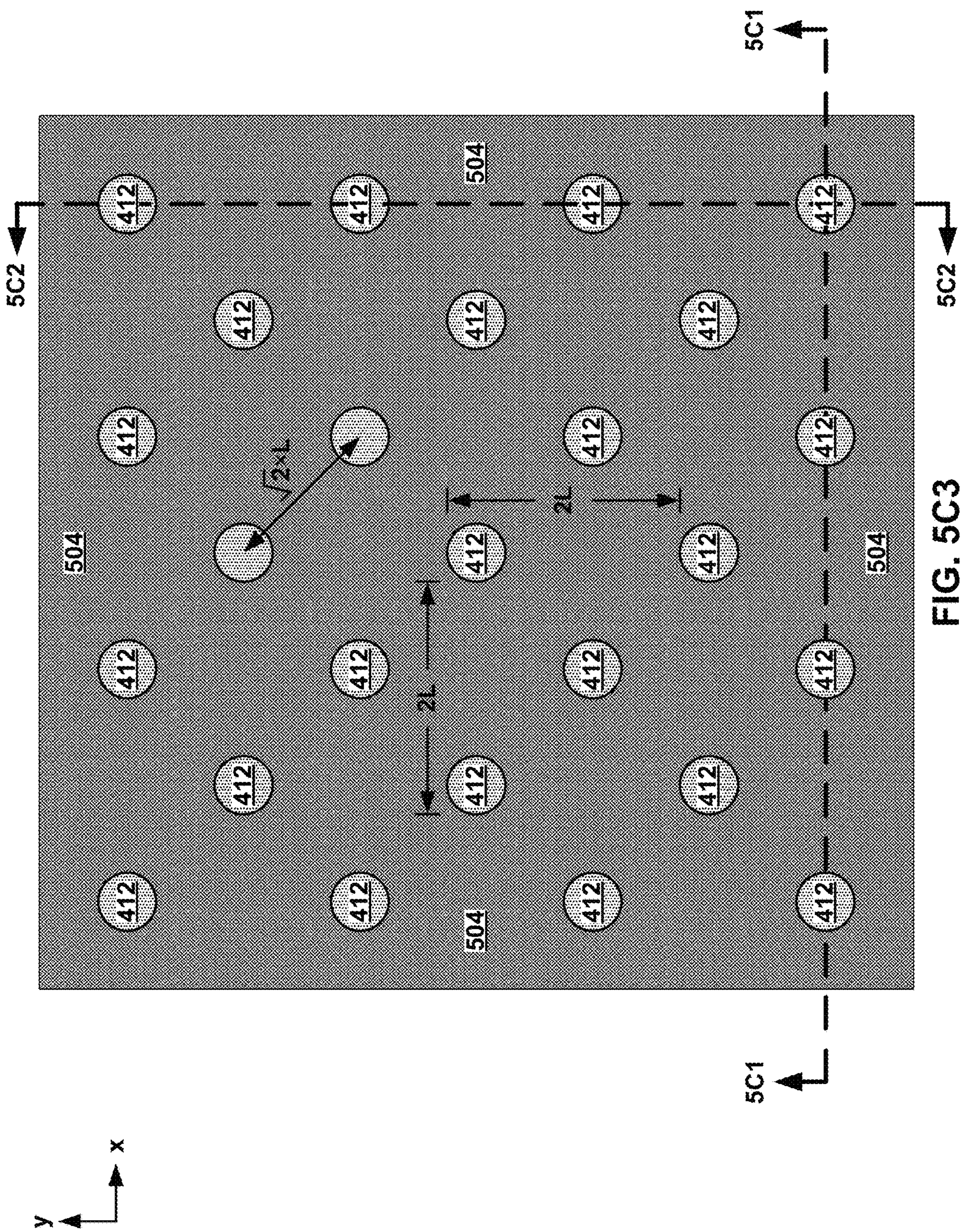
FIG. 5C3

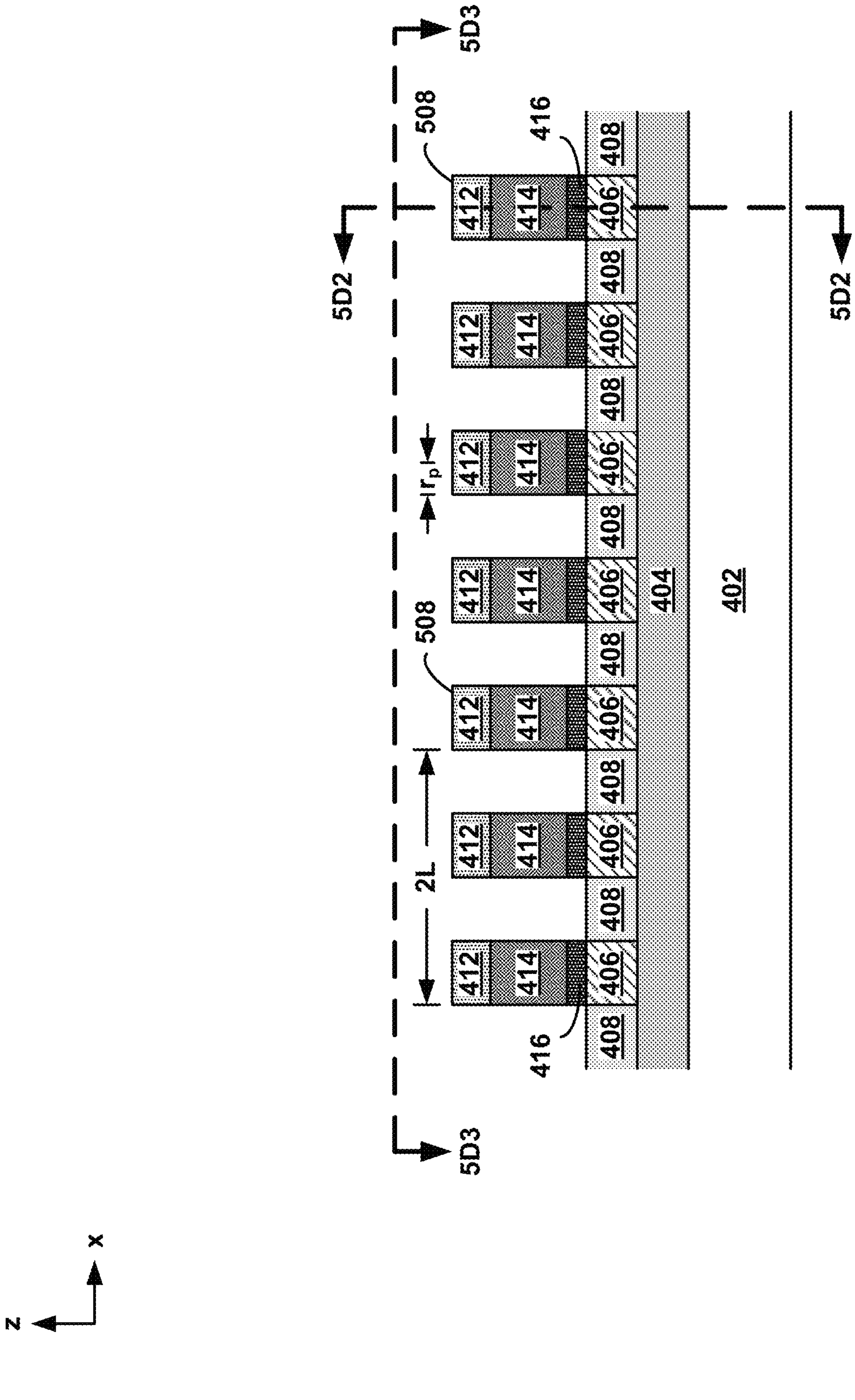
FIG. 5D1

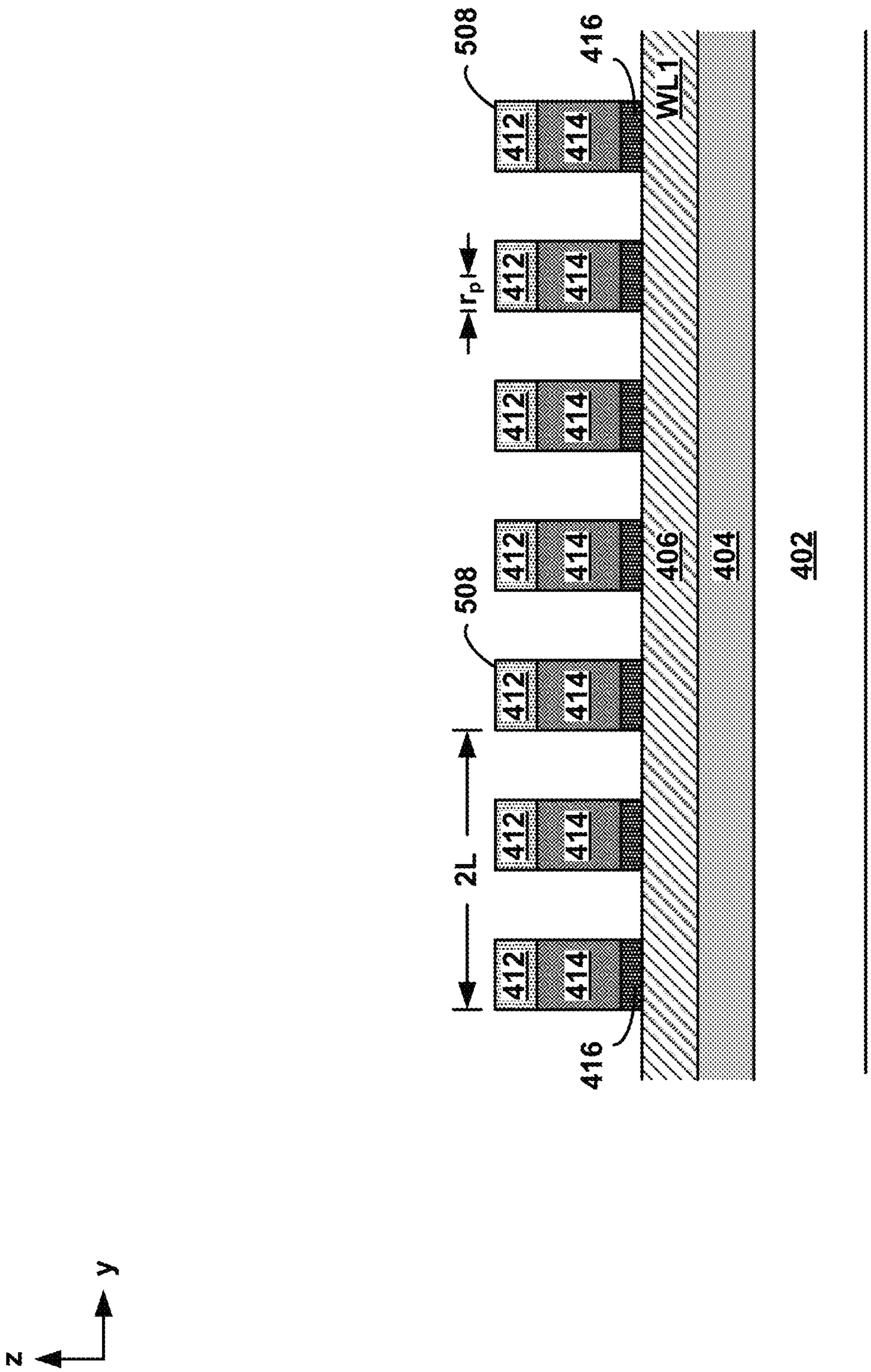
FIG. 5D2

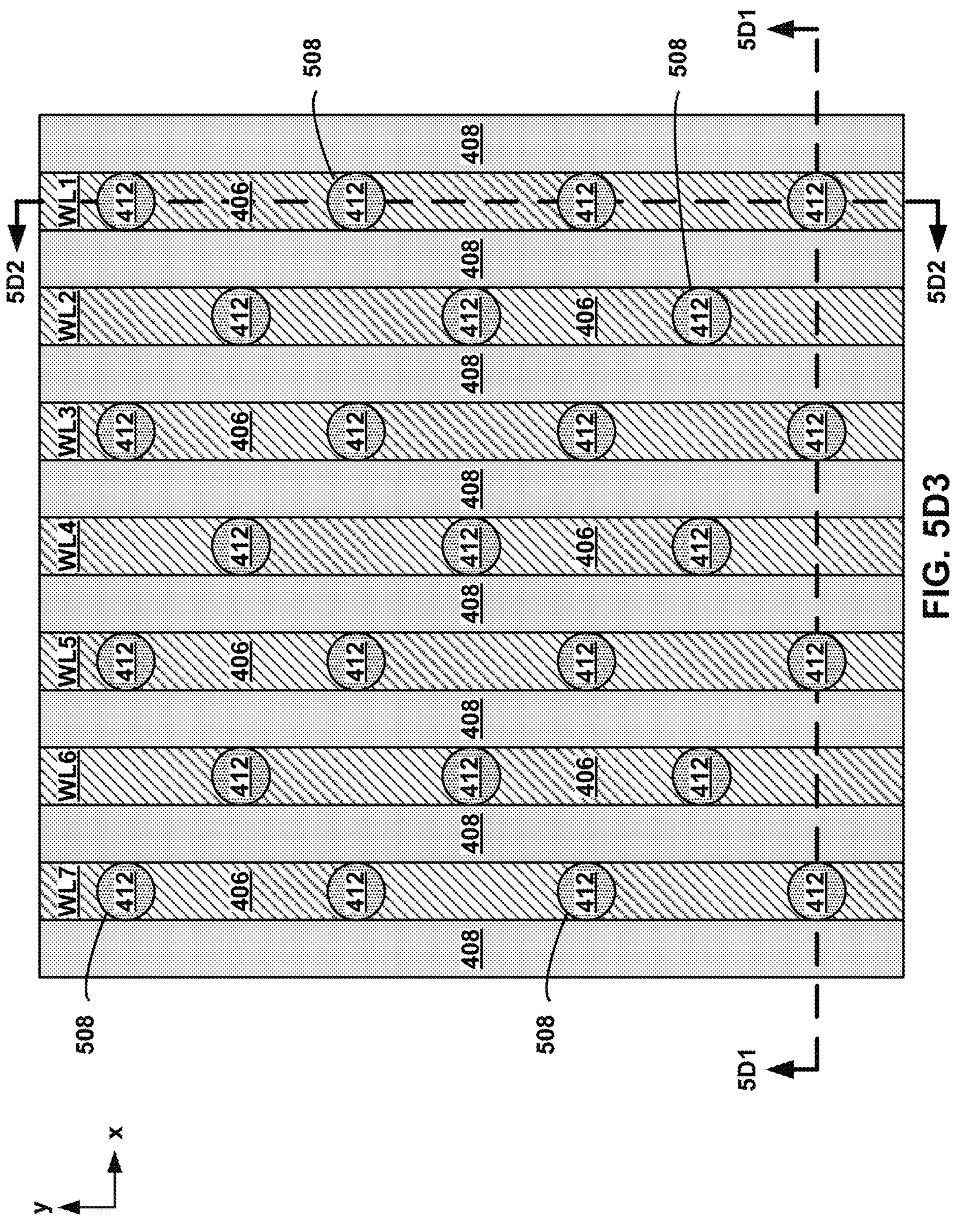
FIG. 5D3

FIG. 5E1

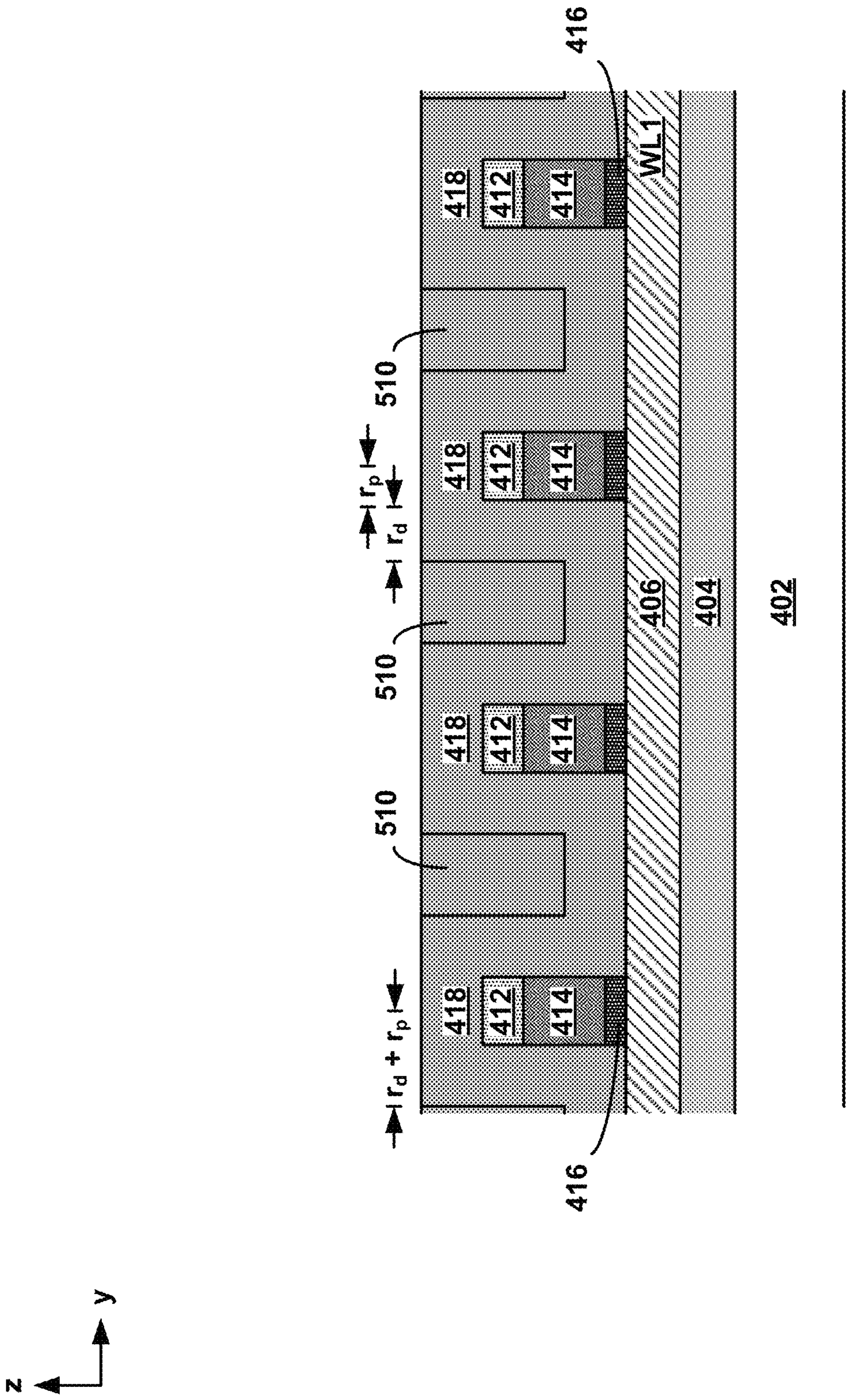
FIG. 5E2

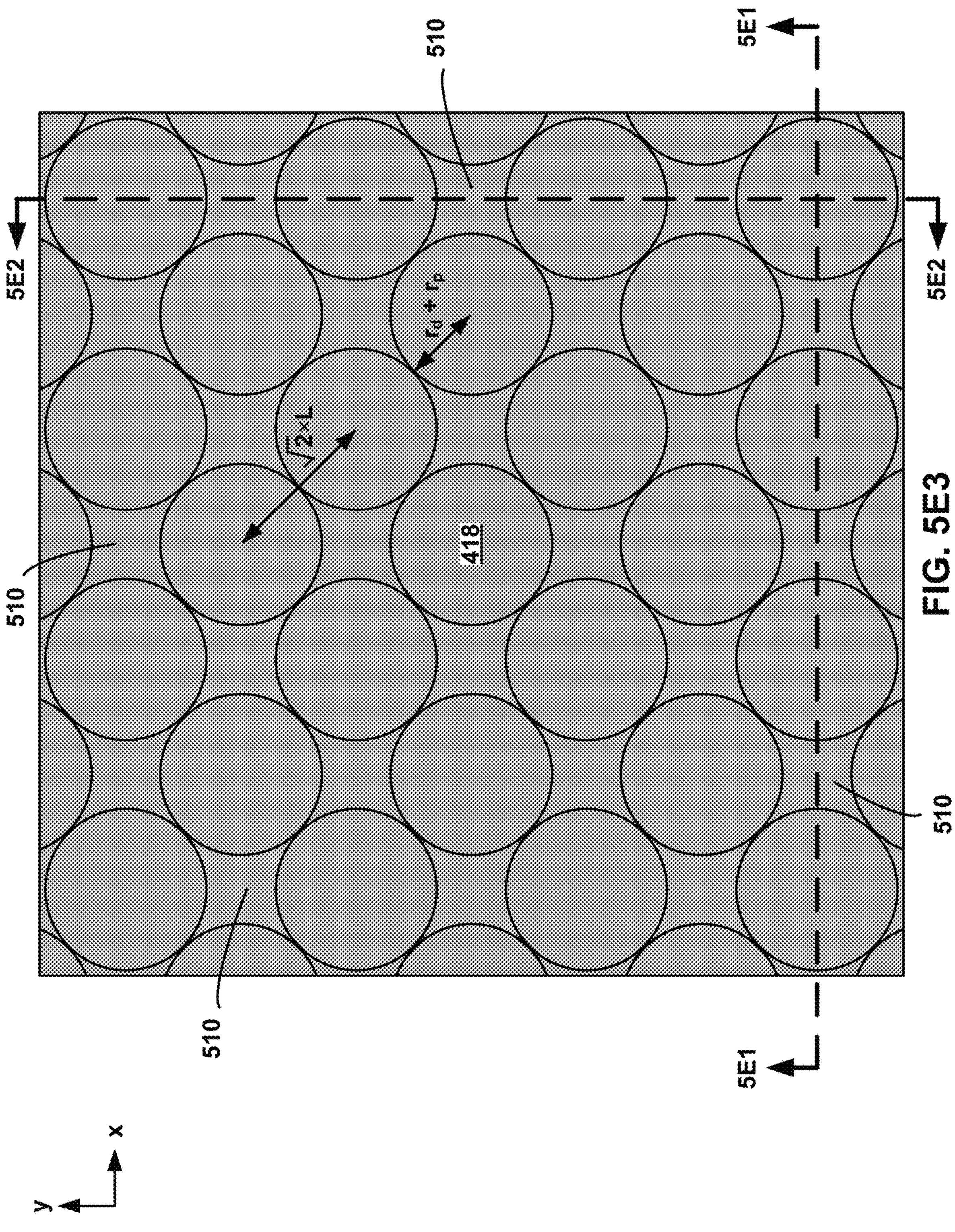
FIG. 5E3

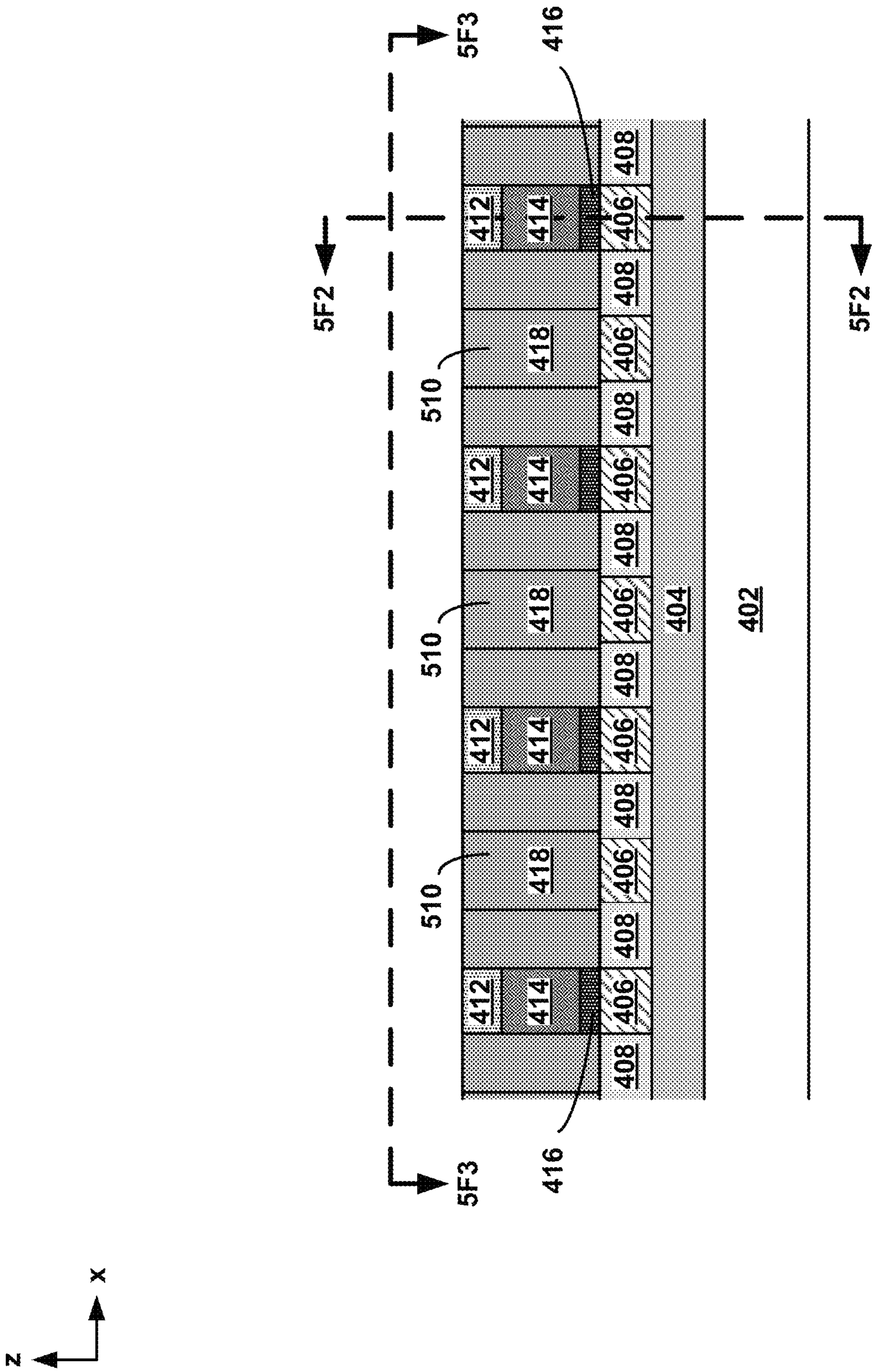
FIG. 5F1

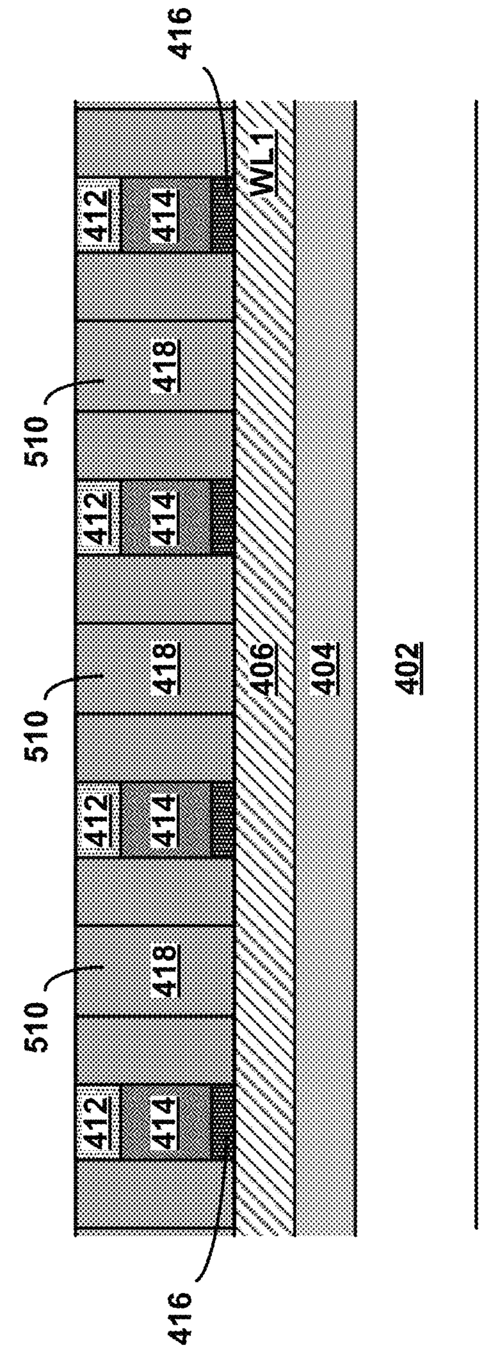
FIG. 5F2
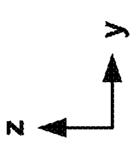

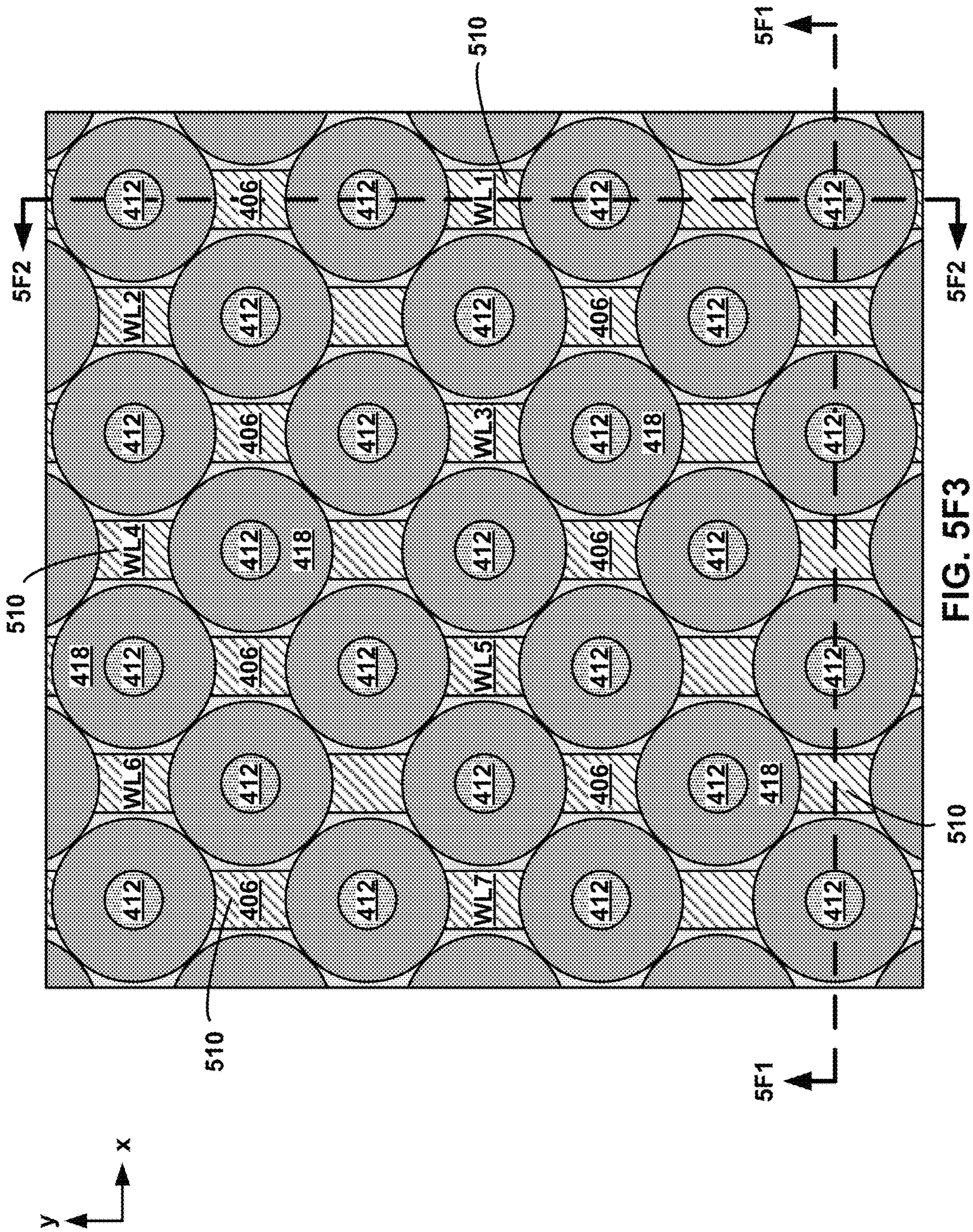
FIG. 5F3

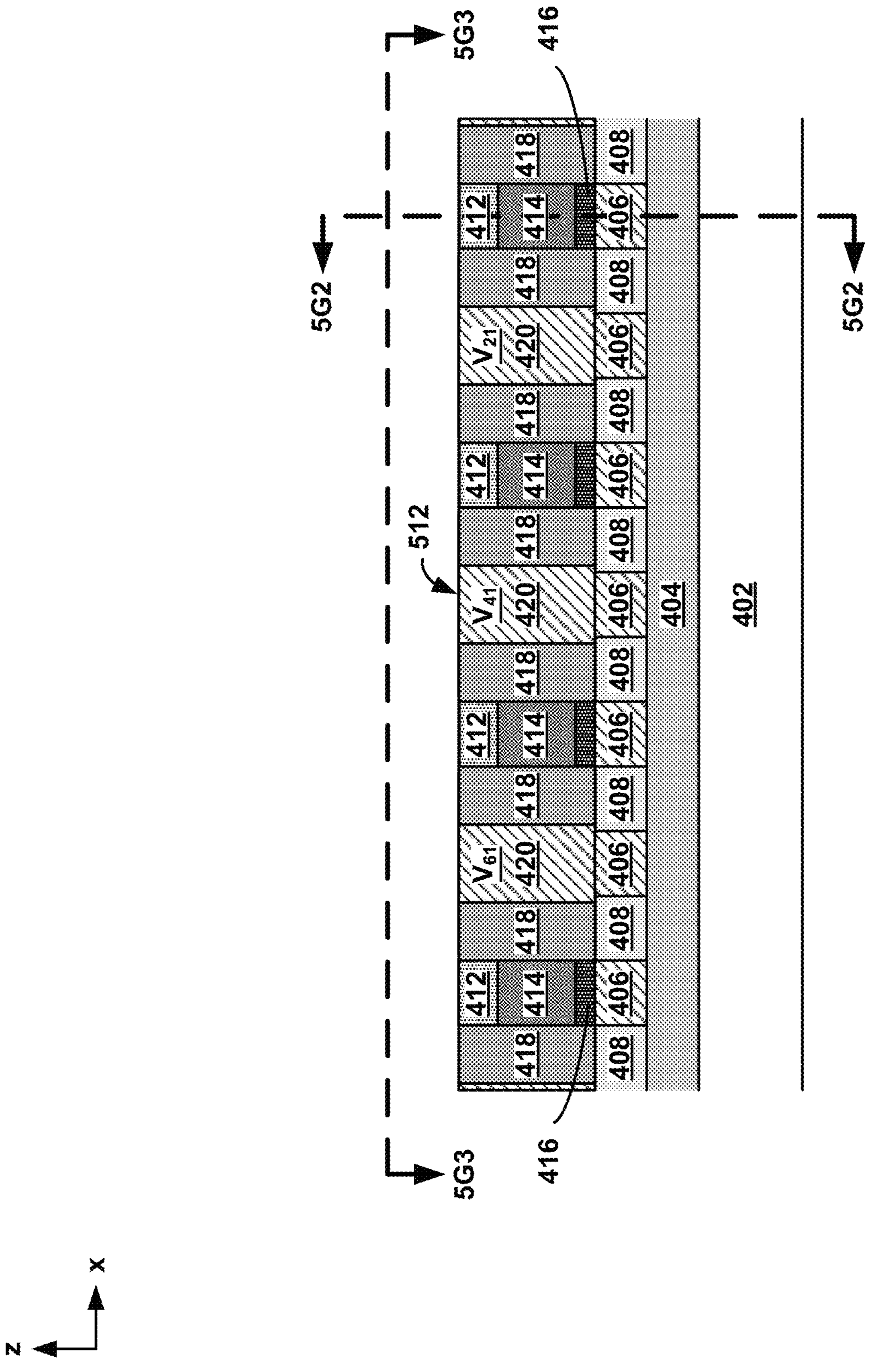
FIG. 5G1

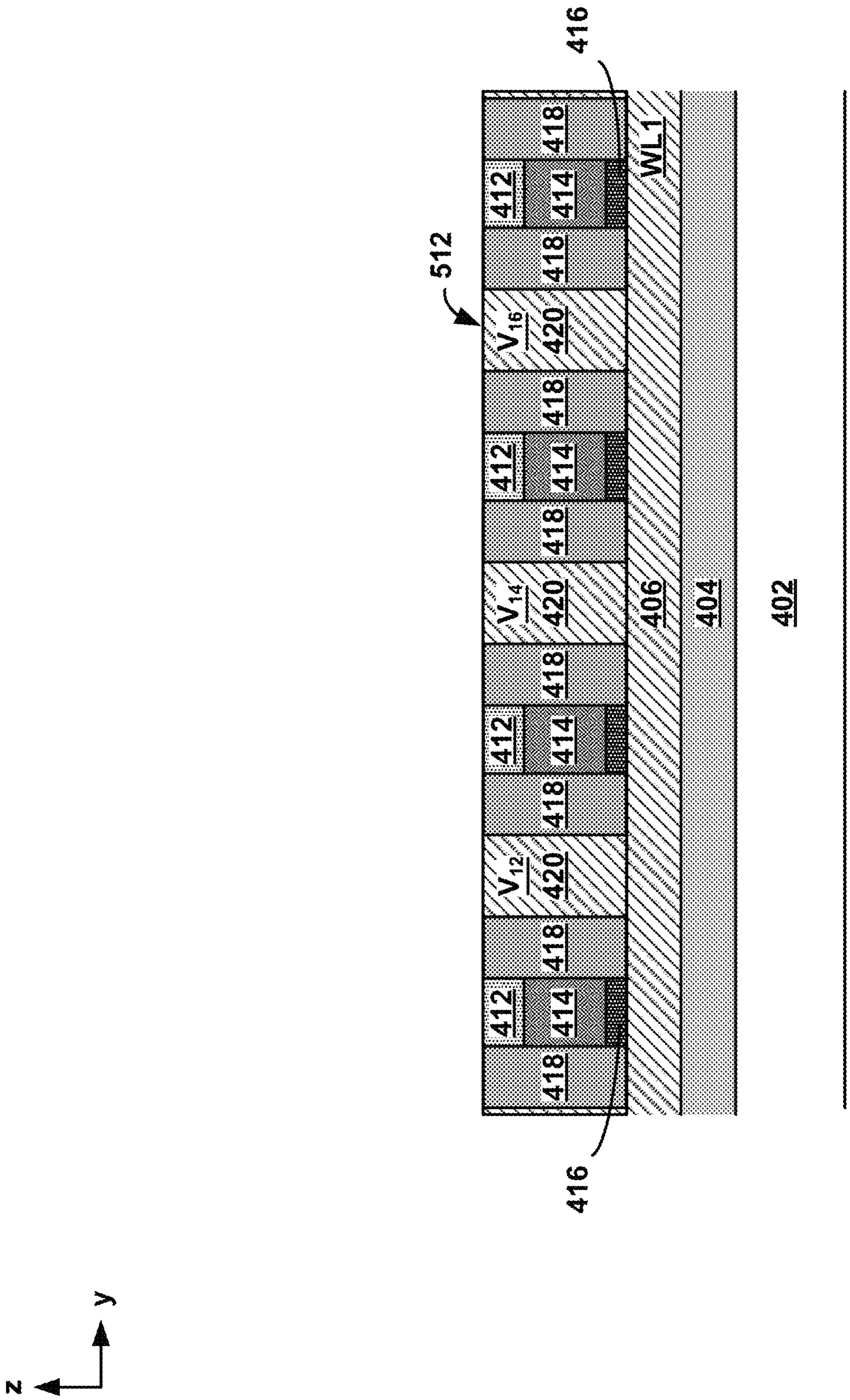
FIG. 5G2

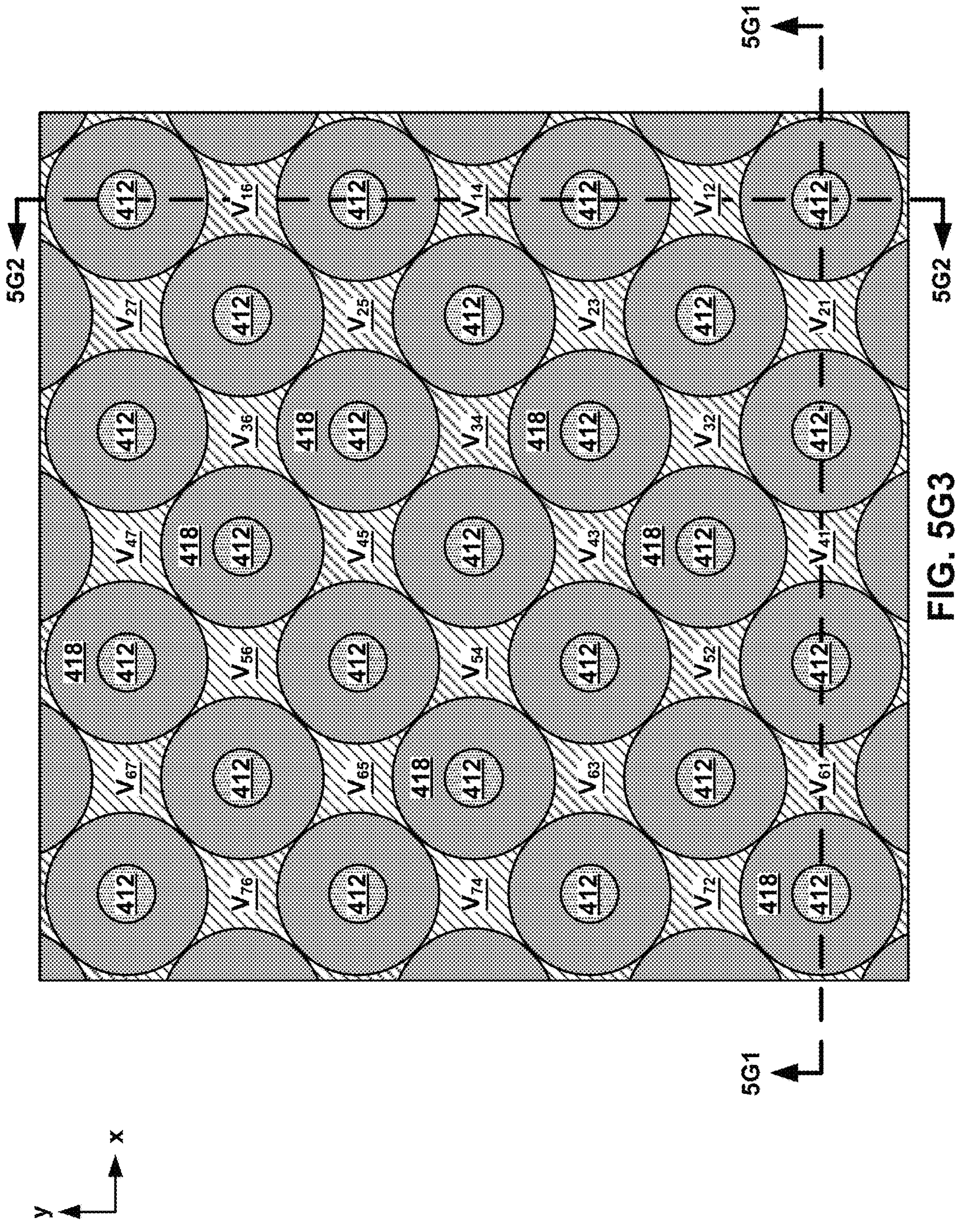
FIG. 5G3

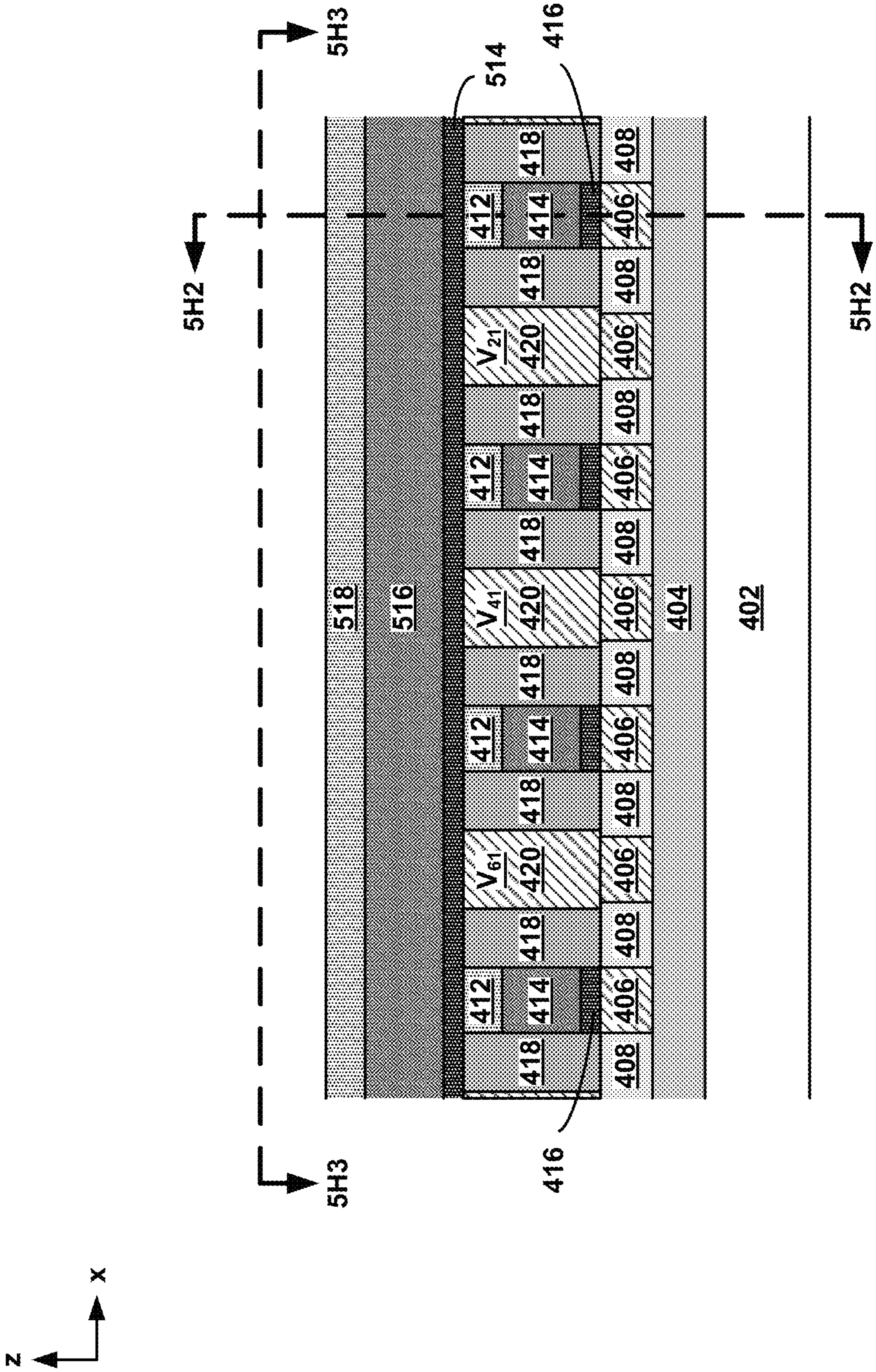
FIG. 5H1

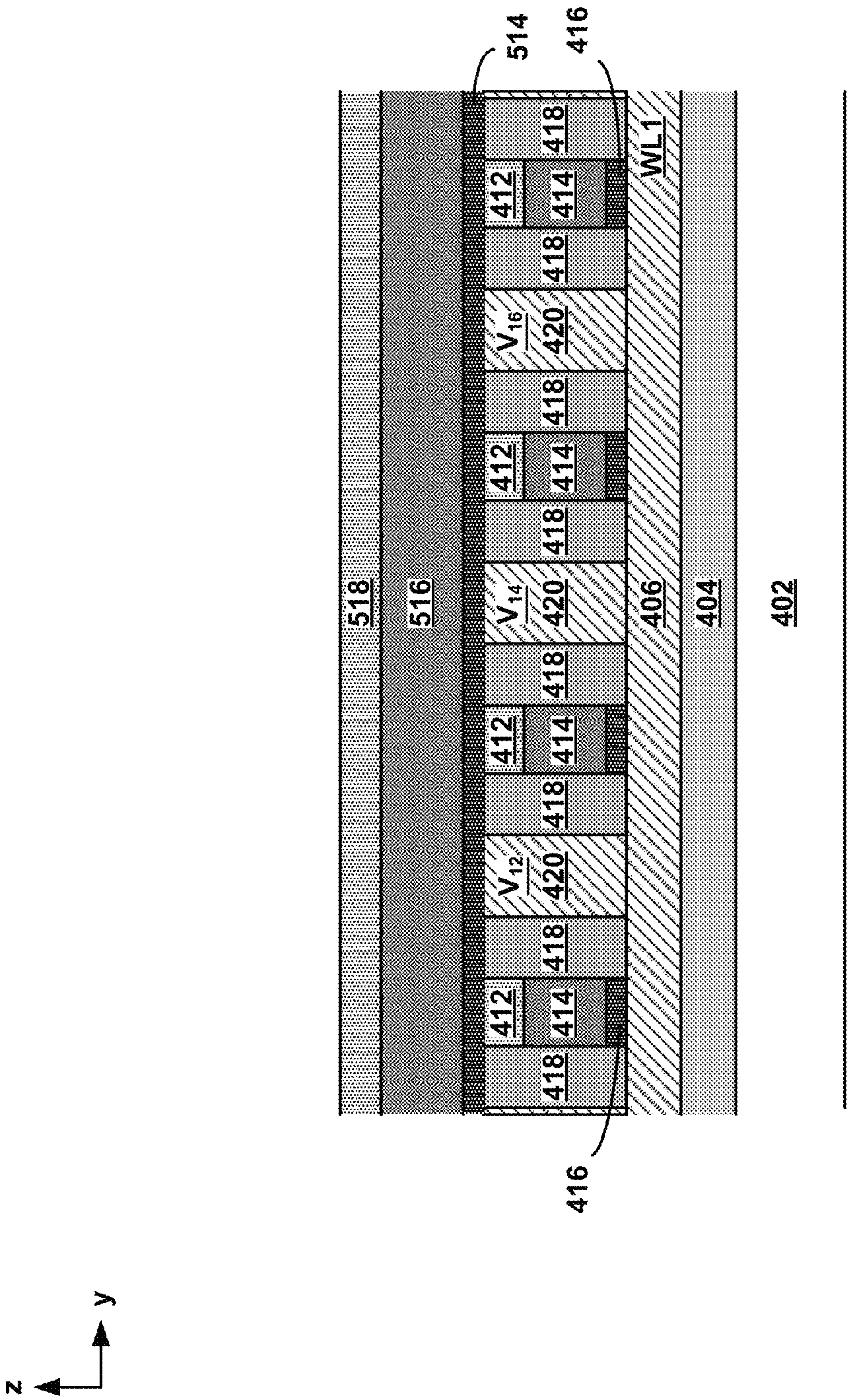
FIG. 5H2

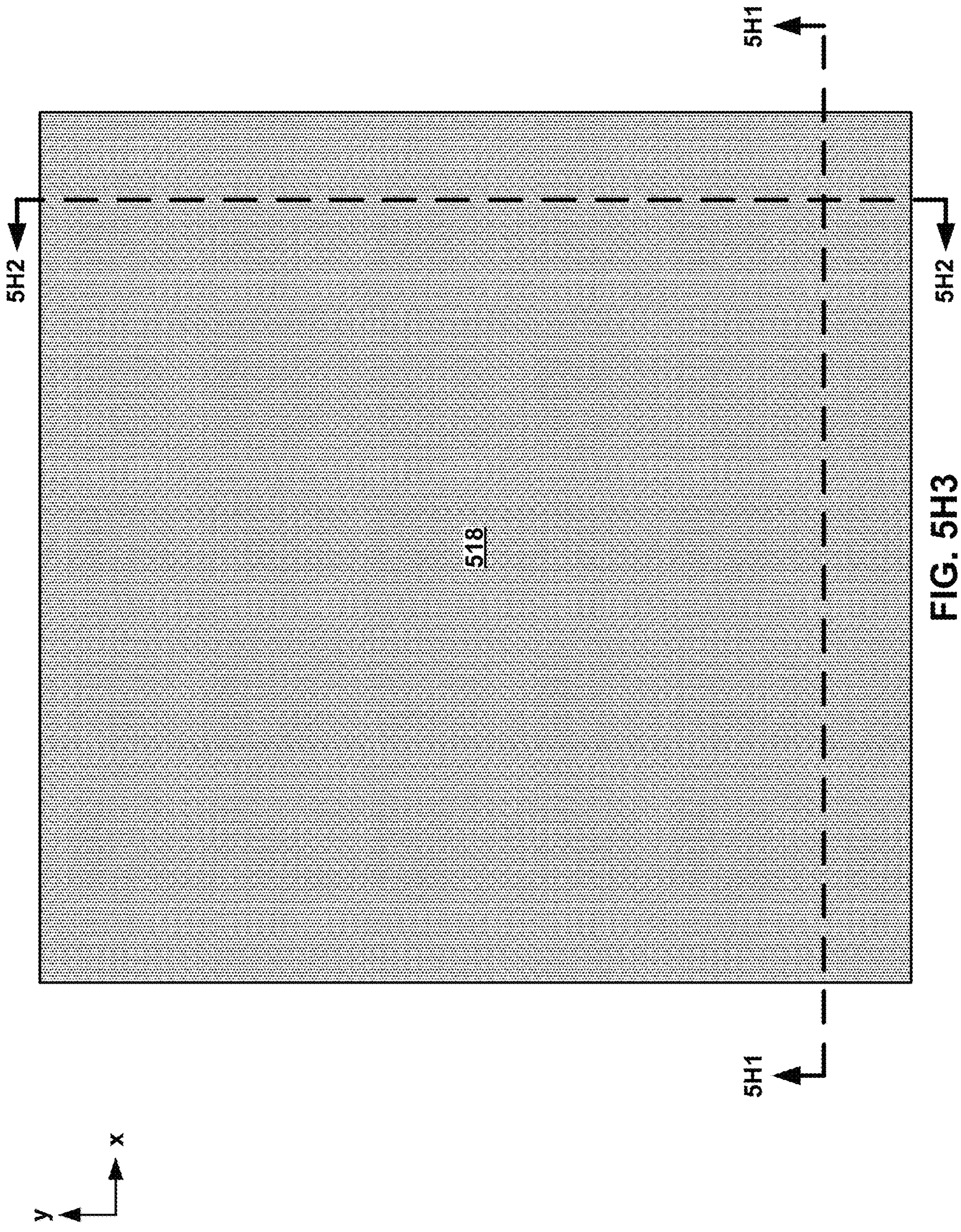
FIG. 5H3

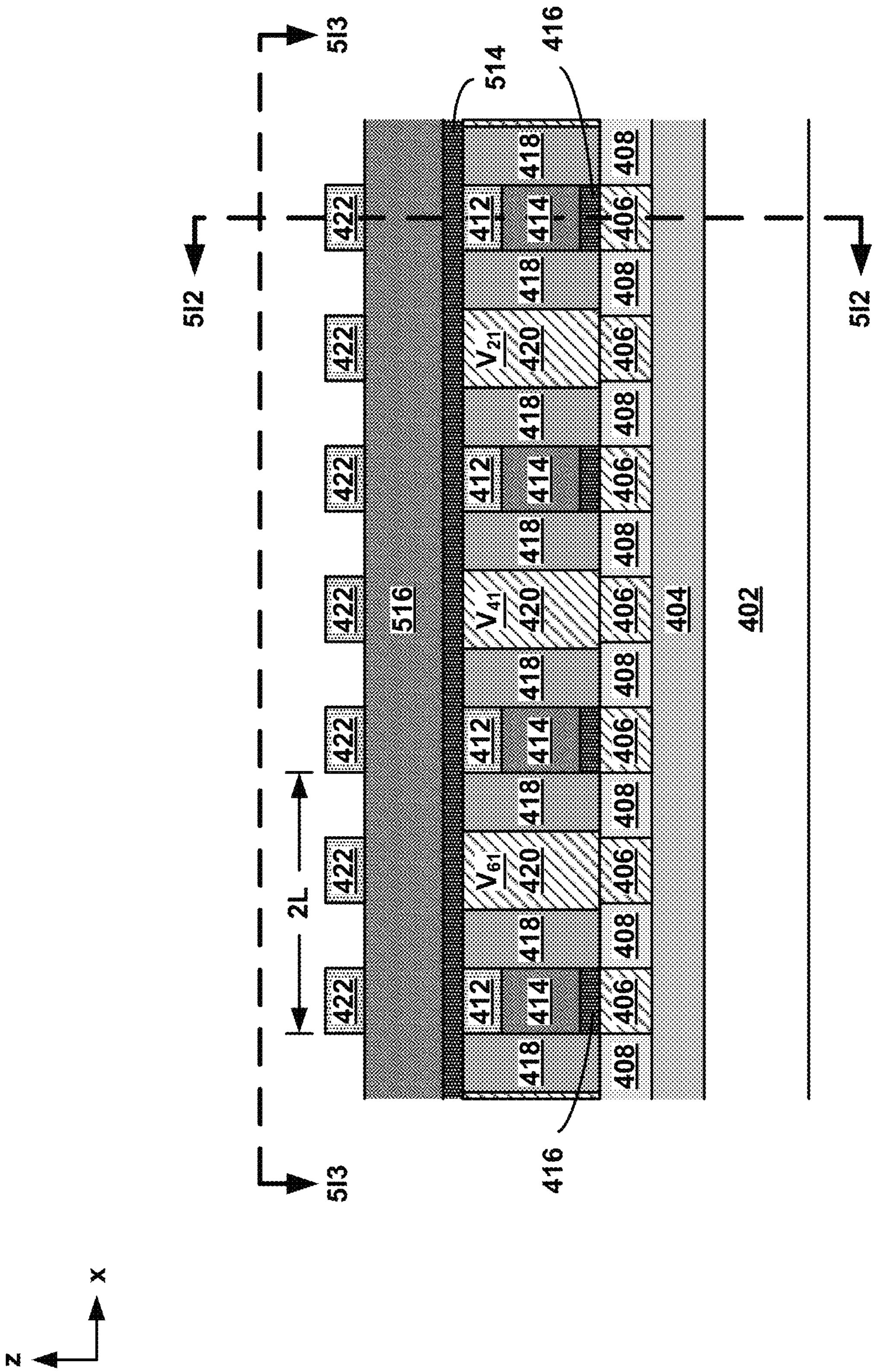
FIG. 5I1

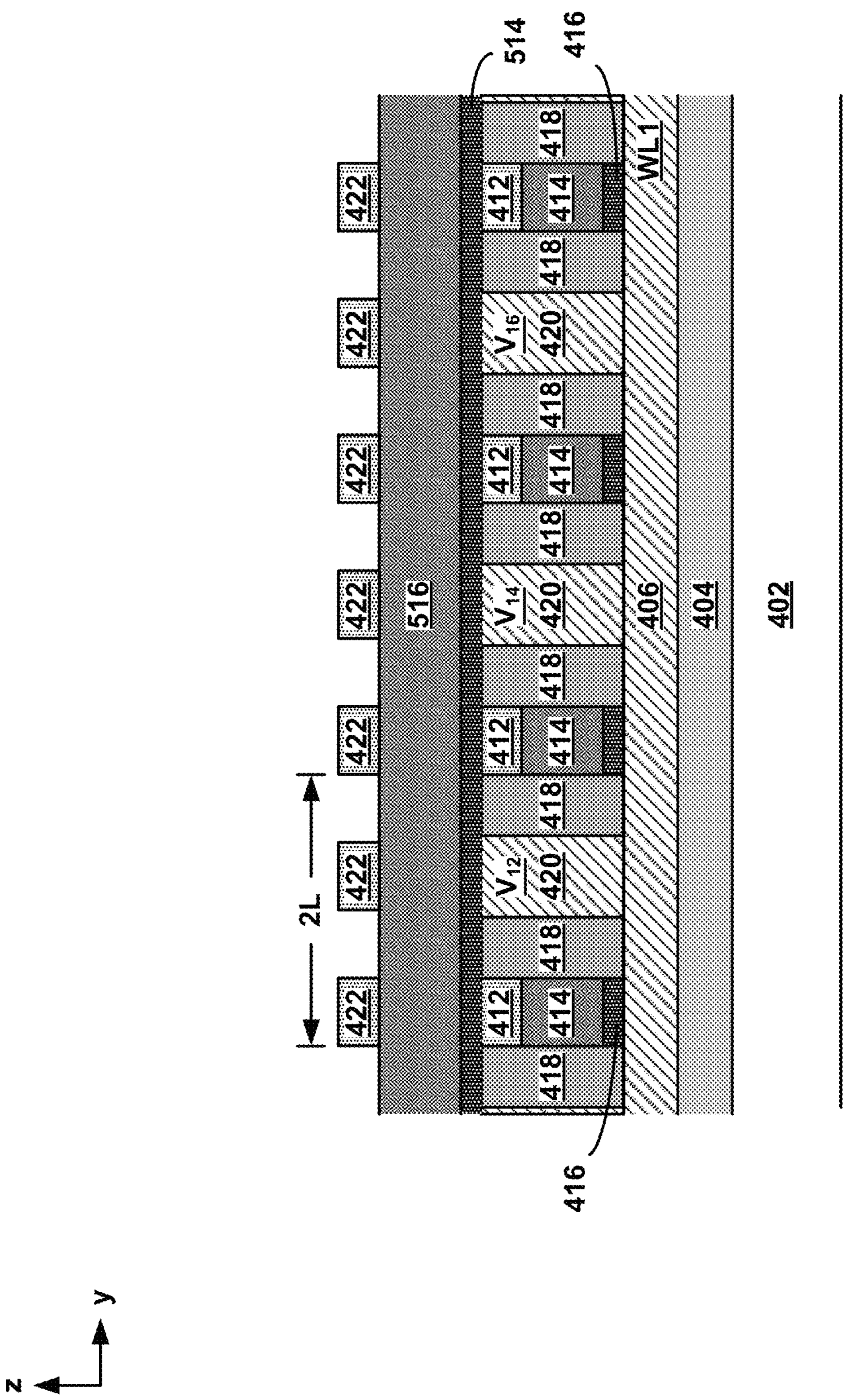
FIG. 5I2

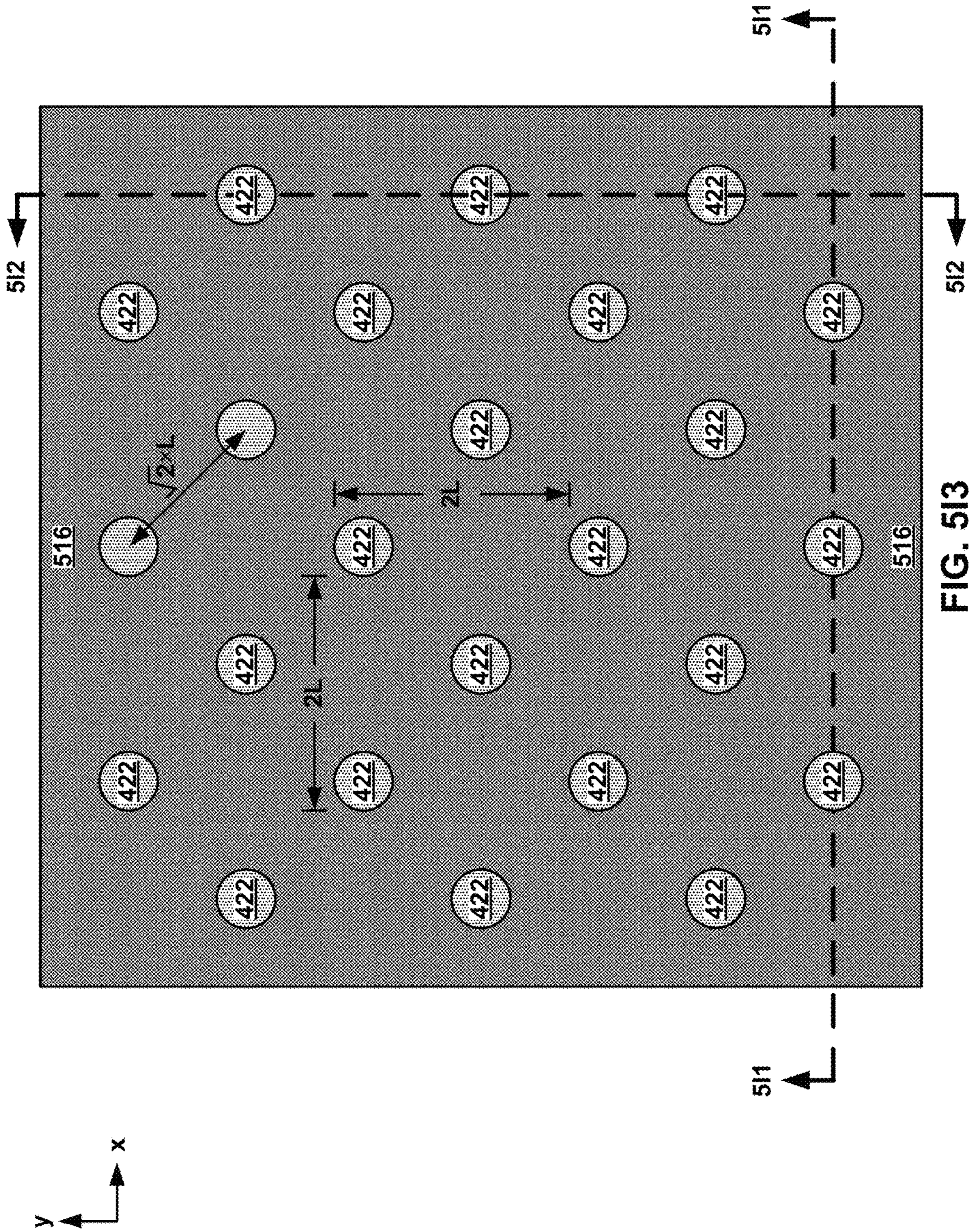
FIG. 5I3

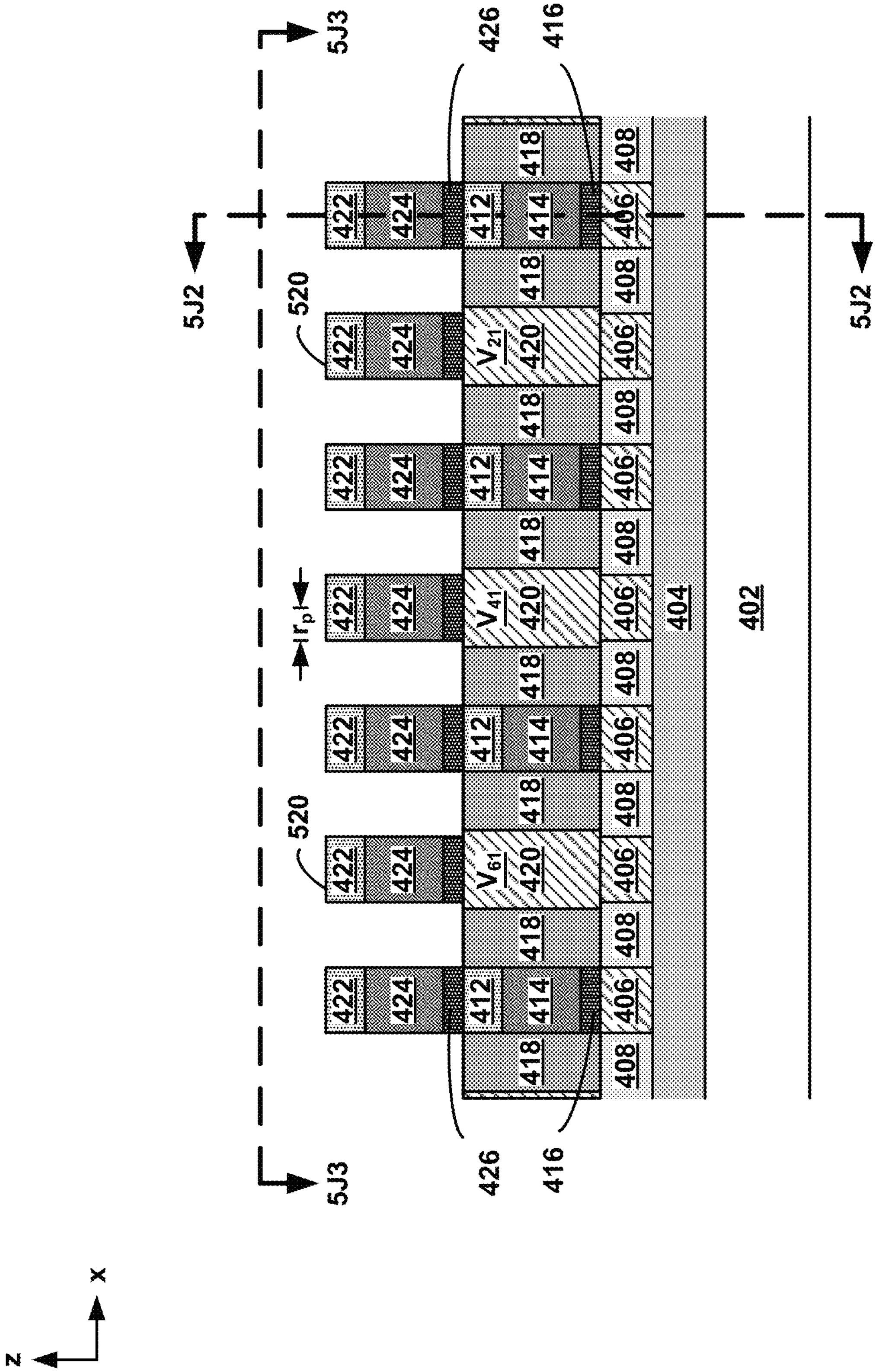
FIG. 5J1

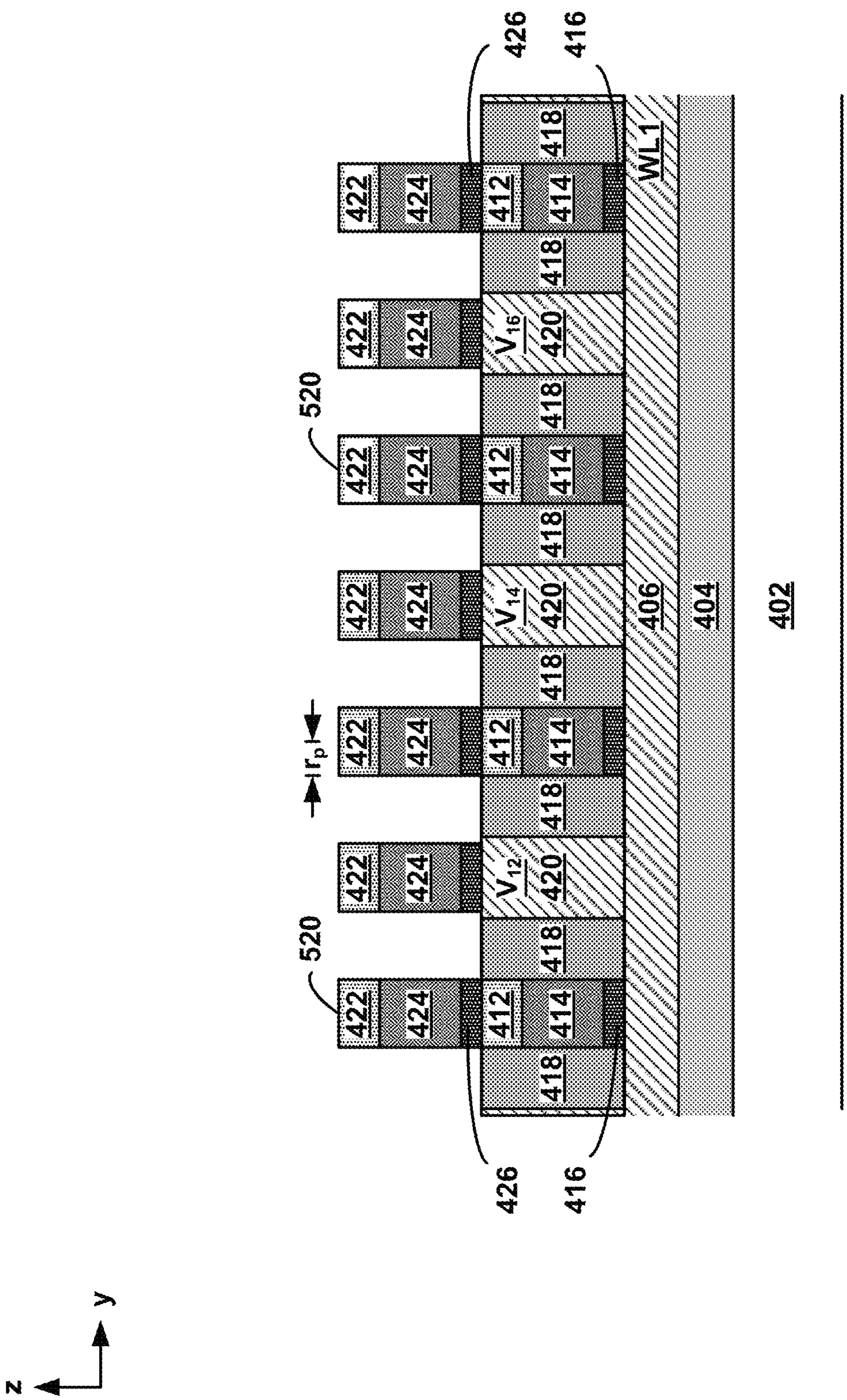
FIG. 5J2

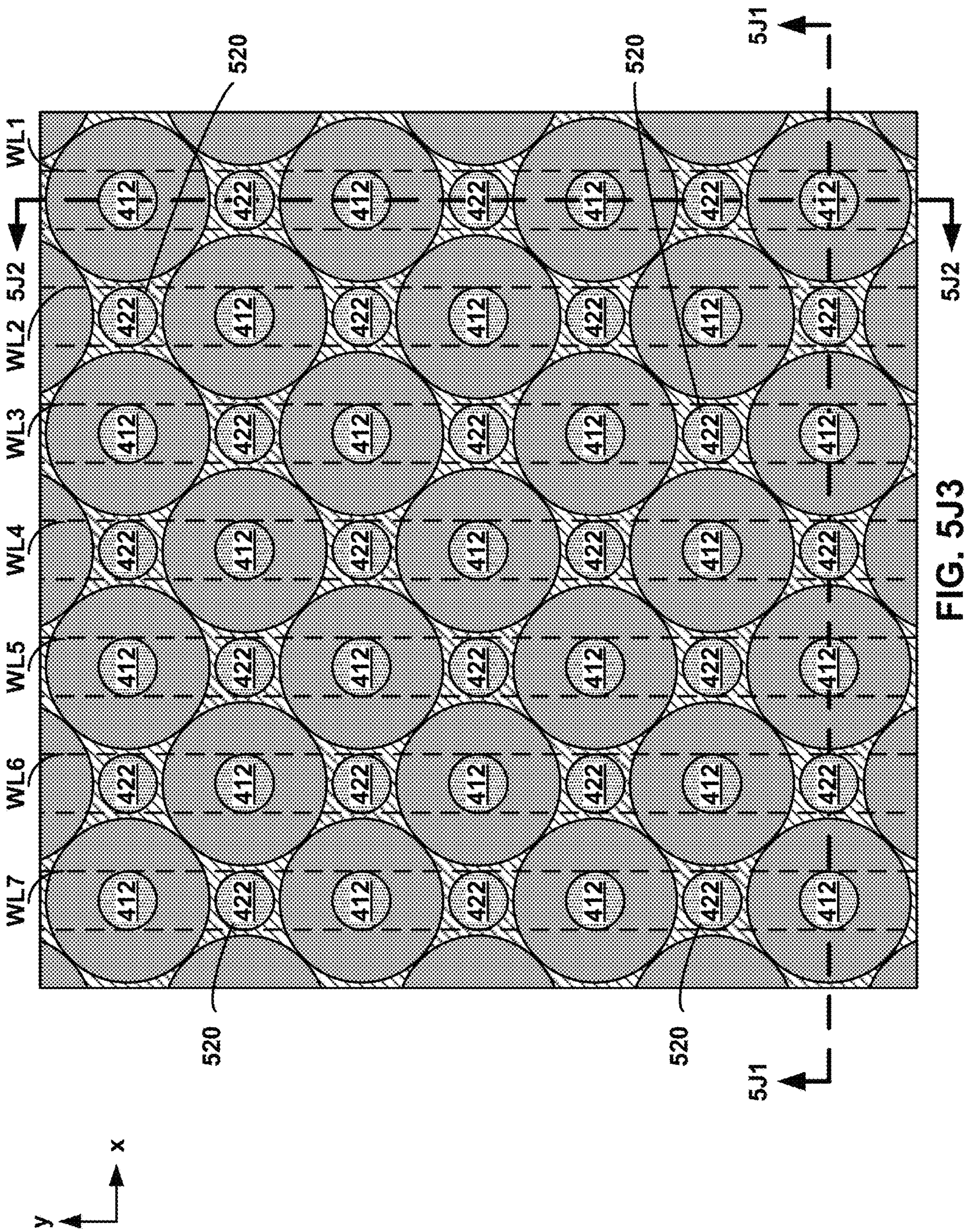
FIG. 5J3

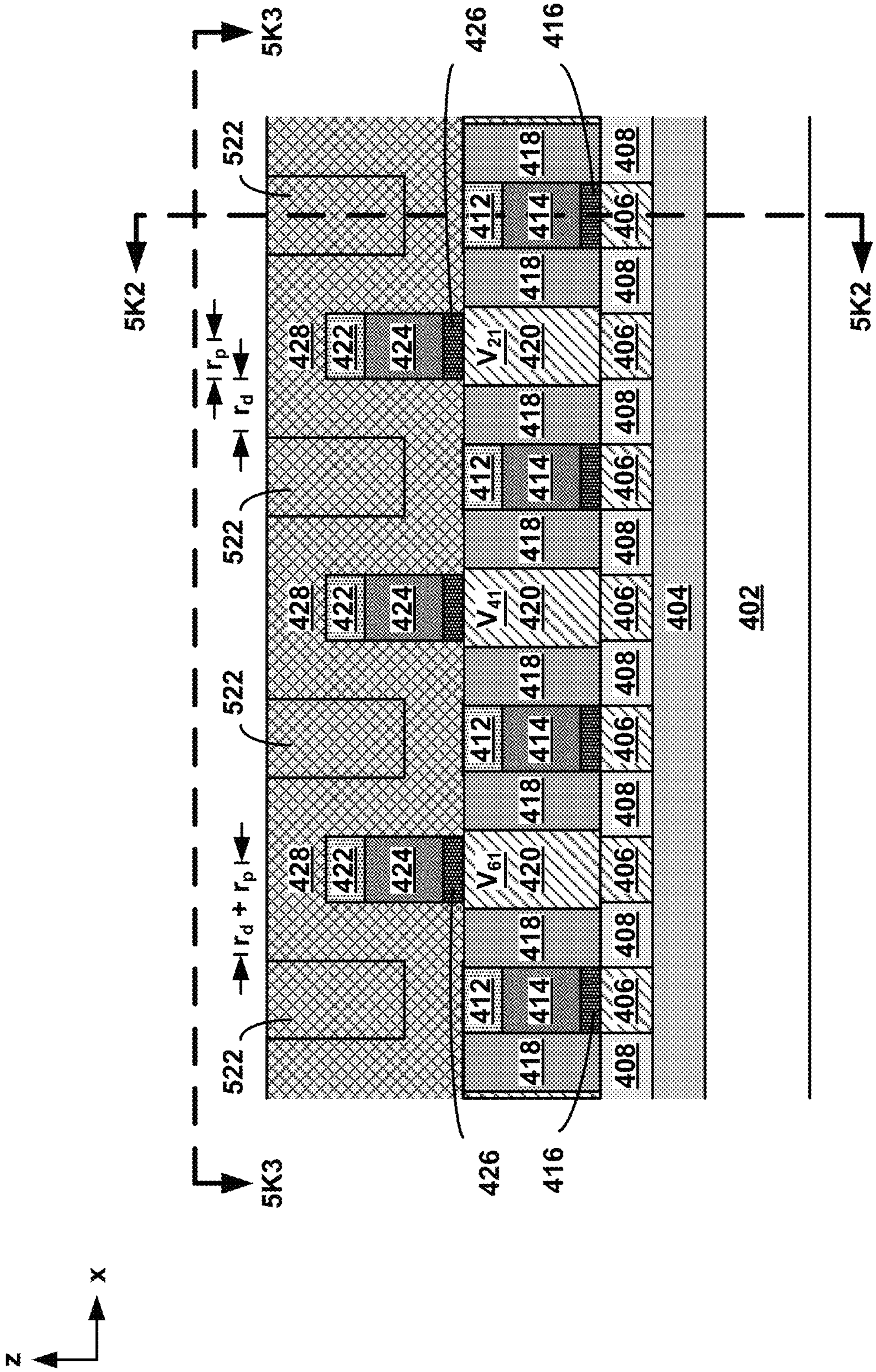
FIG. 5K1

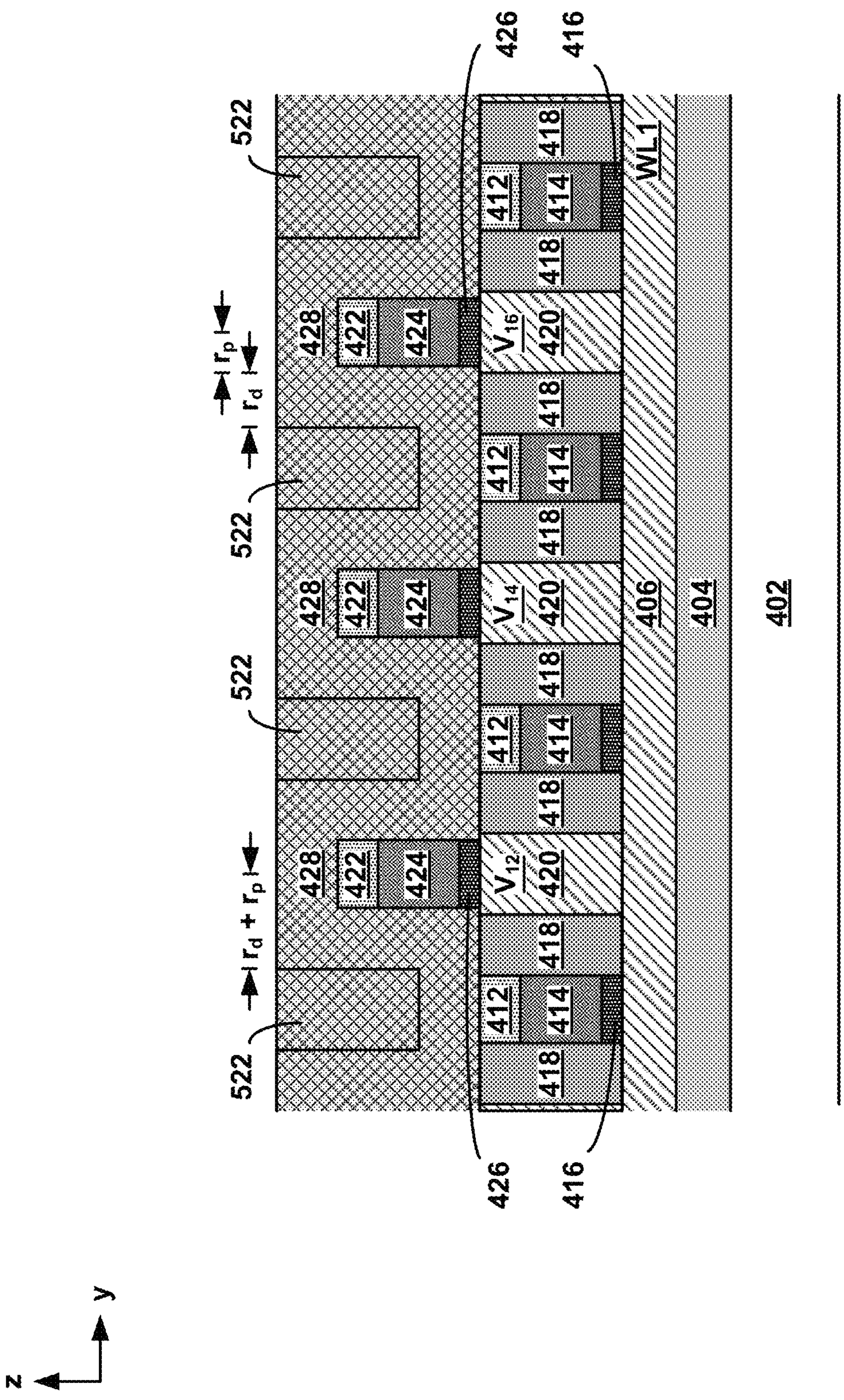
FIG. 5K2

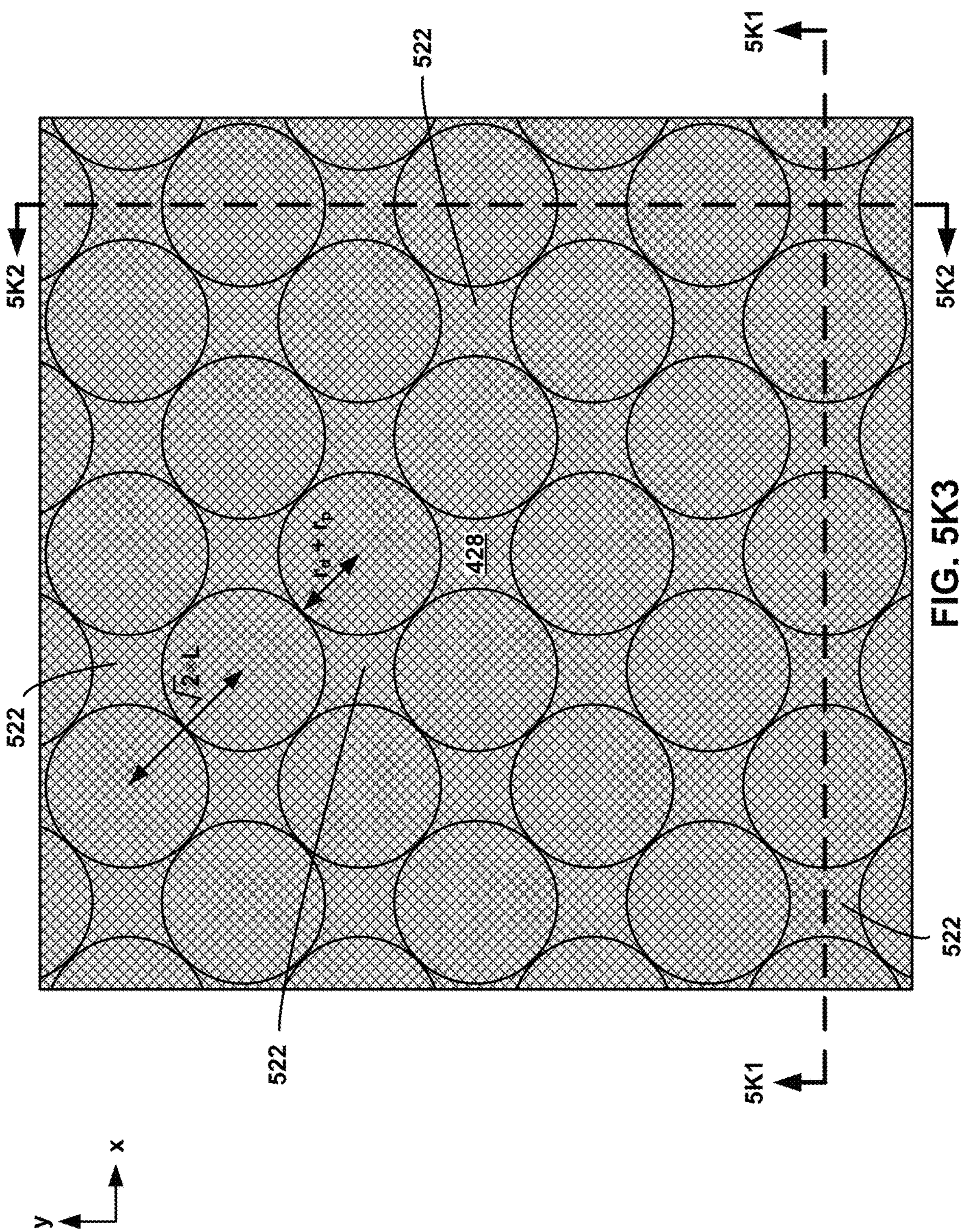
FIG. 5K3

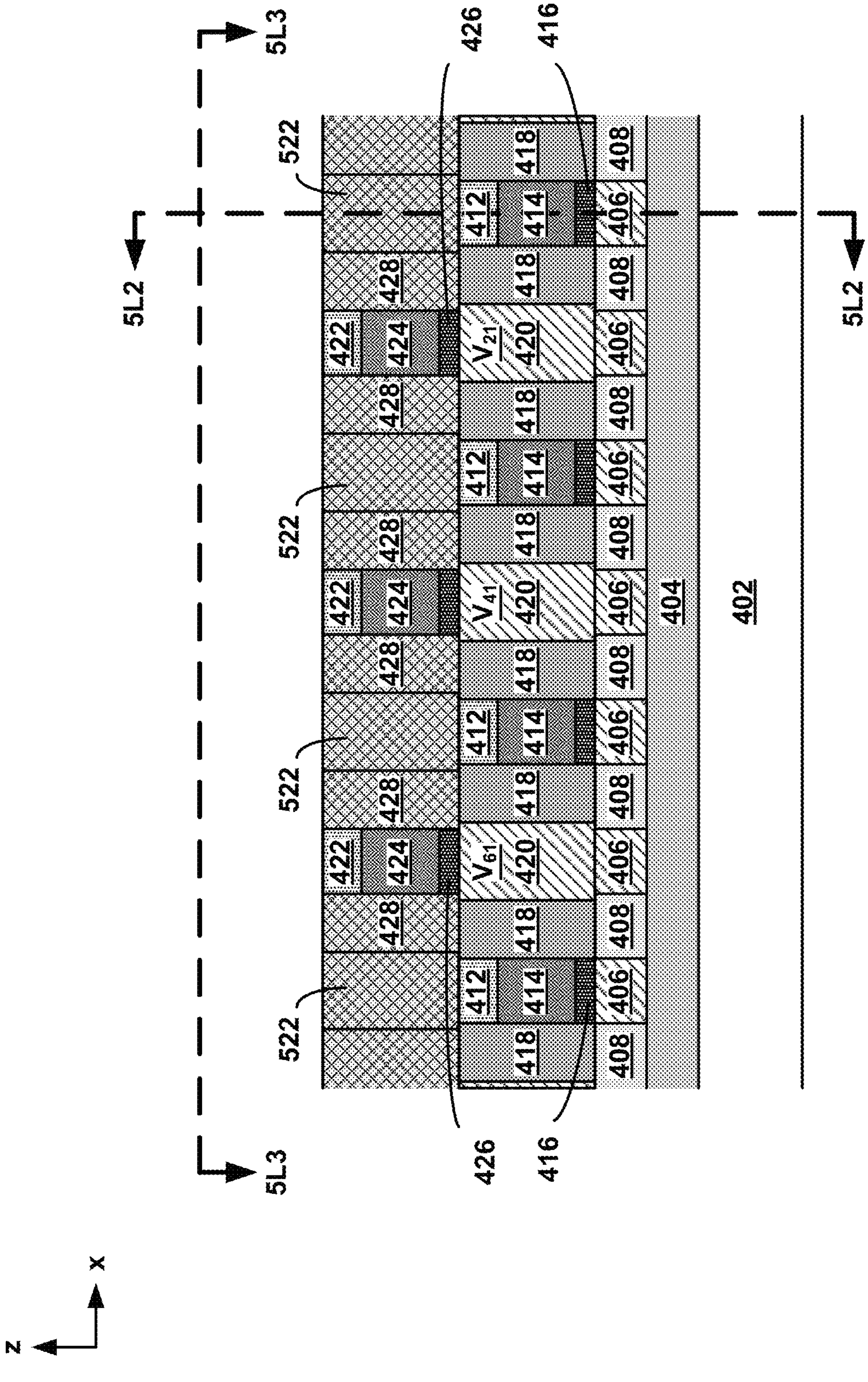
FIG. 5L1

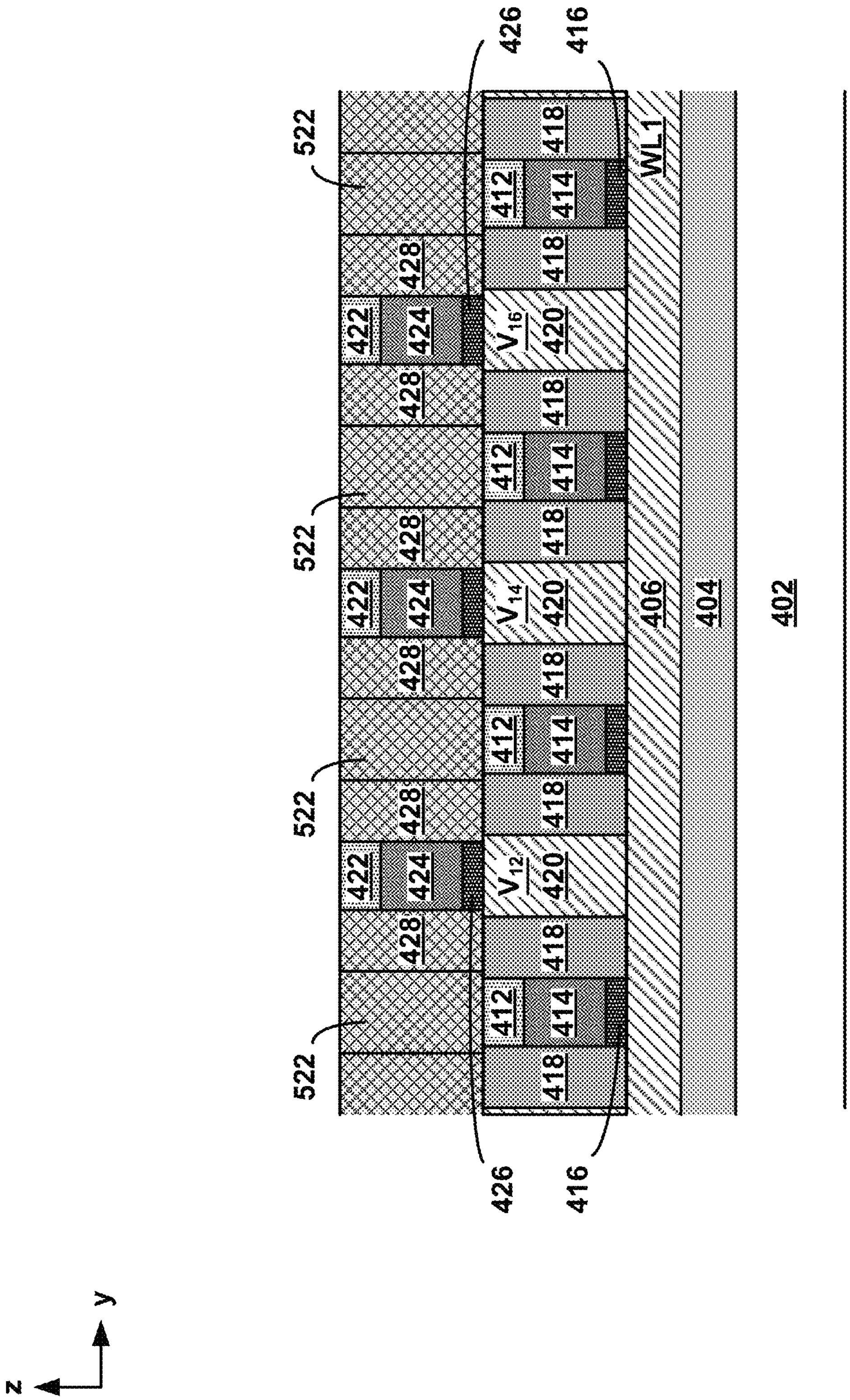
FIG. 5L2

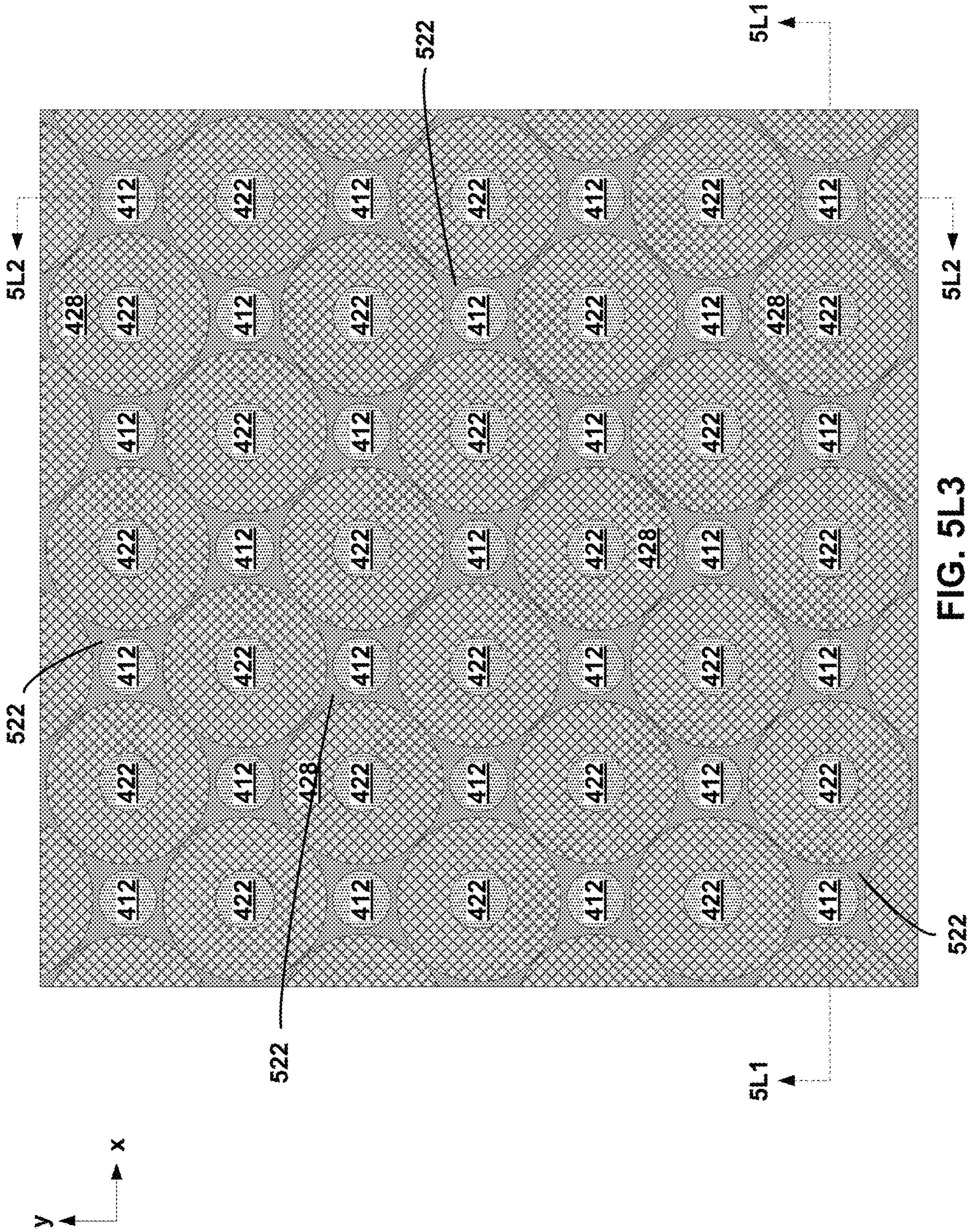
FIG. 5L3

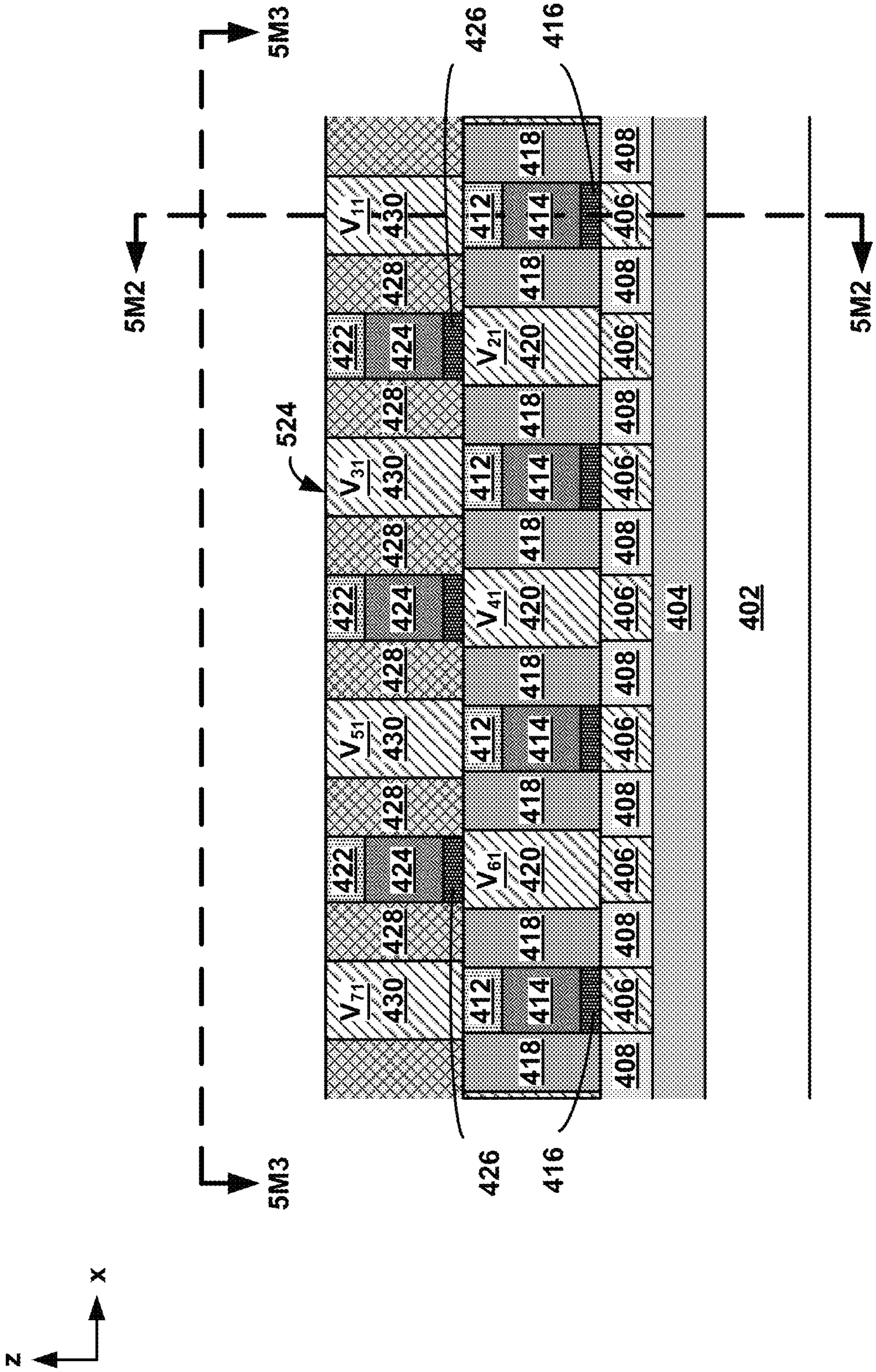
FIG. 5M1

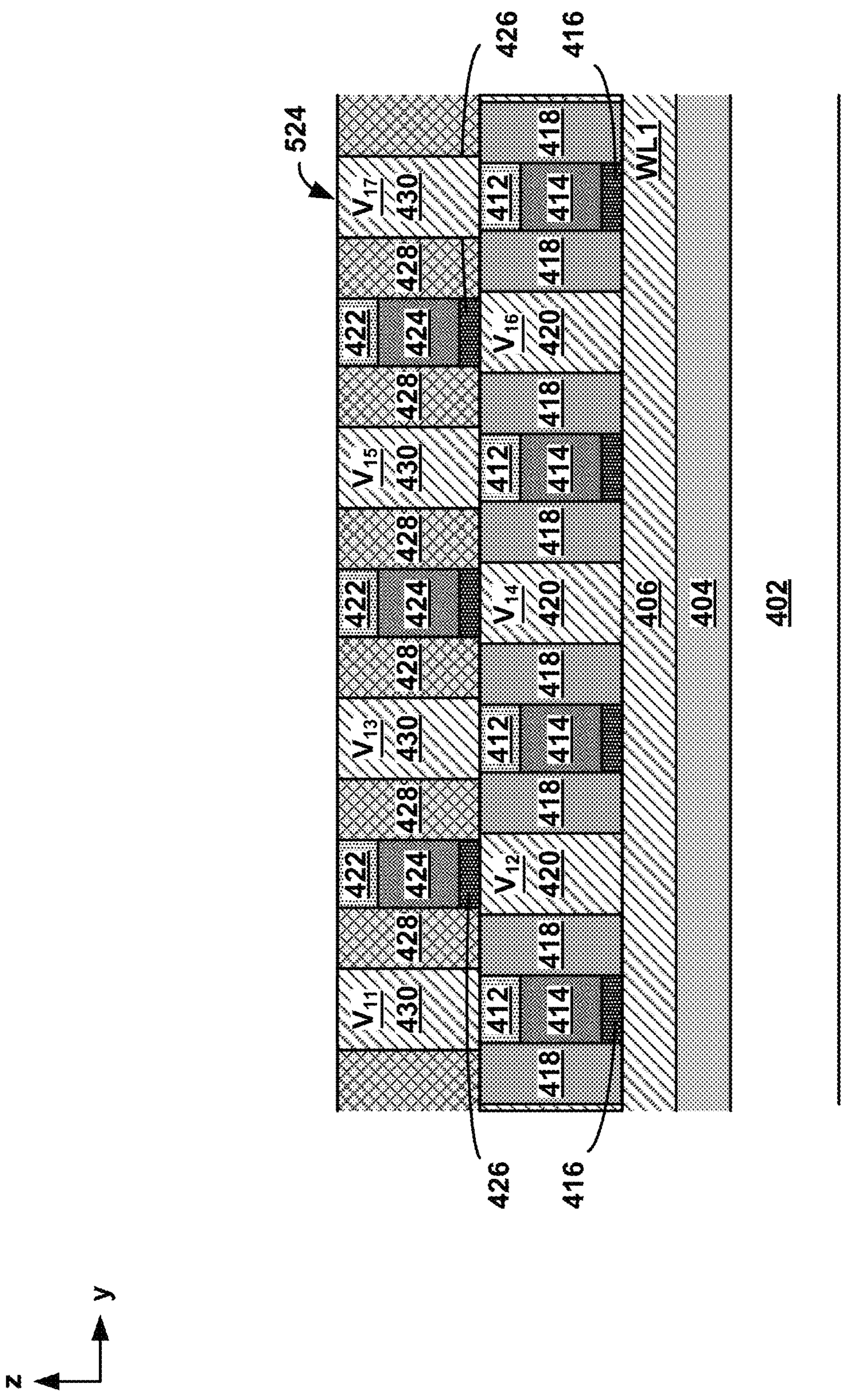
FIG. 5M2

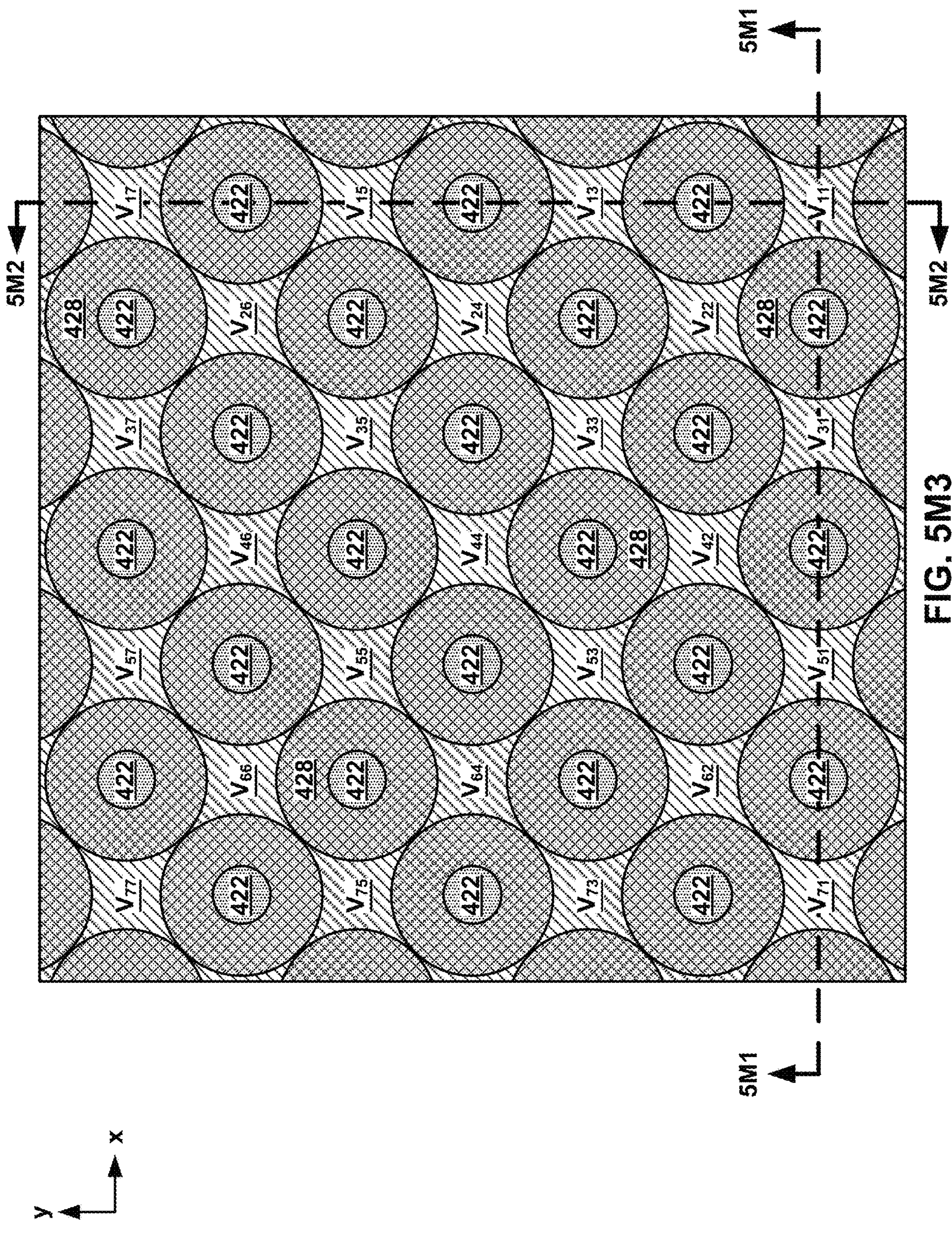
FIG. 5M3

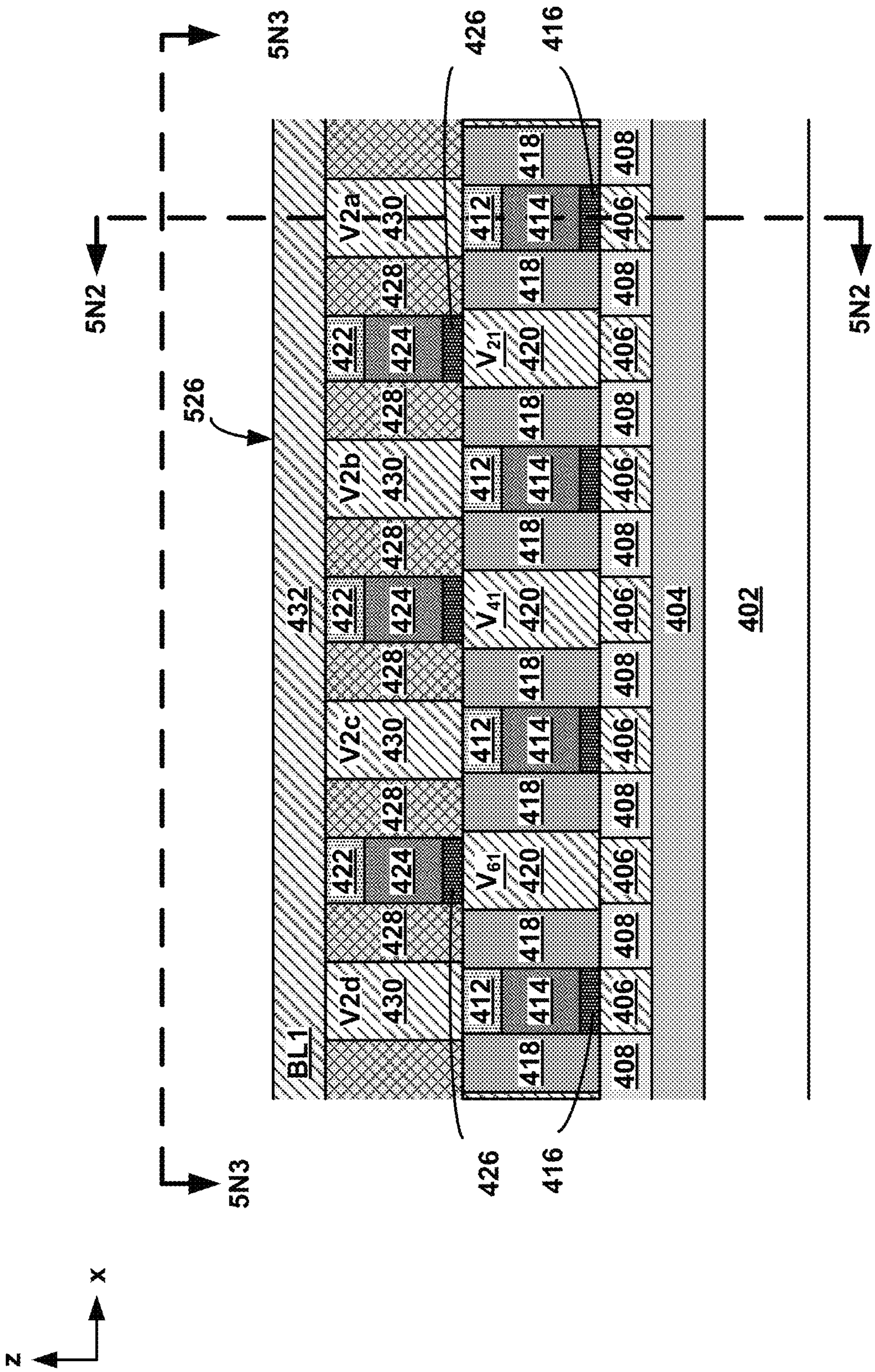
FIG. 5N1

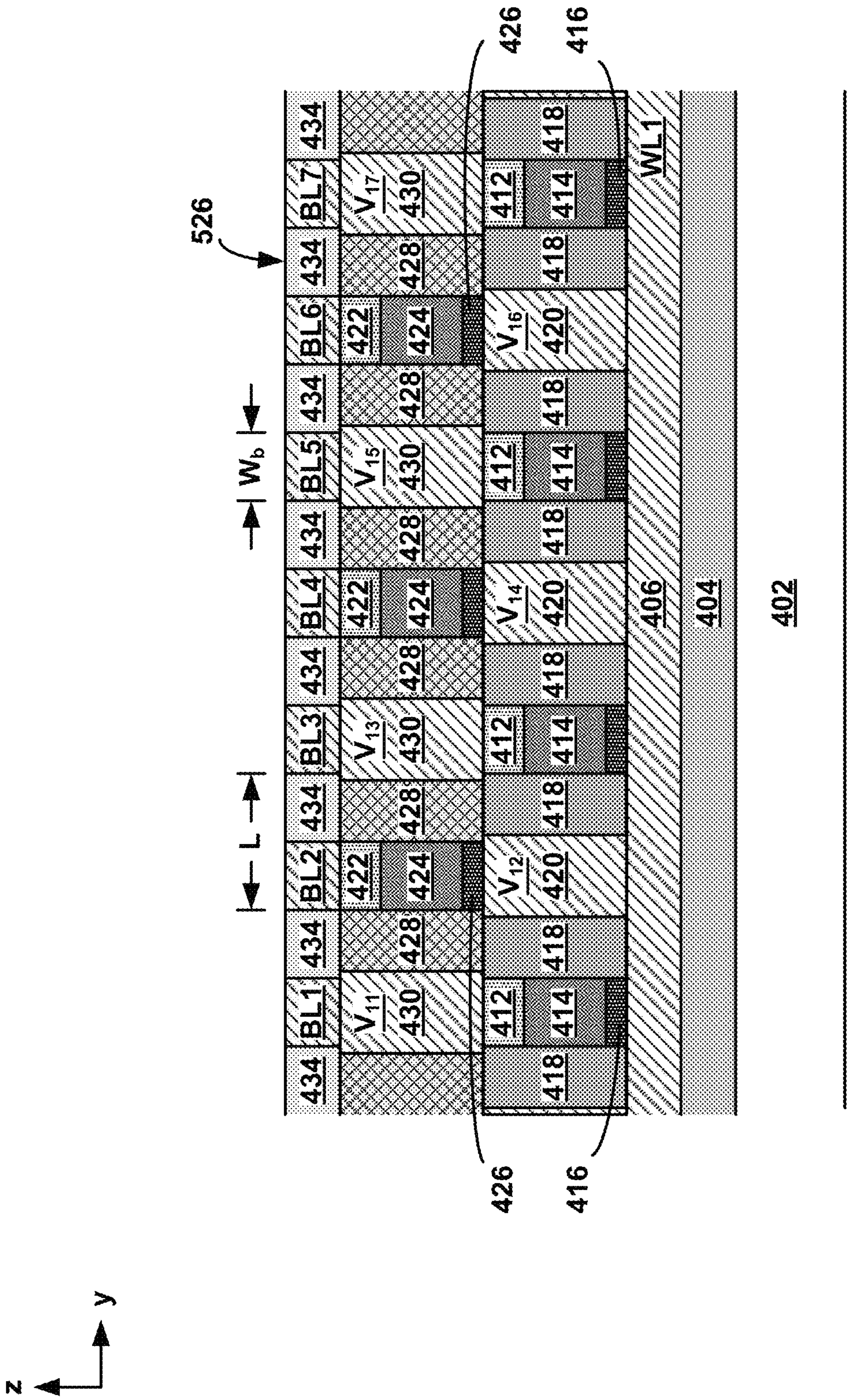
FIG. 5N2

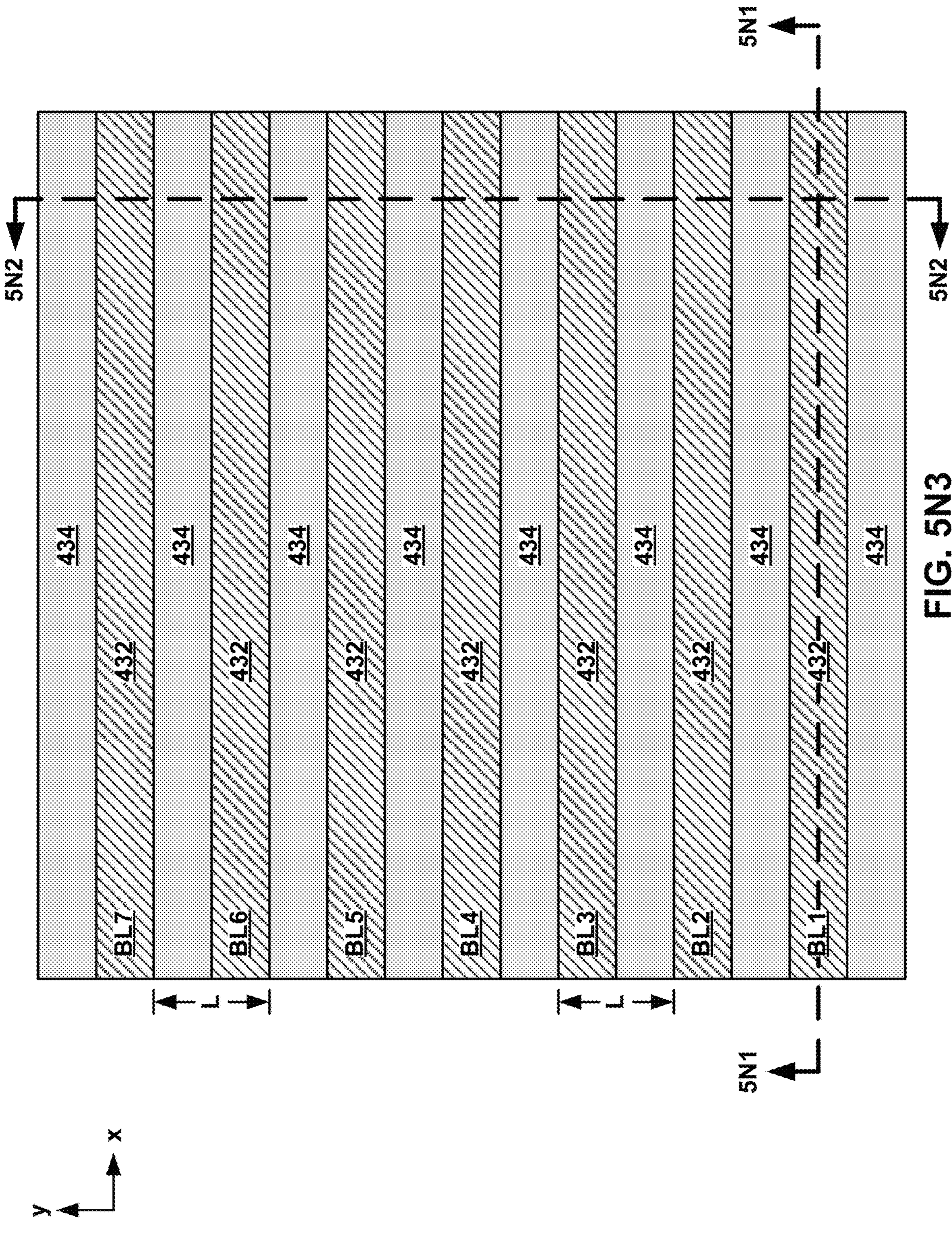
FIG. 5N3

ONE SELECTOR ONE RESISTOR MRAM CROSSPOINT MEMORY ARRAY FABRICATION METHODS

PRIORITY DATA

This application is a divisional of U.S. patent application Ser. No. 16/460,820 filed on Jul. 2, 2019, now U.S. Pat. No. 11,056,534, entitled "ONE SELECTOR ONE RESISTOR MRAM CROSSPOINT MEMORY ARRAY FABRICATION METHODS, which claims priority to U.S. Provisional Application No. 62/867,590, filed on Jun. 27, 2019, entitled "ONE SELECTOR ONE RESISTOR MRAM CROSSPOINT MEMORY ARRAY FABRICATION METHODS," which applications are incorporated herein by reference in their entirety for all purposes.

BACKGROUND

Memory is widely used in various electronic devices such as cellular telephones, digital cameras, personal digital assistants, medical electronics, mobile computing devices, non-mobile computing devices and data servers. Memory may be non-volatile memory or volatile memory. A non-volatile memory allows information to be stored and retained even when the non-volatile memory is not connected to a source of power (e.g., a battery).

One example of a non-volatile memory is magnetoresistive random access memory (MRAM), which uses magnetization to represent stored data, in contrast to some other memory technologies that store data using electronic charge. Generally, MRAM includes a large number of magnetic memory cells formed on a semiconductor substrate, where each memory cell represents one bit of data. A bit of data is written to a memory cell by changing the direction of magnetization of a magnetic element within the memory cell, and a bit is read by measuring the resistance of the memory cell (low resistance typically represents a "0" bit, and high resistance typically represents a "1" bit). As used herein, direction of magnetization is the direction of orientation of the magnetic moment.

Although MRAM is a promising technology, numerous design and process challenges remain.

BRIEF DESCRIPTION OF THE DRAWINGS

FIGS. 5A1-5N3 are cross-sectional views of a portion of a substrate during an example fabrication of the memory array of FIGS. 4A-4B.

DETAILED DESCRIPTION

Memory arrays and methods of forming memory arrays are provided. In particular, cross-point memory arrays and methods of forming cross-point memory arrays are provided. In an embodiment, a cross-point memory array (and methods of forming such a cross-point memory array) are provided that include a plurality of memory cells, each memory cell comprising a magnetic memory element and a selector element, each selector element disposed above or below a corresponding magnetic memory element.

In an embodiment, memory cells within a memory array may include re-writable non-volatile memory cells including a reversible resistance-switching element. A reversible resistance-switching element may include a reversible resistivity-switching material having a resistivity that may be reversibly switched between two or more states. In an embodiment, the reversible resistance-switching material may include a metal oxide, solid electrolyte, phase-change material, magnetic material, or other similar resistivity-switching material. Various metal oxides can be used, such as transition metal-oxides. Examples of metal-oxides include, but are not limited to, NiO, $Nb_2O_5$, $TiO_2$, $HfO_2$, $Al_2O_3$, $MgO_x$, $CrO_2$, VO, BN, $TaO_2$, $Ta_2O_3$, and AlN.

Figure 1A:
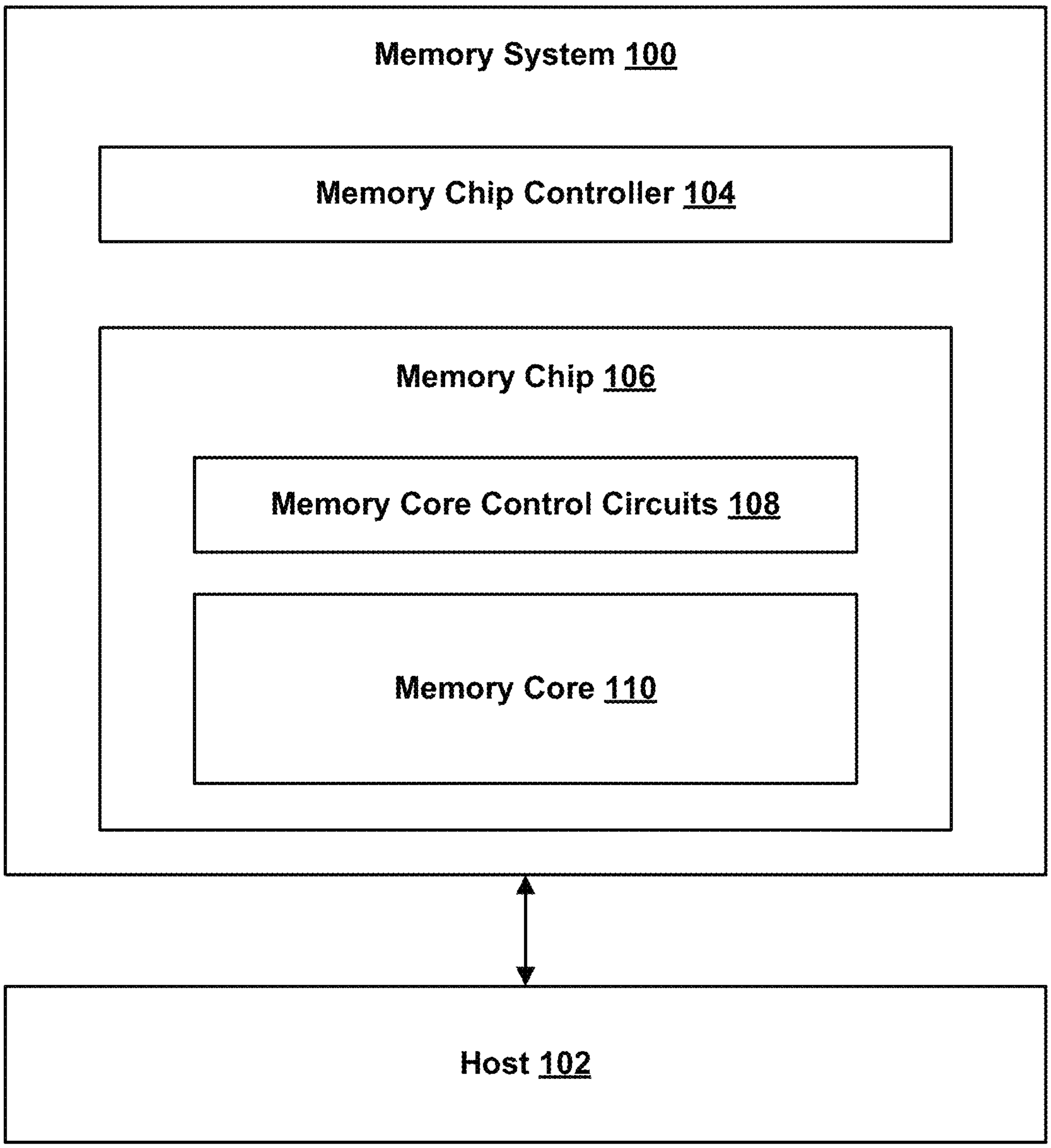
FIGS. 1A-1H depict various embodiments of a memory system.

FIG. 1A depicts one embodiment of a memory system 100 and a host 102. Memory system 100 may include a non-volatile storage system interfacing with host 102 (e.g., a mobile computing device or a server). In some cases, memory system 100 may be embedded within host 102. As examples, memory system 100 may be a memory card, a solid-state drive (SSD) such a high density MLC SSD (e.g., 2-bits/cell or 3-bits/cell) or a high performance SLC SSD, or a hybrid HDD/SSD drive.

As depicted, memory system 100 includes a memory chip controller 104 and a memory chip 106. Memory chip 106 may include volatile memory and/or non-volatile memory. Although a single memory chip is depicted, memory system 100 may include more than one memory chip. Memory chip controller 104 may receive data and commands from host 102 and provide memory chip data to host 102.

Memory chip controller 104 may include one or more state machines, page registers, SRAM, and control circuitry for controlling the operation of memory chip 106. The one or more state machines, page registers, SRAM, and control circuitry for controlling the operation of the memory chip may be referred to as managing or control circuits. The managing or control circuits may facilitate one or more memory array operations including forming, erasing, programming, or reading operations.

In some embodiments, the managing or control circuits (or a portion of the managing or control circuits) for facilitating one or more memory array operations may be integrated within memory chip 106. Memory chip controller 104 and memory chip 106 may be arranged on a single integrated circuit or arranged on a single die. In other embodiments, memory chip controller 104 and memory chip 106 may be arranged on different integrated circuits. In some cases, memory chip controller 104 and memory chip 106 may be integrated on a system board, logic board, or a PCB.

Memory chip 106 includes memory core control circuits 108 and a memory core 110. Memory core control circuits 108 may include logic for controlling the selection of memory blocks (or arrays) within memory core 110, controlling the generation of voltage references for biasing a particular memory array into a read or write state, and generating row and column addresses.

Memory core 110 may include one or more two-dimensional arrays of memory cells and/or one or more three-dimensional arrays of memory cells. In an embodiment, memory core control circuits 108 and memory core 110 may be arranged on a single integrated circuit. In other embodiments, memory core control circuits 108 (or a portion of memory core control circuits 108) and memory core 110 may be arranged on different integrated circuits.

A memory operation may be initiated when host 102 sends instructions to memory chip controller 104 indicating that host 102 would like to read data from memory system 100 or write data to memory system 100. In the event of a write (or programming) operation, host 102 may send to memory chip controller 104 both a write command and the data to be written. Memory chip controller 104 may buffer data to be written and may generate error correction code (ECC) data corresponding with the data to be written. The ECC data, which allows data errors that occur during transmission or storage to be detected and/or corrected, may be written to memory core 110 or stored in non-volatile memory within memory chip controller 104. In an embodiment, the ECC data are generated and data errors are corrected by circuitry within memory chip controller 104.

Memory chip controller 104 may control operation of memory chip 106. In an example, before issuing a write operation to memory chip 106, memory chip controller 104 may check a status register to make sure that memory chip 106 is able to accept the data to be written. In another example, before issuing a read operation to memory chip 106, memory chip controller 104 may pre-read overhead information associated with the data to be read. The overhead information may include ECC data associated with the data to be read or a redirection pointer to a new memory location within memory chip 106 in which to read the data requested.

Once memory chip controller 104 initiates a read or write operation, memory core control circuits 108 may generate appropriate bias voltages for word lines and bit lines within memory core 110, as well as generate the appropriate memory block, row, and column addresses.

In some embodiments, one or more managing or control circuits may be used for controlling the operation of a memory array within memory core 110. The one or more managing or control circuits may provide control signals to a memory array to perform a read operation and/or a write operation on the memory array. In one example, the one or more managing or control circuits may include any one of or a combination of control circuitry, state machines, decoders, sense amplifiers, read/write circuits, and/or controllers.

The one or more managing circuits may perform or facilitate one or more memory array operations including erasing, programming, or reading operations. In one example, one or more managing circuits may include an on-chip memory controller for determining row and column address, word line and bit line addresses, memory array enable signals, and data latching signals.

Figure 1B:
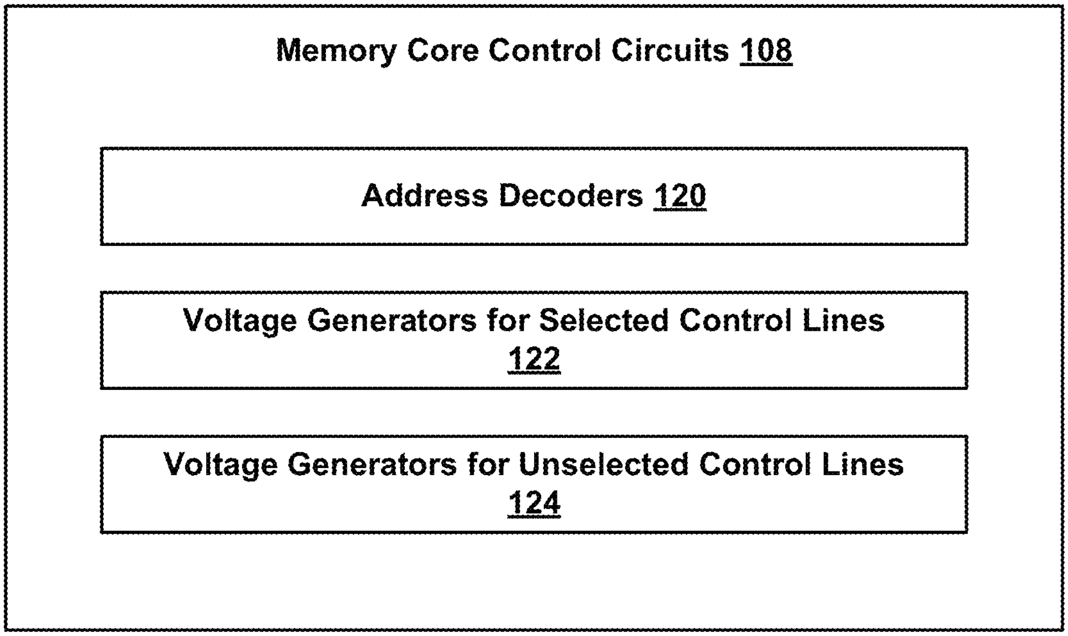

FIG. 1B depicts one embodiment of memory core control circuits 108. As depicted, memory core control circuits 108 include address decoders 120, voltage generators for selected control lines 122, and voltage generators for unselected control lines 124. Control lines may include word lines, bit lines, or a combination of word lines and bit lines. Selected control lines may include selected word lines or selected bit lines that are used to place memory cells into a selected state. Unselected control lines may include unselected word lines or unselected bit lines that are used to place memory cells into an unselected state.

Voltage generators (or voltage regulators) for selected control lines 122 may include one or more voltage generators for generating selected control line voltages. Voltage generators for unselected control lines 124 may include one or more voltage generators for generating unselected control line voltages. Address decoders 120 may generate memory block addresses, as well as row addresses and column addresses for a particular memory block.

FIGS. 1C-1F depict one embodiment of a memory core organization that includes a memory core 110 having multiple memory bays, and each memory bay having multiple memory blocks. Although a memory core organization is disclosed where memory bays include memory blocks, and memory blocks include a group of memory cells, other organizations or groupings also can be used with the technology described herein.

Figure 1C:
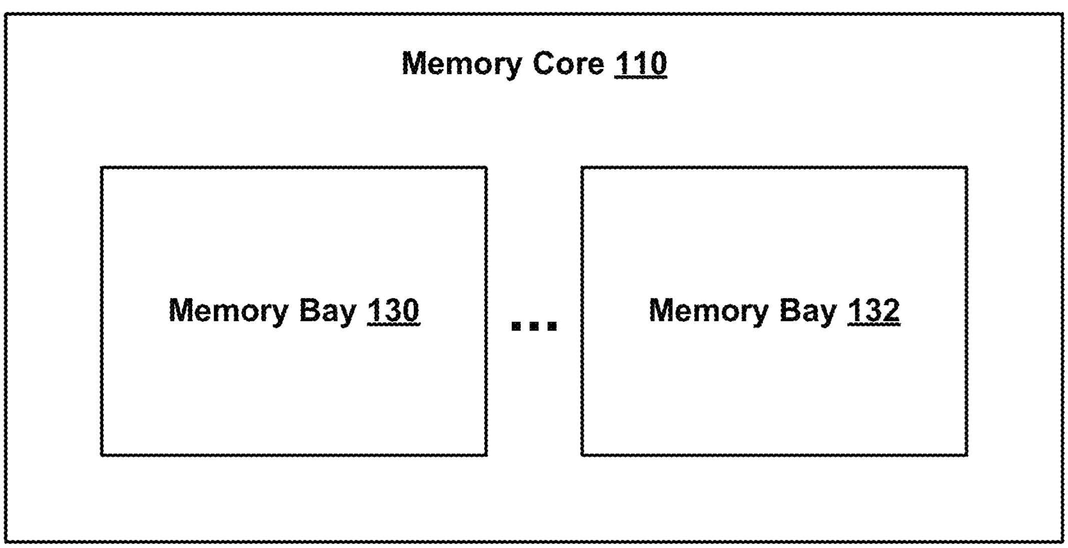

FIG. 1C depicts an embodiment of memory core 110 of FIG. 1A. As depicted, memory core 110 includes memory bay 130 and memory bay 132. In some embodiments, the number of memory bays per memory core can be different for different implementations. For example, a memory core may include only a single memory bay or multiple memory bays (e.g., 16 memory bays, 256 memory bays, etc.).

Figure 1D:
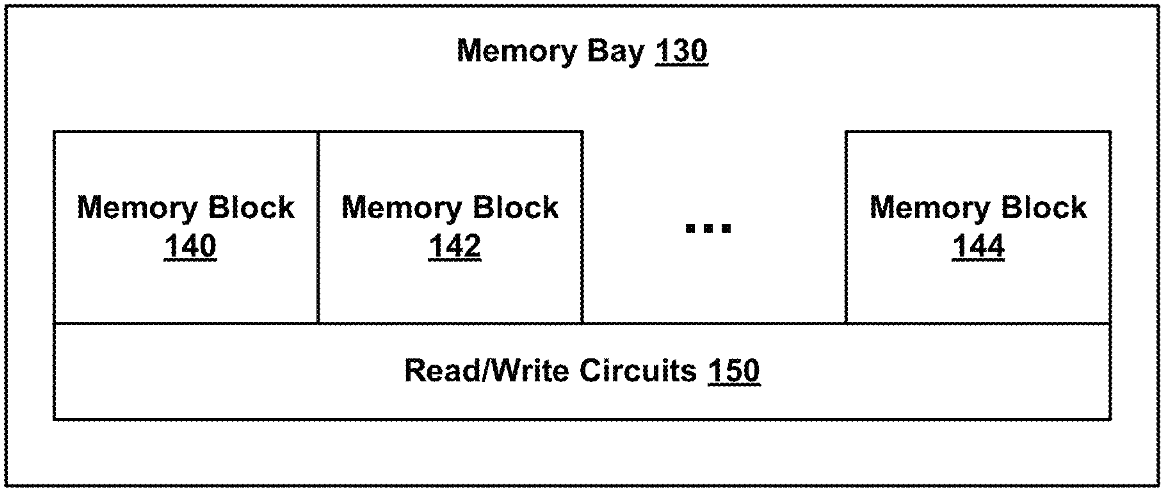

FIG. 1D depicts one embodiment of memory bay 130 of FIG. 1C. As depicted, memory bay 130 includes memory blocks 140-144 and read/write circuits 150. In some embodiments, the number of memory blocks per memory bay may be different for different implementations. For example, a memory bay may include one or more memory blocks (e.g., 32 memory blocks per memory bay).

Read/write circuits 150 include circuitry for reading and writing memory cells within memory blocks 140-144. As depicted, read/write circuits 150 may be shared across multiple memory blocks within a memory bay. This allows chip area to be reduced because a single group of read/write circuits 150 may be used to support multiple memory blocks. However, in some embodiments, only a single memory block may be electrically coupled to read/write circuits 150 at a particular time to avoid signal conflicts.

In some embodiments, read/write circuits 150 may be used to write one or more pages of data into memory blocks 140-144 (or into a subset of the memory blocks). The memory cells within memory blocks 140-144 may permit direct over-writing of pages (i.e., data representing a page or a portion of a page may be written into memory blocks 140-144 without requiring an erase or reset operation to be performed on the memory cells prior to writing the data).

In an example, memory system 100 of FIG. 1A may receive a write command including a target address and a set of data to be written to the target address. Memory system 100 may perform a read-before-write (RBW) operation to read the data currently stored at the target address before performing a write operation to write the set of data to the target address. Memory system 100 may then determine whether a particular memory cell may stay at its current state (i.e., the memory cell is already at the correct state), needs to be set to a “0” state, or needs to be reset to a “1” state.

Memory system 100 may then write a first subset of the memory cells to the “0” state and then write a second subset of the memory cells to the “1” state. The memory cells that are already at the correct state may be skipped over, thereby improving programming speed and reducing the cumulative voltage stress applied to unselected memory cells.

A particular memory cell may be set to the “1” state by applying a first voltage difference across the particular memory cell of a first polarity (e.g., +1.5V). The particular memory cell may be reset to the “0” state by applying a second voltage difference across the particular memory cell of a second polarity that is opposite to that of the first polarity (e.g., −1.5V).

In some cases, read/write circuits 150 may be used to program a particular memory cell to be in one of three or more data/resistance states (i.e., the particular memory cell may comprise a multi-level memory cell). In an example, read/write circuits 150 may apply a first voltage difference (e.g., 2V) across the particular memory cell to program the particular memory cell to a first state of the three or more data/resistance states, or a second voltage difference (e.g., 1V) across the particular memory cell that is less than the first voltage difference to program the particular memory cell to a second state of the three or more data/resistance states.

Applying a smaller voltage difference across the particular memory cell may cause the particular memory cell to be partially programmed or programmed at a slower rate than when applying a larger voltage difference. In another example, read/write circuits 150 may apply a first voltage difference across the particular memory cell for a first time period (e.g., 150 ns) to program the particular memory cell to a first state of the three or more data/resistance states, or apply the first voltage difference across the particular memory cell for a second time period less than the first time period (e.g., 50 ns). One or more programming pulses followed by a memory cell verification phase may be used to program the particular memory cell to be in the correct state.

Figure 1E:
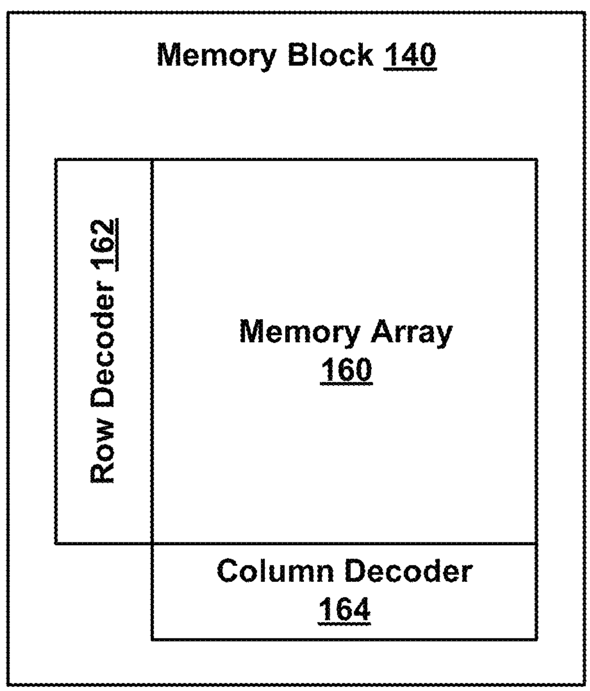

FIG. 1E depicts one embodiment of memory block 140 of FIG. 1D. As depicted, memory block 140 includes a memory array 160, a row decoder 162, and a column decoder 164. Memory array 160 may include a contiguous group of memory cells having contiguous word lines and bit lines. Memory array 160 may include one or more layers of memory cells, and may include a two-dimensional memory array and/or a three-dimensional memory array.

Row decoder 162 decodes a row address and selects a particular word line in memory array 160 when appropriate (e.g., when reading or writing memory cells in memory array 160). Column decoder 164 decodes a column address and selects a particular group of bit lines in memory array 160 to be electrically coupled to read/write circuits, such as read/write circuits 150 of FIG. 1D. In an embodiment, the number of word lines is 4K per memory layer, the number of bit lines is 1K per memory layer, and the number of memory layers is 4, providing a memory array 160 containing 16M memory cells. Other numbers of word lines per layer, bit lines per layer, and number of layers may be used.

Figure 1F:
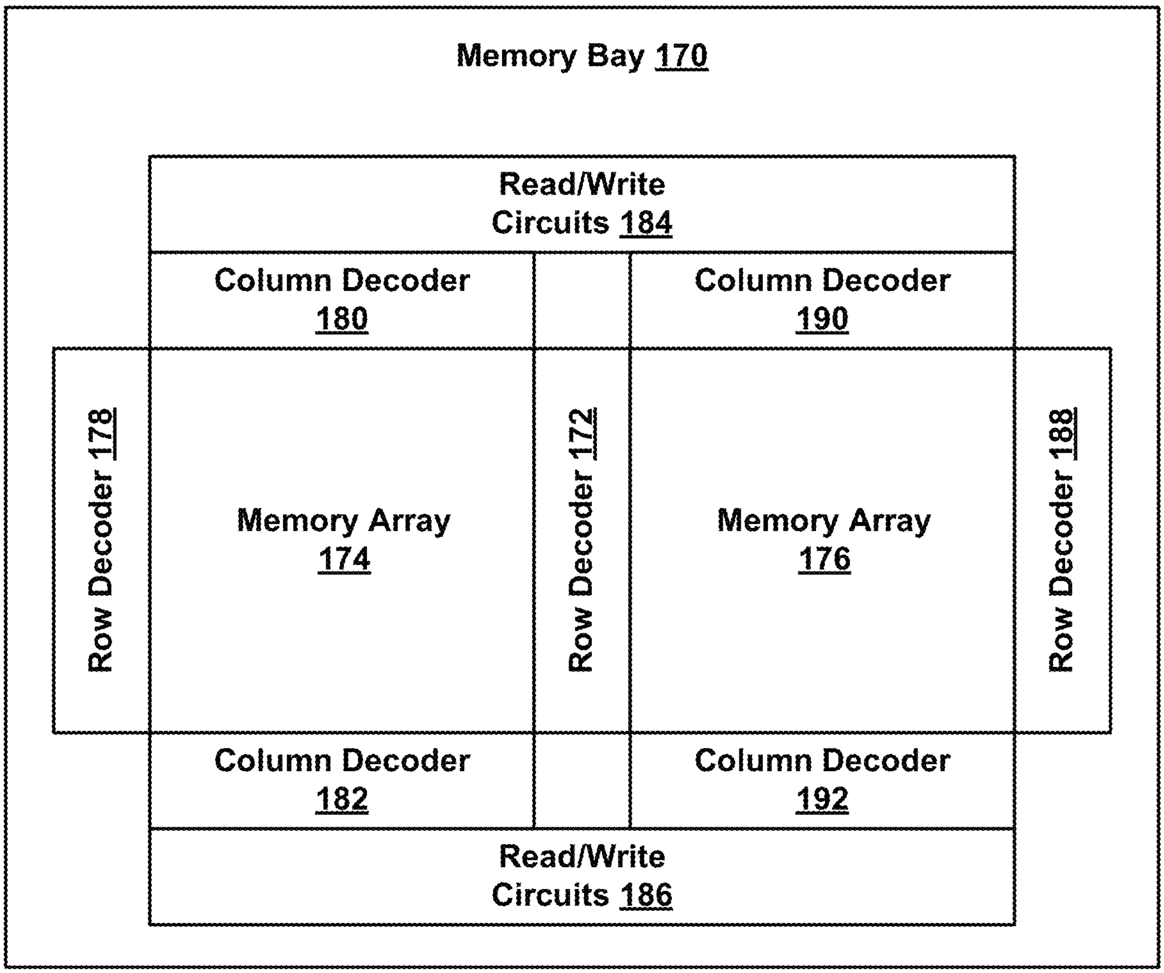

FIG. 1F depicts an embodiment of a memory bay 170. Memory bay 170 is an example of an alternative implementation for memory bay 130 of FIG. 1D. In some embodiments, row decoders, column decoders, and read/write circuits may be split or shared between memory arrays. As depicted, row decoder 172 is shared between memory arrays 174 and 176, because row decoder 172 controls word lines in both memory arrays 174 and 176 (i.e., the word lines driven by row decoder 172 are shared).

Row decoders 178 and 172 may be split such that even word lines in memory array 174 are driven by row decoder 178 and odd word lines in memory array 174 are driven by row decoder 172. Column decoders 180 and 182 may be split such that even bit lines in memory array 174 are controlled by column decoder 182 and odd bit lines in memory array 174 are driven by column decoder 180. The selected bit lines controlled by column decoder 180 may be electrically coupled to read/write circuits 184. The selected bit lines controlled by column decoder 182 may be electrically coupled to read/write circuits 186. Splitting the read/write circuits into read/write circuits 184 and 186 when the column decoders are split may allow for a more efficient layout of the memory bay.

Row decoders 188 and 172 may be split such that even word lines in memory array 176 are driven by row decoder 188 and odd word lines in memory array 176 are driven by row decoder 172. Column decoders 190 and 192 may be split such that even bit lines in memory array 176 are controlled by column decoder 192 and odd bit lines in memory array 176 are driven by column decoder 190. The selected bit lines controlled by column decoder 190 may be electrically coupled to read/write circuits 184. The selected bit lines controlled by column decoder 192 may be electrically coupled to read/write circuits 186. Splitting the read/write circuits into read/write circuits 184 and 186 when the column decoders are split may allow for a more efficient layout of the memory bay.

Figure 1G:
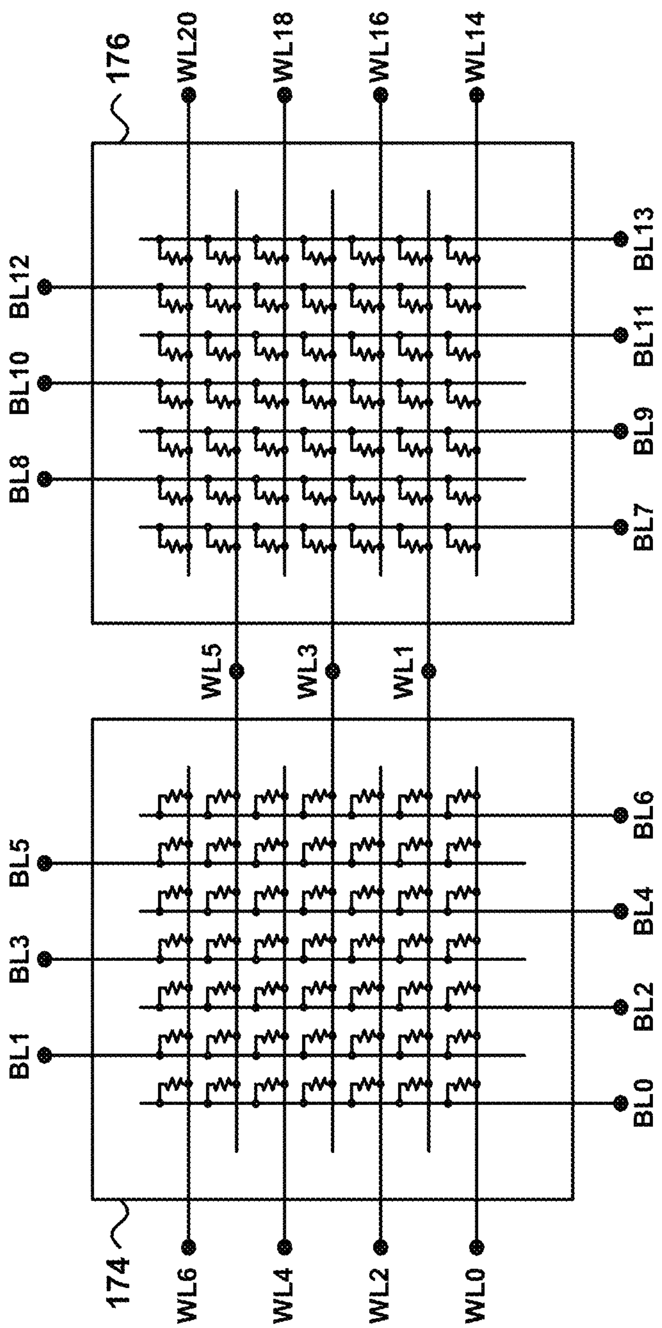

FIG. 1G depicts an embodiment of a schematic diagram (including word lines and bit lines) corresponding with memory bay 170 in FIG. 1F. As depicted, word lines WL1, WL3, and WL5 are shared between memory arrays 174 and 176 and controlled by row decoder 172 of FIG. 1F. Word lines WL0, WL2, WL4, and WL6 are driven from the left side of memory array 174 and controlled by row decoder 178 of FIG. 1F. Word lines WL14, WL16, WL18, and WL20 are driven from the right side of memory array 176 and controlled by row decoder 188 of FIG. 1F.

Bit lines BL0, BL2, BL4, and BL6 are driven from the bottom of memory array 174 and controlled by column decoder 182 of FIG. 1F. Bit lines BL1, BL3, and BL5 are driven from the top of memory array 174 and controlled by column decoder 180 of FIG. 1F. Bit lines BL7, BL9, BL11, and BL13 are driven from the bottom of memory array 176 and controlled by column decoder 192 of FIG. 1F. Bit lines BL8, BL10, and BL12 are driven from the top of memory array 176 and controlled by column decoder 190 of FIG. 1F.

In an embodiment, memory arrays 174 and 176 may include memory layers that are oriented in a plane that is horizontal to the supporting substrate. In another embodiment, memory arrays 174 and 176 may include memory layers that are oriented in a plane that is vertical with respect to the supporting substrate (i.e., the vertical plane is substantially perpendicular to the supporting substrate). In this case, the bit lines of the memory arrays may include substantially vertical bit lines.

Figure 1H:
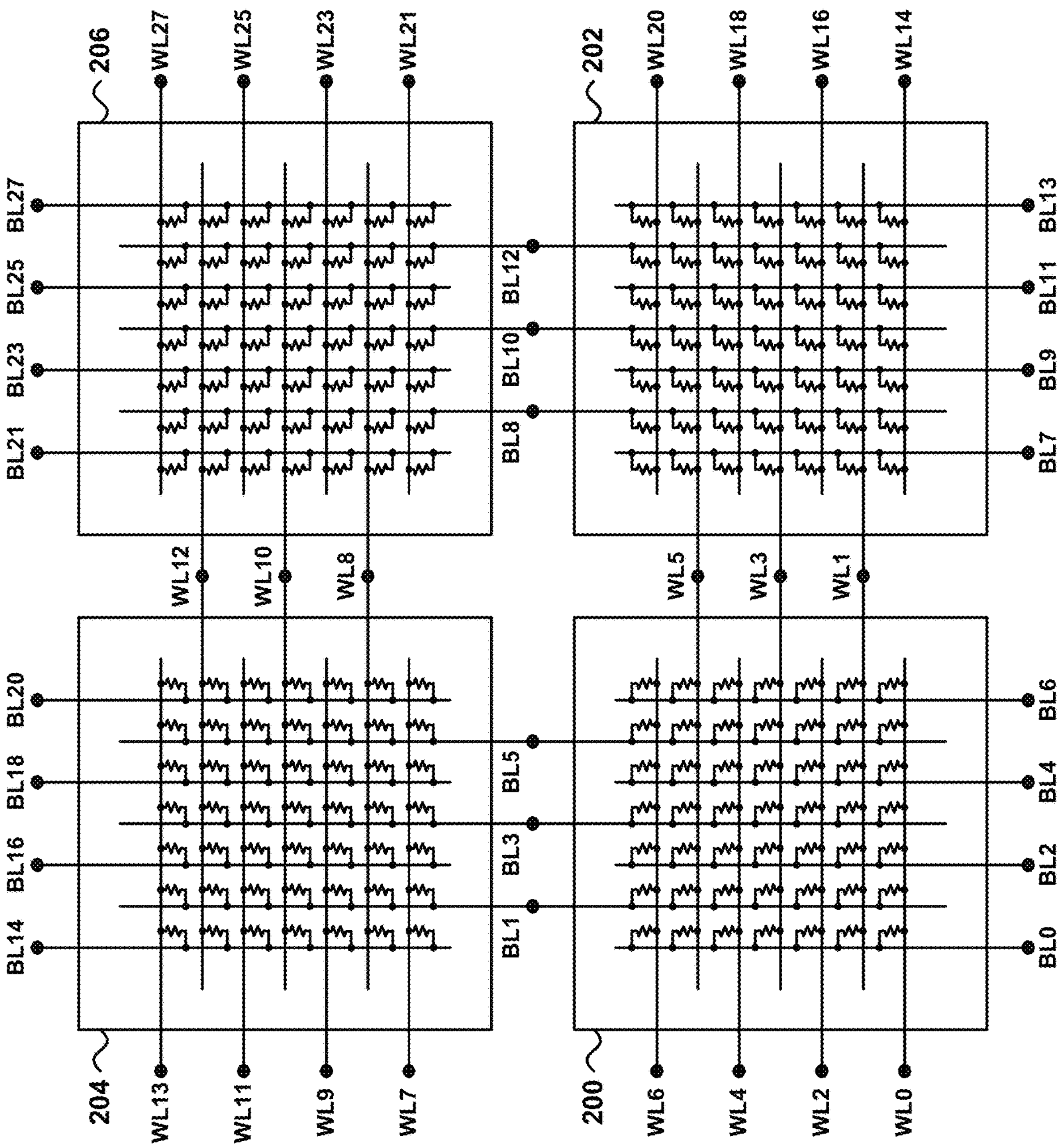

FIG. 1H depicts one embodiment of a schematic diagram (including word lines and bit lines) corresponding with a memory bay arrangement wherein word lines and bit lines are shared across memory blocks, and both row decoders and column decoders are split. Sharing word lines and/or bit lines helps to reduce layout area because a single row decoder and/or column decoder can be used to support two memory arrays.

As depicted, word lines WL1, WL3, and WL5 are shared between memory arrays 200 and 202. Bit lines BL1, BL3, and BL5 are shared between memory arrays 200 and 204. Word lines WL8, WL10, and WL12 are shared between memory arrays 204 and 206. Bit lines BL8, BL10, and BL12 are shared between memory arrays 202 and 206.

Row decoders are split such that word lines WL0, WL2, WL4, and WL6 are driven from the left side of memory array 200 and word lines WL1, WL3, and WL5 are driven from the right side of memory array 200. Likewise, word lines WL7, WL9, WL11, and WL13 are driven from the left side of memory array 204 and word lines WL8, WL10, and WL12 are driven from the right side of memory array 204.

Column decoders are split such that bit lines BL0, BL2, BL4, and BL6 are driven from the bottom of memory array 200 and bit lines BL1, BL3, and BL5 are driven from the top of memory array 200. Likewise, bit lines BL7, BL9, BL11, and BL13 are driven from the bottom of memory array 202 and bit lines BL8, BL10, and BL12 are driven from the top of memory array 202. Splitting row and/or column decoders also helps to relieve layout constraints (e.g., the column decoder pitch can be relieved by 2× since the split column decoders need only drive every other bit line instead of every bit line).

Figure 2A:
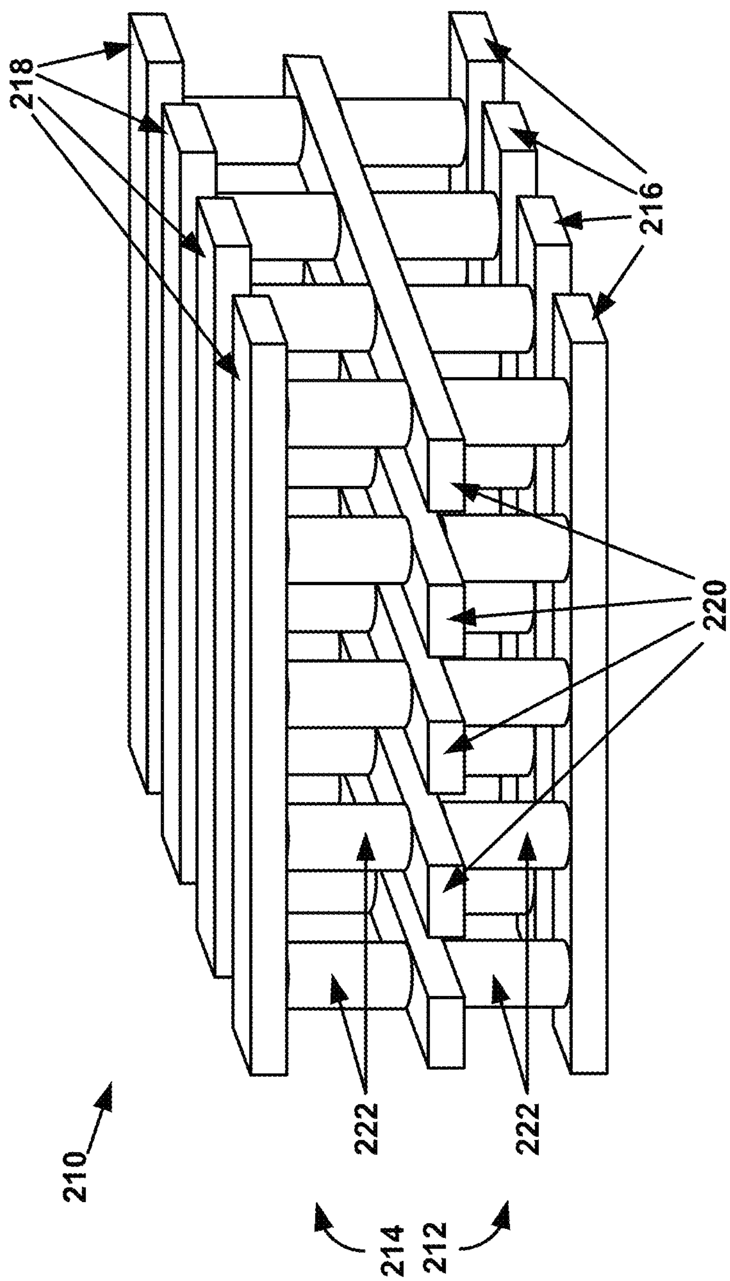
FIG. 2A depicts an embodiment of a portion of a three-dimensional memory array.

FIG. 2A depicts an embodiment of a portion of a monolithic three-dimensional memory array 210 that includes a first memory level 212, and a second memory level 214 positioned above first memory level 212. Memory array 210 is an example of an implementation of memory array 160 in FIG. 1E. Word lines 216 and 218 are arranged in a first direction and bit lines 220 are arranged in a second direction perpendicular to the first direction. As depicted, the upper conductors of first memory level 212 may be used as the lower conductors of second memory level 214. In a memory array with additional layers of memory cells, there would be corresponding additional layers of bit lines and word lines.

Memory array 210 includes a plurality of memory cells 222, each of which may include re-writeable memory cells. In an embodiment, each of memory cells 222 are vertically-oriented. Memory cells 222 may include non-volatile memory cells or volatile memory cells. With respect to first memory level 212, a first portion of memory cells 222 are between and connect to word lines 216 and bit lines 220. With respect to second memory level 214, a second portion of memory cells 222 are between and connect to word lines 218 and bit lines 220.

In an embodiment, each memory cell 222 includes a selector element coupled in series with a magnetic memory element, where each memory cell 222 represents one bit of data. FIG. 2B is a simplified schematic diagram of a memory cell 222*a*, which is one example implementation of memory cells 222 of FIG. 2A. In an embodiment, memory cell 222*a* includes a magnetic memory element $M_x$ coupled in series with a selector element $S_x$, both coupled between a first terminal T1 and a second terminal T2. In an embodiment, memory cell 222*a* is vertically-oriented. In the embodiment of FIG. 2B, magnetic memory element $M_x$ is disposed above selector element S. In other embodiments, selector element $S_x$ may be disposed above magnetic memory element M.

In an embodiment, magnetic memory element $M_x$ is a magnetic tunnel junction, and selector element $S_x$ is a threshold selector device. In an embodiment, selector element $S_x$ is a conductive bridge threshold selector device. In other embodiments, selector element $S_x$ is an ovonic threshold switch (e.g., binary SiTe, CTe, BTe, AlTe, etc., or the ternary type AsTeSi, AsTeGe or AsTeGeSiN, etc.), a Metal Insulator Transition (MIT) of a Phase Transition Material type (e.g., $VO_2$, $NbO_2$ etc.), or other similar threshold selector device.

In an embodiment, magnetic memory element $M_x$ includes an upper ferromagnetic layer 230, a lower ferromagnetic layer 232, and a tunnel barrier (TB) 234 which is an insulating layer between the two ferromagnetic layers. In this example, lower ferromagnetic layer 232 is a free layer (FL) that has a direction of magnetization that can be switched. Upper ferromagnetic layer 230 is the pinned (or fixed) layer (PL) that has a direction of magnetization that is not easily changed. In other embodiments, magnetic memory element $M_x$ may include fewer, additional, or different layers than those depicted in FIG. 2B. In other embodiments, lower ferromagnetic layer 232 is a pinned layer (PL) and upper ferromagnetic layer 230 is the free layer (FL).

When the direction of magnetization in free layer 232 is parallel to that of pinned layer 230, the resistance RP (referred to herein as "parallel resistance RP") across magnetic memory element $M_x$ is relatively low. When the direction of magnetization in free layer 232 is anti-parallel to that of pinned layer 230, the resistance RAP (referred to herein as "anti-parallel resistance RAP") across magnetic memory element $M_x$ is relatively high. The data state ("0" or "1") of magnetic memory element $M_x$ is read by measuring the resistance of magnetic memory element $M_x$. By design, both the parallel and anti-parallel configurations remain stable in the quiescent state and/or during a read operation (at sufficiently low read current).

In an embodiment, selector element $S_x$ is an ovonic threshold switch that includes a first region 236 and optionally includes a second region 238 disposed above first region 236. In an embodiment, first region 236 is a SiTe alloy, and optional second region 238 is carbon nitride. Other materials may be used for first region 236 and optional second region 238. In other embodiments, selector element $S_x$ is a conductive bridge threshold selector element. In an embodiment, first region 236 is a solid electrolyte region, and second region 238 is an ion source region.

Figure 2C:
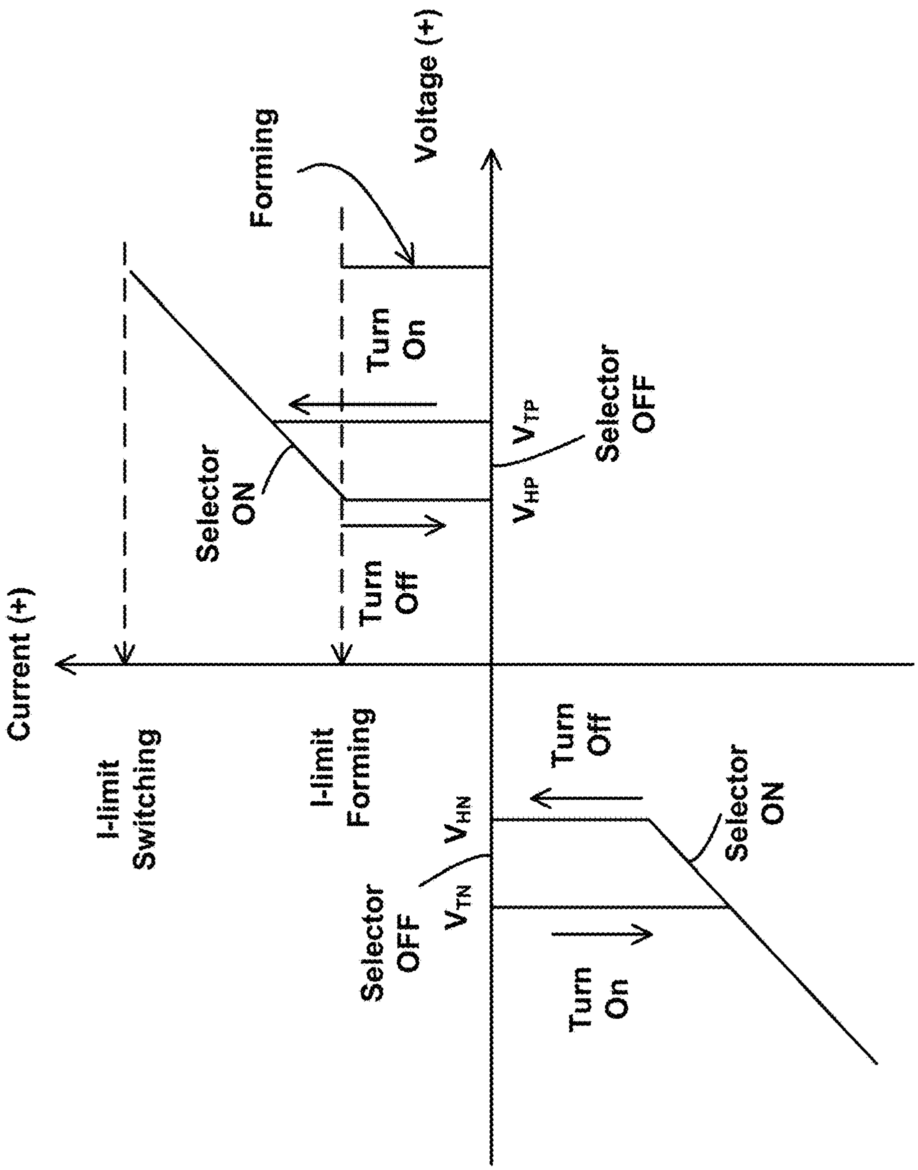
FIG. 2C depicts an example current-voltage characteristic of a threshold selector device of FIG. 2B.
Figure 2B:
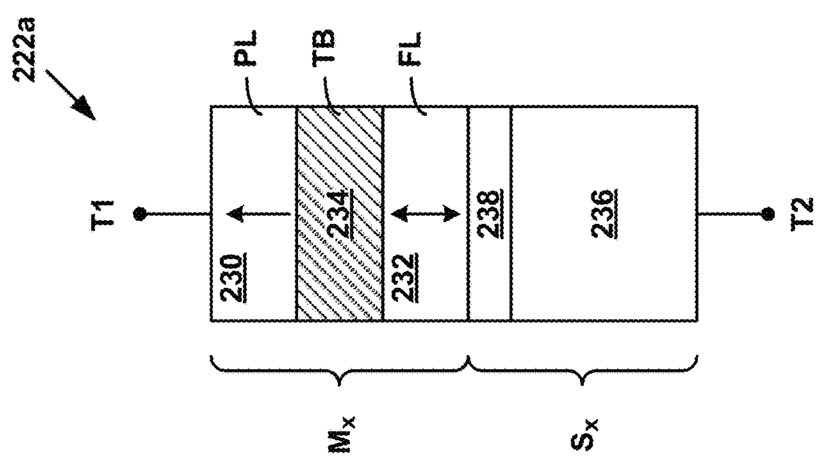
FIG. 2B depicts an embodiment of a memory cell of the three-dimensional memory array of FIG. 2A.

FIG. 2C is a diagram depicting example current-voltage (I-V) characteristics of a threshold selector device $S_x$. Each threshold selector device $S_x$ is initially in a high resistance (OFF) state. To operate threshold selector device $S_x$ as a threshold switch, an initial forming step may be necessary so that threshold selector device $S_x$ operates in a current range in which switching can occur. Following forming, threshold selector device $S_x$ may be switched ON and OFF, and may be used as either a unipolar or a bipolar threshold selector device. Accordingly, threshold selector device $S_x$ may be referred to as a bipolar threshold selector device.

In the example I-V characteristics of FIG. 2C, for positive applied voltages, threshold selector device $S_x$ remains in a high resistance state (HRS) (e.g., OFF) until the voltage across the device meets or exceeds (i.e., is more positive than) a first threshold voltage, $V_{TP}$, at which point threshold selector device $S_x$ switches to a low resistance state (LRS) (e.g., ON). Threshold selector device $S_x$ remains turned ON until the voltage across the device drops to or below a first hold voltage, $V_{HP}$, at which point threshold selector device 224 turns OFF.

For negative applied voltages, threshold selector device $S_x$ remains in a HRS (e.g., OFF) until the voltage across the device meets or exceeds (i.e., is more negative than) a second threshold voltage, $V_{TN}$, at which point threshold selector device 304 switches to a LRS (e.g., ON). Threshold selector device $S_x$ remains turned ON until the voltage across the device increases to or exceeds (i.e., is less negative than) a second hold voltage, $V_{HN}$, at which point threshold selector device $S_x$ turns OFF.

Referring again to FIG. 2B, in an embodiment, magnetic memory element $M_x$ uses spin-transfer-torque (STT) switching. To "set" a bit value of magnetic memory element $M_x$ (i.e., choose the direction of the free layer magnetization), an electrical write current is applied from first terminal T1 to second terminal T2. The electrons in the write current become spin-polarized as they pass through pinned layer 230 because pinned layer 230 is a ferromagnetic metal.

A substantial majority of the conduction electrons in a ferromagnet will have a spin orientation that is parallel to the direction of magnetization, yielding a net spin polarized current. (Electron spin refers to angular momentum, which is directly proportional to but anti-parallel in direction to the magnetic moment of the electron, but this directional distinction will not be used going forward for ease of discussion.)

When the spin-polarized electrons tunnel across TB 234, conservation of angular momentum can result in the imparting of a torque on both free layer 232 and pinned layer 230, but this torque is inadequate (by design) to affect the direction of magnetization of pinned layer 230. Contrastingly, this torque is (by design) sufficient to switch the direction of magnetization of free layer 232 to become parallel to that of pinned layer 230 if the initial direction of magnetization of free layer 232 was anti-parallel to pinned layer 230. The parallel magnetizations will then remain stable before and after such write current is turned OFF.

In contrast, if free layer 232 and pinned layer 230 magnetizations are initially parallel, the direction of magnetization of free layer 232 can be STT-switched to become anti-parallel to that of pinned layer 230 by applying a write current of opposite direction to the aforementioned case. Thus, by way of the same STT physics, the direction of the magnetization of free-layer 232 can be deterministically set into either of two stable orientations by judicious choice of the write current direction (polarity).

In the example described above, spin-transfer-torque (STT) switching is used to "set" a bit value of magnetic memory element M. In other embodiments, field-induced switching, spin orbit torque (SOT) switching, VCMA (magnetoelectric) switching, or other switching techniques may be employed.

Figure 3:
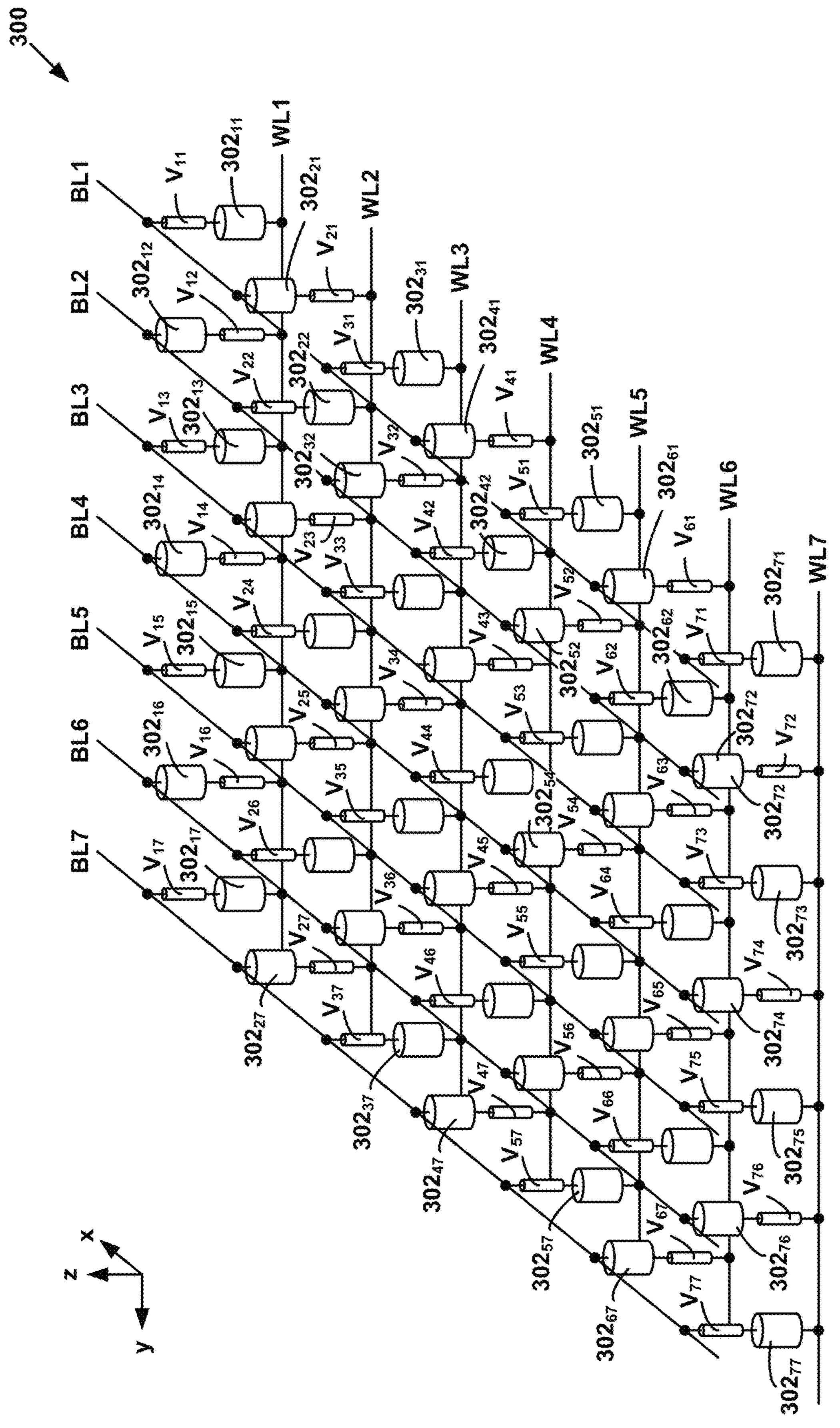
FIG. 3 depicts an embodiment of a cross-point memory array.

FIG. 3 is a simplified schematic diagram of an example cross-point memory array 300. Cross-point memory array 300 is an example of an implementation of memory array 160 in FIG. 1E. In an embodiment, cross-point memory array 300 includes a single memory level. In other embodiments, cross-point memory array 300 may include more than one memory level.

Cross-point memory array 300 includes word lines WL1, WL2, WL3, . . . , WL7, and bit lines BL1, BL2, BL3, . . . , BL7. Cross-point memory array 300 also includes memory cells $\mathbf{302}_{11}$, $\mathbf{302}_{12}$, . . . , $\mathbf{302}_{77}$, and vias $V_{11}$, $V_{12}$, . . . , $V_{77}$. Each of memory cells $\mathbf{302}_{11}$, $\mathbf{302}_{12}$, . . . , $\mathbf{302}_{77}$ is coupled in series with a corresponding one of vias $V_{11}$, $V_{12}$, . . . , $V_{77}$, respectively, and the series-coupled pair are coupled between one of word lines WL1, WL2, WL3, . . . , WL7, and one of bit lines BL1, BL2, BL3, . . . , BL7. In an embodiment, each of memory cells $\mathbf{302}_{11}$, $\mathbf{302}_{12}$, . . . , $\mathbf{302}_{77}$ are vertically-oriented. In an embodiment, each of vias $V_{11}$, $V_{12}$, . . . , $V_{77}$ are vertically-oriented.

For example, memory cell $\mathbf{302}_{11}$ is coupled in series with via $V_{11}$, and the series-coupled pair are coupled between word line WL1 and bit line BL1. Likewise, memory cell $\mathbf{302}_{21}$ is coupled in series with via $V_{21}$, and the series-coupled pair are coupled between word line WL2 and bit line BL1. Similarly, memory cell $\mathbf{302}_{71}$ is coupled in series with via $V_{71}$, and the series-coupled pair are coupled between word line WL7 and bit line BL1. In addition, memory cell $\mathbf{302}_{13}$ is coupled in series with via $V_{13}$, and the series-coupled pair are coupled between word line WL1 and bit line BL3. Likewise, memory cell $\mathbf{302}_{54}$ is coupled in series with via $V_{54}$, and the series-coupled pair are coupled between word line WL5 and bit line BL4, and so on.

Cross-point memory array 300 includes two layers of memory cells disposed between word lines WL1, WL2, WL3, . . . , WL7 and bit lines BL1, BL2, BL3, . . . , BL7. In an embodiment, cross-point memory array 300 includes a first (or lower) layer of memory cells, and a second (or upper) layer of memory cells disposed between word lines WL1, WL2, WL3, . . . , WL7 and bit lines BL1, BL2, BL3, . . . , BL7. In an embodiment, each memory cell in the lower layer of memory cells is coupled in series with and disposed below a corresponding via, and each memory cell in the upper layer of memory cells is coupled in series with and disposed above a corresponding via.

For example, as depicted in FIG. 3, along bit line BL1, memory cells $\mathbf{302}_{11}$, $\mathbf{302}_{31}$, $\mathbf{302}_{51}$ and $\mathbf{302}_{71}$ are disposed below vias $V_{11}$, $V_{31}$, $V_{51}$ and $V_{71}$, respectively, and are part of the lower layer of memory cells, and memory cells $\mathbf{302}_{21}$, $\mathbf{302}_{41}$ and $\mathbf{302}_{61}$ are disposed above vias $V_{21}$, $V_{41}$ and $V_{61}$, respectively, and are part of the upper layer of memory cells.

Along bit line BL2, memory cells $\mathbf{302}_{12}$, $\mathbf{302}_{32}$, $\mathbf{302}_{52}$ and $\mathbf{302}_{72}$ are disposed above vias $V_{12}$, $V_{32}$, $V_{52}$ and $V_{72}$, respectively, and part of the upper layer of memory cells, and memory cells $\mathbf{302}_{22}$, $\mathbf{302}_{42}$ and $\mathbf{302}_{62}$ are disposed blow vias $V_{22}$, $V_{42}$ and $V_{62}$, respectively, and are part of the lower layer of memory cells.

Along bit line BL3, memory cells $\mathbf{302}_{13}$, $\mathbf{302}_{33}$, $\mathbf{302}_{53}$ and $\mathbf{302}_{73}$ are disposed below vias $V_{13}$, $V_{33}$, $V_{53}$ and $V_{73}$, respectively, and are part of the lower layer of memory cells, and memory cells $\mathbf{302}_{23}$, $\mathbf{302}_{43}$ and $\mathbf{302}_{63}$ are disposed above vias $V_{23}$, $V_{43}$ and $V_{63}$, respectively, and are part of the upper layer of memory cells.

Along bit line BL4, memory cells $\mathbf{302}_{14}$, $\mathbf{302}_{34}$, $\mathbf{302}_{54}$ and $\mathbf{302}_{74}$ are disposed above vias $V_{14}$, $V_{34}$, $V_{54}$ and $V_{74}$, respectively, and part of the upper layer of memory cells, and memory cells $\mathbf{302}_{24}$, $\mathbf{302}_{44}$ and $\mathbf{302}_{64}$ are disposed blow vias $V_{24}$, $V_{44}$ and $V_{64}$, respectively, and are part of the lower layer of memory cells.

Along bit line BL5, memory cells $\mathbf{302}_{15}$, $\mathbf{302}_{35}$, $\mathbf{302}_{55}$ and $\mathbf{302}_{75}$ are disposed below vias $V_{15}$, $V_{35}$, $V_{55}$ and $V_{75}$, respectively, and are part of the lower layer of memory cells, and memory cells $\mathbf{302}_{25}$, $\mathbf{302}_{45}$ and $\mathbf{302}_{65}$ are disposed above vias $V_{25}$, $V_{45}$ and $V_{65}$, respectively, and are part of the upper layer of memory cells.

Along bit line BL6, memory cells $\mathbf{302}_{16}$, $\mathbf{302}_{36}$, $\mathbf{302}_{56}$ and $\mathbf{302}_{76}$ are disposed above vias $V_{16}$, $V_{36}$, $V_{56}$ and $V_{76}$, respectively, and part of the upper layer of memory cells, and memory cells $\mathbf{302}_{26}$, $\mathbf{302}_{46}$ and $\mathbf{302}_{66}$ are disposed blow vias $V_{26}$, $V_{46}$ and $V_{66}$, respectively, and are part of the lower layer of memory cells.

Along bit line BL7, memory cells $\mathbf{302}_{17}$, $\mathbf{302}_{37}$, $\mathbf{302}_{57}$ and $\mathbf{302}_{77}$ are disposed below vias $V_{17}$, $V_{37}$, $V_{57}$ and $V_{77}$, respectively, and are part of the lower layer of memory cells, and memory cells $\mathbf{302}_{27}$, $\mathbf{302}_{47}$ and $\mathbf{302}_{67}$ are disposed above vias $V_{27}$, $V_{47}$ and $V_{67}$, respectively, and are part of the upper layer of memory cells.

Cross-point memory array 300 is one example of an implementation for first memory level 212 of monolithic three-dimensional memory array 210 of FIG. 2B, or second memory level 214 of monolithic three-dimensional memory array 210 of FIG. 2B. In an embodiment, each of memory cells $\mathbf{302}_{11}$, $\mathbf{302}_{12}$, . . . , $\mathbf{302}_{77}$, is an implementation of memory cell 222*a* of FIG. 2B. Persons of ordinary skill in the art will understand that cross-point memory array 300 may include more or less than seven word lines, more or less than seven bit lines, and more or less than forty-nine memory cells $\mathbf{302}_{11}$, $\mathbf{302}_{12}$, . . . , $\mathbf{302}_{77}$. In some embodiments, cross-point memory array 300 may include 1000×1000 memory cells, although other array sizes may be used.

Each memory cell $\mathbf{302}_{11}$, $\mathbf{302}_{12}$, . . . , $\mathbf{302}_{77}$ is coupled to one of the word lines and one of the bit lines, and includes a corresponding magnetic memory element $M_{11}$, $M_{12}$, . . . , $M_{77}$, respectively (not shown), coupled in series with a corresponding selector element $S_{11}$, $S_{12}$, . . . , $S_{77}$, respectively (not shown). In an embodiment, each of magnetic memory elements $M_{11}, M_{12}, \ldots, M_{77}$ is an implementation of magnetic memory element $M_x$ of FIG. 2B, and each of selector elements $S_{11}, S_{12}, \ldots, S_{77}$ is an implementation of selector element $S_x$ of FIG. 2B. Magnetic memory elements $M_{11}, M_{12}, \ldots, M_{77}$ may be disposed above or below corresponding selector elements $S_{11}, S_{12}, \ldots, S_{77}$.

Figure 4A:
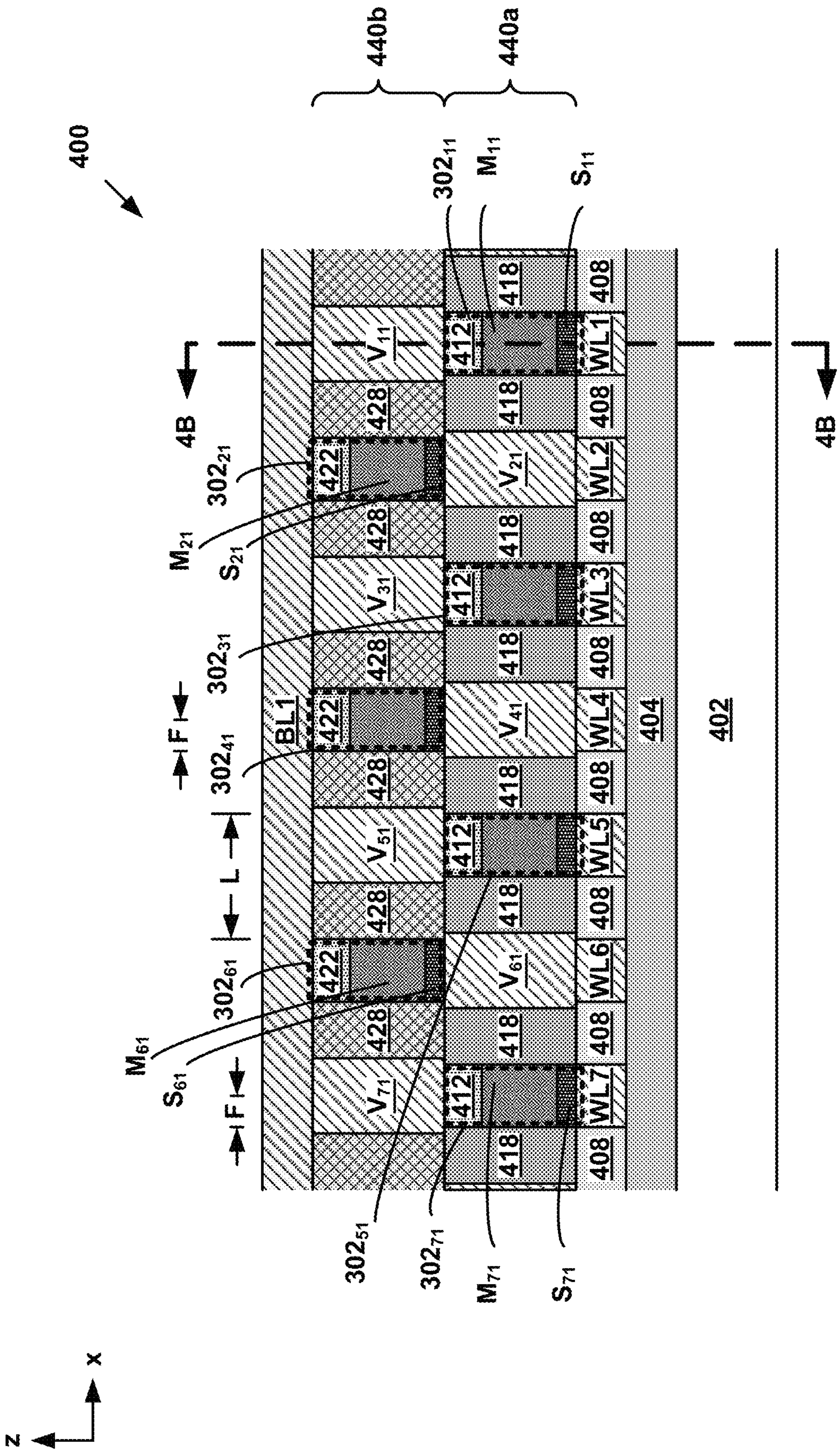
FIGS. 4A-4B depict various views of an embodiment of a cross-point memory array.
Figure 4B:
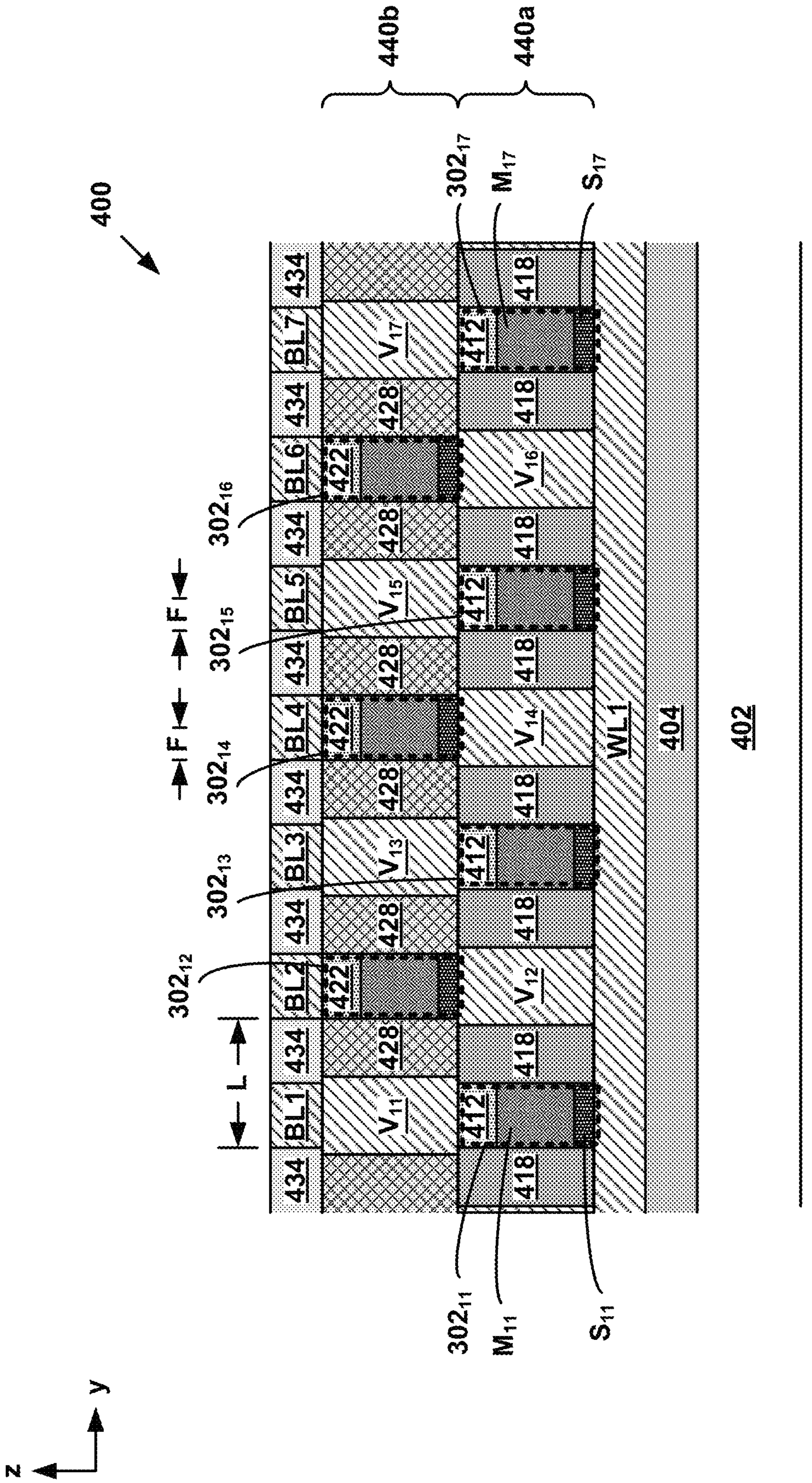

FIGS. 4A-4B depict various views of an embodiment of a cross-point memory array 400 that includes memory cells that each include a magnetic memory element coupled in series with a selector element. The physical structure depicted in FIGS. 4A-4B may include one implementation of cross-point memory array 300 of FIG. 3. Cross-point memory array 400 is an example of an implementation of memory array 160 in FIG. 1E.

Cross-point memory array 400 includes word lines WL1, WL2, WL3 . . . , WL7 arranged in a first direction (e.g., an x-direction), and bit lines BL1, BL2, BL3 . . . , BL7 arranged in a second direction (e.g., a y-direction) perpendicular to the first direction. Persons of ordinary skill in the art will understand that cross-point memory arrays, such as cross-point memory array 400 may include more or fewer than seven word lines, and seven bit lines.

In an embodiment, cross-point memory array 400 includes word lines WL1, WL2, WL3, . . . , WL7 disposed above a substrate 402, such as a silicon, germanium, silicon-germanium, undoped, doped, bulk, SOI or other substrate with or without additional circuitry. In an embodiment, an isolation layer 404, such as a layer of silicon dioxide, silicon nitride, silicon oxynitride or any other suitable insulating layer, is disposed between substrate 402 and word lines WL1, WL2, WL3, . . . , WL7. In an embodiment, word lines WL1, WL2, WL3, . . . , WL7 are formed of a conductive material (e.g., copper or other conductive material), and are separated from one another by a first dielectric material 408 (e.g., silicon dioxide or other similar dielectric material).

In an embodiment, memory cells $\mathbf{302}_{11}, \mathbf{302}_{12}, \ldots, \mathbf{302}_{77}$ are disposed above word lines WL1, WL2, WL3, . . . , WL7. Each of memory cells $\mathbf{302}_{11}, \mathbf{302}_{12}, \ldots, \mathbf{302}_{77}$ includes a corresponding magnetic memory element $M_{11}, M_{12}, \ldots, M_{77}$, respectively, coupled in series with a corresponding selector element $S_{11}, S_{12}, \ldots, S_{77}$, respectively. In an embodiment, memory cells $\mathbf{302}_{11}, \mathbf{302}_{12}, \ldots, \mathbf{302}_{77}$ are separated from one another by a second dielectric material 418 (e.g., silicon dioxide or other similar dielectric material). In an embodiment, each of memory cells $\mathbf{302}_{11}, \mathbf{302}_{12}, \ldots, \mathbf{302}_{77}$ are vertically-oriented.

In an embodiment, bit lines BL1, BL2, BL3 . . . , BL7 are disposed above memory cells $\mathbf{302}_{11}, \mathbf{302}_{12}, \ldots, \mathbf{302}_{77}$. In an embodiment, bit lines BL1, BL2, BL3 . . . , BL7 are formed of a conductive material (e.g., copper or other conductive material), and are separated from one another by a fourth dielectric material 434 (e.g., silicon dioxide or other similar dielectric material). Each of memory cells $\mathbf{302}_{11}, \mathbf{302}_{12}, \ldots, \mathbf{302}_{77}$ is coupled to one of bit lines BL1, BL2, BL3 . . . , BL7, and to one of word lines WL1, WL2, WL3, . . . , WL7.

In an embodiment, each of memory cells $\mathbf{302}_{11}, \mathbf{302}_{12}, \ldots, \mathbf{302}_{77}$ is coupled in series with a corresponding one of vias $V_{11}, V_{12}, \ldots, V_{77}$, respectively, and the series-coupled pair are coupled between one of word lines WL1, WL2, WL3, . . . , WL7, and one of bit lines BL1, BL2, BL3, . . . , BL7. In an embodiment, each of memory cells $\mathbf{302}_{11}, \mathbf{302}_{12}, \ldots, \mathbf{302}_{77}$ are vertically-oriented. In an embodiment, each of vias $V_{11}, V_{12}, \ldots, V_{77}$ are vertically-oriented.

For example, memory cell $\mathbf{302}_{11}$ is coupled in series with via $V_{11}$, and the series-coupled pair are coupled between word line WL1 and bit line BL1. Likewise, memory cell $\mathbf{302}_{21}$ is coupled in series with via $V_{21}$, and the series-coupled pair are coupled between word line WL2 and bit line BL1. Similarly, memory cell $\mathbf{302}_{17}$ is coupled in series with via $V_{17}$, and the series-coupled pair are coupled between word line WL1 and bit line BL7, and so on.

Cross-point memory array 400 includes two layers of memory cells disposed between word lines WL1, WL2, WL3, . . . , WL7 and bit lines BL1, BL2, BL3, . . . , BL7. In an embodiment, cross-point memory array 400 includes a first (or lower) layer 440*a* of memory cells, and a second (or upper) layer 440*b* of memory cells disposed between word lines WL1, WL2, WL3, . . . , WL7 and bit lines BL1, BL2, BL3, . . . , BL7. In an embodiment, each memory cell in lower layer 440*a* is coupled in series with and disposed below a corresponding via, and each memory cell in upper layer 440*a* is coupled in series with and disposed above a corresponding via.

In an embodiment, memory cells $\mathbf{302}_{xx}$ in lower layer 440*a* are isolated from adjacent vias by a second dielectric material 418 (e.g., silicon dioxide or other similar dielectric material), and memory cells $\mathbf{302}_{yy}$ in upper layer 440*b* are isolated from adjacent vias by a third dielectric material 428 (e.g., silicon dioxide or other similar dielectric material).

In the embodiment of cross-point memory array 400 depicted in FIGS. 4A-4B, memory cells $\mathbf{302}_{11}, \mathbf{302}_{12}, \ldots, \mathbf{302}_{77}$ have the same configuration, with selector elements $S_{11}, S_{12}, \ldots, S_{77}$ disposed below corresponding magnetic memory elements $M_{11}, M_{12}, \ldots, M_{77}$, respectively. In other embodiments, selector elements $S_{11}, S_{12}, \ldots, S_{77}$ may be disposed above corresponding magnetic memory elements $M_{11}, M_{12}, \ldots, M_{77}$, respectively.

In an embodiment, cross-point memory array 400 includes a single memory level. In other embodiments, cross-point memory array 400 may include more than one memory level. That is, additional memory levels may be formed above cross-point memory array 400 of FIGS. 4A-4B. Because patterning bit/word lines are much easier than MRAM bit arrays, the MRAM memory cell pitch (in each layer) will be the critical pitch and determines the final areal density of the memory. Therefore if the half pitch of an MRAM bit array is "F," each memory cell in each memory layer has a footprint of $4F^2$. In the case of a two-layer memory array, the memory cell size is therefore $2F^2$.

Referring now to FIGS. 5A1-5N3, an example method of forming a cross-point memory array is described. In particular, FIGS. 5A1-5N3 illustrate an example method of forming a cross-point memory array, such as cross-point memory array 400*a* of FIGS. 4A-4B. With reference to FIGS. 5A1-5A2, substrate 402 is shown as having already undergone several processing steps. Substrate 402 may be any suitable substrate such as a silicon, germanium, silicon-germanium, undoped, doped, bulk, silicon-on-insulator (SOI) or other substrate with or without additional circuitry. For example, substrate 402 may include one or more n-well or p-well regions (not shown). Isolation layer 404 is formed above substrate 402. In some embodiments, isolation layer 404 may be a layer of silicon dioxide, silicon nitride, silicon oxynitride or any other suitable insulating layer.

Following formation of isolation layer 404, a first conductive layer 406 is deposited over isolation layer 404. First conductive layer 406 may include any suitable conductive material such as copper or another appropriate metal, heavily doped semiconductor material, a conductive silicide, a conductive silicide-germanide, a conductive germanide, or the like deposited by any suitable method (e.g., CVD, PVD, etc.). In at least one embodiment, first conductive layer 406 may be copper having a thickness between about 20 nm and about 100 nm. Other conductive layer materials and/or thicknesses may be used. In some embodiments, an adhesion layer (not shown), such as titanium nitride or other similar adhesion layer material, may be disposed between isolation layer 404 and first conductive layer 406.

First conductive layer 406 is then patterned and etched. For example, first conductive layer 406 may be patterned and etched using conventional lithography techniques, with a soft or hard mask, and wet or dry etch processing. In at least one embodiment, first conductive layer 406 is patterned and etched to form substantially parallel, substantially co-planar word lines WL1, WL2, WL3, . . . , WL7. Word lines WL1, WL2, WL3, . . . , WL7 each have a width $W_w$. Example widths $W_w$ for word lines WL1, WL2, WL3, . . . , WL7 and/or spacings between word lines WL1, WL2, WL3, . . . , WL7 range between about 10 nm and about 60 nm, although other conductor widths and/or spacings may be used. Word lines WL1, WL2, WL3, . . . , WL7 also have a pitch L in a first direction (e.g., x-direction). In embodiments, pitch L may be between about 14 nm and about 56 nm, although other values may be used.

After word lines WL1, WL2, WL3, . . . , WL7 have been formed, a first dielectric material layer 408 is formed over substrate 402 to fill the voids between word lines WL1, WL2, WL3, . . . , WL7. For example, approximately 50-300 nm of silicon dioxide may be deposited on substrate 402 and planarized using chemical mechanical polishing or an etch-back process to form a planar surface 500. As depicted in FIGS. 5A1-5A2, first dielectric material layer 408 fills the gaps between word lines WL1, WL2, WL3, . . . , WL7. Other dielectric materials such as silicon oxynitride, low K dielectrics, etc., and/or other dielectric material layer thicknesses may be used. Example low K dielectrics include carbon doped oxides, silicon carbon layers, or the like.

In other embodiments, word lines WL1, WL2, WL3, . . . , WL7 may be formed using a damascene process in which first dielectric material layer 408 is formed, patterned and etched to form etched trenches for word lines WL1, WL2, WL3, . . . , WL7. The openings or voids then may be filled with first conductive layer 406. In such an embodiment, first conductive layer 406 will line the bottom and sidewalls of each trench.

Following planarization, a first selector material layer 502 is deposited over substrate 402. First selector material layer 502 may be one or more chalcogenide materials, such as SiTe, GeAsSe, or similar materials that exhibit threshold switch behavior such as an Ovonic Threshold Switch. In other embodiments, first selector material layer 502 may be a volatile conductive bridge (VCB) type of selector comprised of $HfO_x$ doped with one or more of Ag, Pt, Au, Cu, or other metallic ion. In other embodiments, the selector could be a mixed-ionic electronic conduction (MIEC) or amorphous Indium Gallium Zinc Oxide (IGZO). In another embodiment, the selector is a Metal/amorphous semiconductor/Metal (MSM) type, with the amorphous semiconductor comprised of layers of a-Si and/or a-Ge.

First selector material layer 502 may be deposited by any suitable method (e.g., CVD, PVD, etc.). In an embodiment, first selector material layer 502 may be between about 4 nm and about 30 nm of SiTe. In some embodiments, spacer electrode/buffer layers (e.g., TaN, TiN, W, carbon, carbon nitride) (not shown) may be deposited above and/or below first selector material layer 502. In some embodiments, a capping layer (e.g., TaN) may be deposited on first selector material layer 502, and then removed by chemical mechanical polishing prior to subsequent material deposition steps. Persons of ordinary skill in the art will understand that other selector materials, material thicknesses and/or other deposition techniques may be used.

Next, a first magnetic memory material layer 504 is deposited over first selector material layer 502. First magnetic memory material layer 504 may be deposited by any suitable method (e.g., CVD, PVD, etc.). In an embodiment, first magnetic memory material layer 504 has a total thickness between about 15 nm and about 30 nm.

In an embodiment, first magnetic material layer 504 includes a layer stack of multiple material layers. Table 1, below, provides an example first magnetic material layer 504 layer stack (from bottom to top) having a bottom pinned layer PL:

TABLE 1

| Material | Example Thickness (nm) |
|---|---|
| Ta seed layer | 1 |
| Pt | 1 |
| alternating Co/ Pt multilayer | 4 |
| CoFeB | 1 |
| Ru | 0.4 |
| CoFeB | 1 |
| MgO | 1 |
| CoFeB | 1.1 |
| MgO | 0.8 |
| Ta | 2 |
| Ru | 5 |

In this example, the CoFeB layer adjacent to the Co/Pt multilayer is the bottom pinned layer PL, and the CoFeB layer sandwiched between the MgO layers is the free layer.

Table 2, below, provides an example first magnetic material layer 504 layer stack (from bottom to top) having a top pinned layer (PL):

TABLE 2

| Material | Example Thickness (nm) |
|---|---|
| Ta seed layer | 3 |
| MgO | 0.8 |
| CoFeB | 1.1 |
| MgO | 1 |
| CoFeB | 1 |
| Ru | 0.4 |
| CoFeB | 1 |
| alternating Co/ Pt multilayer | 4 |
| Pt | 1 |
| Ta | 2 |
| Ru | 5 |

In this example, the CoFeB layer adjacent to the Co/Pt multilayer is the top pinned layer PL, and the CoFeB layer sandwiched between the MgO layers is the free layer.

In other embodiments, other materials, thicknesses, and numbers of layers may be used for first magnetic material layer 504. In embodiments, one or more hard mask material layers between about 20 nm and about 80 nm (e.g., TaN or TiN) (not shown) may be deposited above first magnetic material layer 504.

Next, a first hard mask layer 506 is deposited over first magnetic material layer 504, resulting in the structure shown in FIGS. 5B1-5B3. In an embodiment, first hard mask layer 506 is a material that is very resistant to ion milling. In an embodiment, first hard mask layer 506 is between about 20 nm and about 60 nm of diamond-like carbon (DLC). Other hard mask materials and/or thicknesses may be used. In an embodiment, first hard mask layer 506 may be capped by a thin metal (e.g., Cr) or oxide (e.g., alumina) (not shown) to aid in transferring the resist pattern into the DLC and metallic hard mask layers using reactive ion etching (RIE).

First hard mask layer 506 (and any other hard mask material layers that were deposited above first magnetic material layer 504) is patterned and etched (e.g., by ME) to from first hard mask features 412 resulting in the structure shown in FIGS. 5C1-5C3. In an embodiment, first hard mask features 412 have a pitch in the first direction (e.g., x-direction) and a second direction (e.g., y-direction) of 2L, where L is the x-direction pitch of word lines WL1, WL2, WL3, . . . , WL7. In an embodiment, first hard mask features 412 have a circular cross-sectional shape, although other shapes may be used. As depicted in FIG. 5C3, in an embodiment, first hard mask features 412 have a diagonal center-to-center spacing of $\sqrt{2}\times L$.

First hard mask features 412 are used to pattern and etch first magnetic material layer 504 and first selector material layer 502, to form first memory cell pillars 508, resulting in the structure shown in FIGS. 5D1-5D3. In an embodiment, first magnetic material layer 504 is etched (e.g., by ion milling) to form pillar-shaped first magnetic material layer structures 414. An ion mill, a ME, or other suitable process may be used to etch first selector material layer 502, to form pillar-shaped first selector elements 416.

In an embodiment, a sidewall liner (not shown) may be formed on first magnetic material layer structures 414 with a dielectric material that may be etched by RIE (e.g., $SiN_x$, $SiO_2$, $Al_2O_3$, $Ta_2O_5$). For example, the milling may stop after etching to the top of first selector material layer 502, and then a sidewall liner of between about 3 nm and about 15 nm of silicon nitride ($SiN_x$) may be formed on first magnetic material layer structures 414. Without wanting to be bound by any particular theory, it is believed that the sidewall liner may protect first magnetic material layer structures 414 from steps used to etch first selector material layer 502.

Each first memory cell pillar 508 includes a vertical stack of a first hard mask feature 412, a first magnetic material layer structure 414 and a first selector element 416. Each first memory cell pillar 508 has a radius $r_p$. As illustrated in FIG. 5D3, in an embodiment each first memory cell pillar 508 is disposed on one of word lines WL1, WL2, WL3, . . . , WL7. In an embodiment, first memory cell pillars 508 on adjacent word lines WL1, WL2, WL3, . . . , WL7 are offset from one another in the second direction (e.g., y-direction). In an embodiment, first memory cell pillars 508 have a pitch in the first direction (e.g., x-direction) and the second direction (e.g., y-direction) of 2L, where L is the x-direction pitch of word lines WL1, WL2, WL3, . . . , WL7.

First selector elements 416 constitute selector elements $S_{11}$, $S_{13}$, $S_{15}$, $S_{17}$, $S_{22}$, $S_{24}$, $S_{26}$, $S_{31}$, $S_{33}$, $S_{35}$, $S_{37}$, $S_{42}$, $S_{44}$, $S_{46}$, $S_{51}$, $S_{53}$, $S_{55}$, $S_{57}$, $S_{62}$, $S_{64}$, $S_{66}$, $S_{71}$, $S_{73}$, $S_{75}$ and $S_{77}$, and first magnetic material layer structures 414 constitute magnetic memory element $M_{11}$, $M_{13}$, $M_{15}$, $M_{17}$, $M_{22}$, $M_{24}$, $M_{26}$, $M_{31}$, $M_{33}$, $M_{35}$, $M_{37}$, $M_{42}$, $M_{44}$, $M_{46}$, $M_{51}$, $M_{53}$, $M_{55}$, $M_{57}$, $M_{62}$, $M_{64}$, $M_{66}$, $M_{71}$, $M_{73}$, $M_{75}$ and $M_{77}$. (See FIGS. 3 and 4A-4B).

A second dielectric material layer 418 is deposited conformally over substrate 402, forming a layer or film of dielectric material over and between first memory cell pillars 508. For example, about 10 nm to about 80 nm of silicon dioxide may be deposited over substrate 402, resulting in the structure illustrated in FIGS. 5E1-5E3. In an embodiment, second dielectric material layer 418 has a thickness $r_d$, and sum $(r_d+r_p)$> of $0.5\times\sqrt{2}\times L$, where $r_p$ is the radius of each first memory cell pillar 508. Second dielectric material layer 418 fills spaces around first memory cell pillars 508, leaving discrete spaces or first interstices 510 between adjacent first memory cell pillars 508. In an embodiment, first interstices 510 have a rectangular cross-sectional shape with concave sidewalls. Other dielectric materials such as silicon nitride, silicon oxynitride, high K dielectrics, etc., and/or other dielectric material layer thicknesses may be used.

Second dielectric material 418 is anisotropically etched, removing portions of second dielectric material 418 from top surfaces of first memory cell pillars 508, and in first interstices 510 between adjacent first memory cell pillars 508, resulting in the structure illustrated in FIGS. 5F1-5F3. As a result of the etch, first interstices 510 extend down to word lines WL1, WL2, WL3, . . . , WL7.

A second conductive layer 420 is deposited over substrate 402, filling first interstices 510 and forming vias $V_{12}$, $V_{14}$, $V_{16}$, $V_{21}$, $V_{23}$, $V_{25}$, $V_{27}$, $V_{32}$, $V_{34}$, $V_{36}$, $V_{41}$, $V_{43}$, $V_{45}$, $V_{47}$, $V_{52}$, $V_{54}$, $V_{56}$, $V_{61}$, $V_{63}$, $V_{65}$, $V_{67}$, $V_{72}$, $V_{74}$ and $V_{76}$ in first interstices 510. Second conductive layer 420 may include any suitable conductive material such as copper or another appropriate metal, heavily doped semiconductor material, a conductive silicide, a conductive silicide-germanide, a conductive germanide, or the like deposited by any suitable method (e.g., CVD, PVD, etc.). In an embodiment, between about 20 nm and about 100 nm of copper may be deposited on the substrate 402 and planarized using chemical mechanical polishing or an etchback process to form a planar surface 512 and reveal tops of first memory cell pillars 508, resulting in the structure shown in FIGS. 5G1-5G3. Other conductive layer materials and/or thicknesses may be used.

Following planarization, a second selector material layer 514 is deposited over substrate 402. Second selector material layer 514 may be one or more chalcogenide materials, such as SiTe, GeAsSe, or similar materials that exhibit threshold switch behavior such as an Ovonic Threshold Switch. In other embodiments, second selector material layer 514 may be a VCB type of selector comprised of $HfO_x$ doped with one or more of Ag, Pt, Au, Cu, or other metallic ion. In other embodiments, the selector could be an MIEC or amorphous IGZO. In another embodiment, the selector is an MSM type, with the amorphous semiconductor comprised of layers of a-Si and/or a-Ge.

Second selector material layer 514 may be deposited by any suitable method (e.g., CVD, PVD, etc.). In an embodiment, second selector material layer 514 may be between about 4 nm and about 30 nm of SiTe. In some embodiments, spacer electrode/buffer layers (e.g., TaN, TiN, W, carbon, carbon nitride) (not shown) may be deposited above and/or below second selector material layer 514. In some embodiments, a capping layer (e.g., TaN) may be deposited on second selector material layer 514, and then removed by chemical mechanical polishing prior to subsequent material deposition steps. Persons of ordinary skill in the art will understand that other selector materials, material thicknesses and/or other deposition techniques may be used.

Next, a second magnetic memory material layer 516 is deposited over second selector material layer 514. Second magnetic memory material layer 516 may be deposited by any suitable method (e.g., CVD, PVD, etc.). In an embodiment, second magnetic memory material layer 516 has a total thickness between about 15 nm and about 30 nm.

In an embodiment, second magnetic material layer 516 includes a layer stack of multiple material layers, such as the example material layer stacks of Tables 1 and 2, above. In other embodiments, other materials, thicknesses, and numbers of layers may be used for second magnetic material layer 516. In embodiments, one or more hard mask material layers between about 20 nm and about 80 nm (e.g., TaN or TiN) (not shown) may be deposited above second magnetic material layer 516.

Next, a second hard mask layer 518 is deposited over second magnetic material layer 516, resulting in the structure shown in FIGS. 5H1-5H3. In an embodiment, second hard mask layer 518 is a material that is very resistant to ion milling. In an embodiment, second hard mask layer 518 is between about 20 nm and about 60 nm of DLC. Other hard mask materials and/or thicknesses may be used. In an embodiment, second hard mask layer 518 may be capped by a thin metal (e.g., Cr) or oxide (e.g., alumina) (not shown) to aid in transferring the resist pattern into the DLC and metallic hard mask layers using ME.

Second hard mask layer 518 (and any other hard mask material layers that were deposited above second magnetic material layer 516) is patterned and etched (e.g., by ME) to from second hard mask features 422 resulting in the structure shown in FIGS. 5I1-5I3. In an embodiment, second hard mask features 422 have a pitch in the first direction (e.g., x-direction) and the second direction (e.g., y-direction) of 2L, where L is the x-direction pitch of word lines WL1, WL2, WL3, . . . , WL7. In an embodiment, second hard mask features 422 have a circular cross-sectional shape, although other shapes may be used. As depicted in FIG. 5I3, in an embodiment, second hard mask features 422 have a diagonal center-to-center spacing of $\sqrt{2}\times L$.

Second hard mask features 422 are used to pattern and etch second magnetic material layer 516 and second selector material layer 514, to form second memory cell pillars 520, resulting in the structure shown in FIGS. 5J1-5J3. In an embodiment, second magnetic material layer 516 is etched (e.g., by ion milling) to form pillar-shaped second magnetic material layer structures 424. An ion mill, a ME, or other suitable process may be used to etch second selector material layer 514, to form pillar-shaped second selector elements 426.

In an embodiment, a sidewall liner (not shown) may be formed on second magnetic material layer structures 424 with a dielectric material that may be etched by RIE (e.g., $SiN_x$, $SiO_2$, $Al_2O_3$, $Ta_2O_5$). For example, the milling may stop after etching to the top of second selector material layer 514, and then a sidewall liner of between about 3 nm and about 15 nm of silicon nitride ($SiN_x$) may be formed on second magnetic material layer structures 424. Without wanting to be bound by any particular theory, it is believed that the sidewall liner may protect second magnetic material layer structures 424 from steps used to etch second selector material layer 514.

Each second memory cell pillar 520 includes a vertical stack of a second hard mask feature 422, a second magnetic material layer structure 424 and a second selector element 426. Each second memory cell pillar 520 has a radius $r_p$. As depicted in FIG. 5J3, in an embodiment each second memory cell pillar 520 is disposed above one of word lines WL1, WL2, WL3, . . . , WL7. In an embodiment, second memory cell pillars 520 on adjacent word lines WL1, WL2, WL3, . . . , WL7 are offset from one another in the second direction (e.g., y-direction). In an embodiment, second memory cell pillars 520 have a pitch in the first direction (e.g., x-direction) and the second direction (e.g., y-direction) of 2L, where L is the x-direction pitch of word lines WL1, WL2, WL3, . . . , WL7.

Second selector elements 426 constitute selector elements $S_{12}$, $S_{14}$, $S_{16}$, $S_{21}$, $S_{23}$, $S_{25}$, $S_{27}$, $S_{32}$, $S_{34}$, $S_{36}$, $S_{41}$, $S_{43}$, $S_{45}$, $S_{47}$, $S_{52}$, $S_{54}$, $S_{56}$, $S_{61}$, $S_{63}$, $S_{65}$, $S_{67}$, $S_{72}$, $S_{74}$ and $S_{76}$, and first magnetic material layer structures 414 constitute magnetic memory element $M_{12}$, $M_{14}$, $M_{16}$, $M_{21}$, $M_{23}$, $M_{25}$, $M_{27}$, $M_{32}$, $M_{34}$, $M_{36}$, $M_{41}$, $M_{43}$, $M_{45}$, $M_{47}$, $M_{52}$, $M_{54}$, $M_{56}$, $M_{61}$, $M_{63}$, $M_{65}$, $M_{67}$, $M_{72}$, $M_{74}$ and $M_{76}$. (See FIGS. 3 and 4A-4B).

A third dielectric material layer 428 is deposited conformally over substrate 402, forming a layer or film of dielectric material over and between second memory cell pillars 520. For example, about 10 nm to about 80 nm of silicon dioxide may be deposited over substrate 402, resulting in the structure illustrated in FIGS. 5K1-5K3. In an embodiment, third dielectric material layer 428 has a thickness $r_d$, and sum $(r_d+r_p)$> of $0.5\times\sqrt{2}\times L$, where $r_p$ is the radius of each second memory cell pillar 520. Third dielectric material layer 428 fills spaces around second memory cell pillars 520, leaving discrete spaces or second interstices 522 between adjacent second memory cell pillars 520. In an embodiment, second interstices 522 have a rectangular cross-sectional shape with concave sidewalls. Other dielectric materials such as silicon nitride, silicon oxynitride, high K dielectrics, etc., and/or other dielectric material layer thicknesses may be used.

Third dielectric material 428 is anisotropically etched, removing portions of third dielectric material 428 from top surfaces of second memory cell pillars 520, and in second interstices 522 between adjacent second memory cell pillars 520, resulting in the structure illustrated in FIGS. 5L1-5L3. As a result of the etch, second interstices 522 extend down to top surfaces first hard mask features 412 of first memory cell pillars 508.

A third conductive layer 430 is deposited over substrate 402, filling second interstices 522 and forming vias $V_{11}$, $V_{13}$, $V_{15}$, $V_{17}$, $V_{22}$, $V_{24}$, $V_{26}$, $V_{31}$, $V_{33}$, $V_{35}$, $V_{37}$, $V_{42}$, $V_{44}$, $V_{46}$, $V_{51}$, $V_{53}$, $V_{55}$, $V_{57}$, $V_{62}$, $V_{64}$, $V_{66}$, $V_{71}$, $V_{73}$, $V_{75}$ and $V_{77}$ in second interstices 522. Third conductive layer 430 may include any suitable conductive material such as copper or another appropriate metal, heavily doped semiconductor material, a conductive silicide, a conductive silicide-germanide, a conductive germanide, or the like deposited by any suitable method (e.g., CVD, PVD, etc.). In an embodiment, between about 20 nm and about 100 nm of copper may be deposited on the substrate 402 and planarized using chemical mechanical polishing or an etchback process to form a planar surface 524 and reveal tops of second memory cell pillars 520, resulting in the structure shown in FIGS. 5M1-5M3. Other conductive layer materials and/or thicknesses may be used.

A fourth conductive layer 432 is deposited over planar surface 524. Fourth conductive layer 432 may include any suitable conductive material such as copper or another appropriate metal, heavily doped semiconductor material, a conductive silicide, a conductive silicide-germanide, a conductive germanide, or the like deposited by any suitable method (e.g., CVD, PVD, etc.). In at least one embodiment, fourth conductive layer 432 may be copper having a thickness between about 20 nm and about 100 nm. Other conductive layer materials and/or thicknesses may be used. In some embodiments, an adhesion layer (not shown), such as titanium nitride or other similar adhesion layer material, may be disposed between planar surface 524 and fourth conductive layer 432.

Fourth conductive layer 432 is then patterned and etched. For example, fourth conductive layer 432 may be patterned and etched using conventional lithography techniques, with a soft or hard mask, and wet or dry etch processing. In at least one embodiment, fourth conductive layer 432 is patterned and etched to form substantially parallel, substantially co-planar bit lines BL1, BL2, BL3, . . . , BL7, each having a width WB. Example widths WB for bit lines BL1, BL2, . . . , BL7 and/or spacings between bit lines BL1, BL2, BL3, . . . , BL7 range between about 10 nm and about 60 nm, although other conductor widths and/or spacings may be used. In an embodiment, bit lines BL1, BL2, BL3, . . . , BL7 have a pitch L in the second direction (e.g., y-direction).

After bit lines BL1, BL2, BL3, . . . , BL7 have been formed, a fourth dielectric material layer 434 is formed over substrate 402 to fill the voids between bit lines BL1, BL2, BL3, . . . , BL7. For example, approximately 50-300 nm of silicon dioxide may be deposited on the substrate 402 and planarized using chemical mechanical polishing or an etch-back process to form a planar surface 526, resulting in the structure shown in FIGS. 5N1-5N3. Other dielectric materials such as silicon oxynitride, low K dielectrics, etc., and/or other dielectric material layer thicknesses may be used.

In other embodiments, bit lines BL1, BL2, BL3, . . . , BL7 may be formed using a damascene process in which fourth dielectric material layer 434 is formed, patterned and etched to form etched trenches for bit lines BL1, BL2, BL3, . . . , BL7. The openings or voids then may be filled with fourth conductive layer 432. In such an embodiment, fourth conductive layer 432 will line the bottom and sidewalls of each trench.

One embodiment of the disclosed technology includes a memory array that includes a first memory level having a plurality of memory cells each including a corresponding magnetic memory element coupled in series with a corresponding selector element, and a plurality of vias, each of the vias coupled in series with a corresponding one of the memory cells.

One embodiment of the disclosed technology includes a method of forming a memory array. The method includes forming a plurality of first memory cell pillars, each first memory cell pillar including a corresponding first magnetic material layer structure and a corresponding first selector element, forming a dielectric material layer around each first memory cell pillar, forming first interstices between adjacent first memory cell pillars, and forming vias in the first interstices.

One embodiment of the disclosed technology includes a memory array having a plurality of word lines and a plurality of bit lines, and a plurality of memory cells each including a corresponding magnetic memory element coupled in series with a corresponding selector element, each memory cell coupled between one of the word lines and one of the bit lines, each memory cell comprising a half-pitch F. Each memory cell includes an area between $2F^2$ and $4F^2$.

For purposes of this document, a first layer may be over or above a second layer if zero, one, or more intervening layers are between the first layer and the second layer.

For purposes of this document, it should be noted that the dimensions of the various features depicted in the figures may not necessarily be drawn to scale.

For purposes of this document, reference in the specification to "an embodiment," "one embodiment," "some embodiments," or "another embodiment" may be used to describe different embodiments and do not necessarily refer to the same embodiment.

For purposes of this document, a connection may be a direct connection or an indirect connection (e.g., via another part). In some cases, when an element is referred to as being connected or coupled to another element, the element may be directly connected to the other element or indirectly connected to the other element via intervening elements. When an element is referred to as being directly connected to another element, then there are no intervening elements between the element and the other element.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

The invention claimed is:

1. A memory array comprising:

a plurality of word lines and a plurality of bit lines; and a plurality of memory cells each comprising a corresponding magnetic memory element coupled in series with a corresponding selector element, and each of the plurality of memory cells is coupled in series with a corresponding via having four concave vertical sidewalls, each memory cell coupled between one of the word lines and one of the bit lines, each memory cell comprising a half-pitch F, wherein each memory cell comprises an area between $2F^2$ and $4F^2$.

2. The memory array of claim 1, wherein each memory cell is vertically-oriented.

3. The memory array of claim 1, comprising a cross-point memory array.

4. The memory array of claim 1, comprising a first layer of memory cells, and a second layer of memory cells disposed above the first layer of memory cells.

5. The memory array of claim 1, wherein the word lines are arranged in a first direction, and the bit lines are arranged in a second direction perpendicular to the first direction.

6. The memory array of claim 1, wherein the memory cells are disposed above the word lines, and the bit lines are disposed above the memory cells.

7. The memory array of claim 1, wherein the memory cells are disposed above the bit lines, and the word lines are disposed above the memory cells.

8. The memory array of claim 1, wherein each of the vias coupled between one of the word lines and one of the bit lines.

9. The memory array of claim 8, wherein each of a first plurality of the vias is disposed above a corresponding one of a first plurality of the memory cells, and each of a second plurality of the vias is disposed below a corresponding one of a second plurality of the memory cells.

10. The memory array of claim 1, comprising a first memory level, and a second memory level disposed above the first memory level.

11. The memory array of claim 10, wherein the first memory level and the second memory level share one of the plurality of word lines and the plurality of bit lines.

12. The memory array of claim 1, wherein each selector element comprises one or more of a threshold selector device, a conductive bridge threshold selector device, an ovonic threshold switch, and a Metal Insulator Transition of a Phase Transition Material type threshold selector device.

13. The memory array of claim 1, wherein each selector element comprises one or more of SiTe, CTe, BTe, AlTe, SiAsTe, GeAsSe, GeAsSeSi, $VO_2$, and $NbO_2$.

14. The memory array of claim 1, wherein each selector element comprises HfOx doped with one or more of Cu, Ag, or similar metallic ion.

15. A method of forming a memory array, the method comprising: forming a plurality of first memory cells each comprising a corresponding first magnetic memory element coupled in series with a corresponding first selector element; and forming a plurality of first vias between adjacent first memory cells, wherein each memory cell comprises a half-pitch F, and comprises an area between $2F^2$ and $4F^2$, wherein each of the plurality of first vias comprises four concave vertical sidewalls.

16. The method of claim 15, further comprising: forming a plurality of second memory cells each comprising a corresponding second magnetic memory element coupled in series with a corresponding second selector element; and forming a plurality of second vias between adjacent second memory cells.

17. The method of claim 16, wherein each second memory cell is disposed over a corresponding one of the first vias, and each first memory cell is disposed under a corresponding one of the second vias.

18. The method of claim 15, wherein each first selector element comprises one or more of a threshold selector device, a conductive bridge threshold selector device, an ovonic threshold switch, and a Metal Insulator Transition of a Phase Transition Material type threshold selector device.

19. A memory array comprising: a first memory level comprising a plurality of first memory cells each comprising a corresponding magnetic memory element coupled in series with a corresponding selector element, each first memory cell coupled to and disposed above or below a corresponding one of a plurality of first vias each having four concave vertical sidewalls; and a second memory level disposed above the first memory level, the second memory level comprising a plurality of second memory cells each comprising a corresponding magnetic memory element coupled in series with a corresponding selector element, each second memory cell coupled to and disposed above or below a corresponding one of a plurality of second vias each having four concave vertical sidewalls, wherein each memory cell comprises a half-pitch F, and comprises an area between $2F^2$ and $4F^2$.

20. The memory array of claim 19, wherein each selector element comprises one or more of a threshold selector device, a conductive bridge threshold selector device, an ovonic threshold switch, and a Metal Insulator Transition of a Phase Transition Material type threshold selector device.

* * * * *